United States Patent
Pagnanelli

(10) Patent No.: US 9,509,331 B1
(45) Date of Patent: *Nov. 29, 2016

(54) CONVERSION OF A DISCRETE-TIME QUANTIZED SIGNAL INTO A CONTINUOUS-TIME, CONTINUOUSLY VARIABLE SIGNAL

(71) Applicant: Syntropy Systems, LLC, Huntington Beach, CA (US)

(72) Inventor: Christopher Pagnanelli, Huntington Beach, CA (US)

(73) Assignee: Syntropy Systems, LLC, Huntington Beach, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/997,504

(22) Filed: Jan. 16, 2016

Related U.S. Application Data

(63) Continuation of application No. 14/697,574, filed on Apr. 27, 2015, now Pat. No. 9,276,602, which is a continuation-in-part of application No. 14/537,122, filed on Nov. 10, 2014, now Pat. No. 9,048,865, which (Continued)

(51) Int. Cl.
*H03M 3/00* (2006.01)
*H03M 9/00* (2006.01)

(52) U.S. Cl.
CPC ............. *H03M 3/358* (2013.01); *H03M 3/51* (2013.01); *H03M 9/00* (2013.01)

(58) Field of Classification Search
CPC ...... H03M 3/50; H03M 3/502; H03M 3/358; H03M 7/3026; H03M 7/3033; H03M 3/51
USPC ................................................ 341/140–145
See application file for complete search history.

(56) References Cited

U.S. PATENT DOCUMENTS 5,341,135 A   8/1994  Pearce
5,907,242 A   5/1999  Gard
(Continued)

FOREIGN PATENT DOCUMENTS

WO   WO9215153 A2   9/1992

OTHER PUBLICATIONS

International search report and written opinion from corresponding PCT application Serial No. PCT/US2010/060789.
(Continued)

*Primary Examiner* — Lam T Mai
(74) *Attorney, Agent, or Firm* — Joseph G. Swan, P.C.

(57) ABSTRACT

Provided are, among other things, systems, apparatuses, methods and techniques for converting a discrete-time quantized signal into a continuous-time, continuously variable signal. An exemplary converter preferably includes: (1) multiple oversampling converters, each processing a different frequency band, operated in parallel; (2) multirate (i.e., polyphase) delta-sigma modulators (preferably second-order or higher); (3) multi-bit quantizers; (4) multi-bit-to-variable-level signal converters, such as resistor ladder networks or current source networks; (5) adaptive nonlinear, bit-mapping to compensate for mismatches in the multi-bit-to-variable-level signal converters (e.g., by mimicking such mismatches and then shifting the resulting noise to a frequently range where it will be filtered out by a corresponding bandpass (reconstruction) filter); (6) multi-band (e.g., programmable noise-transfer-function response) bandpass delta-sigma modulators; and/or (7) a digital pre-distortion linearizer (DPL) for canceling noise and distortion introduced by an analog signal bandpass (reconstruction) filter bank.

20 Claims, 40 Drawing Sheets

Related U.S. Application Data is a continuation-in-part of application No. 13/647,301, filed on Oct. 8, 2012, now Pat. No. 8,896,471, which is a continuation of application No. 13/400,019, filed on Feb. 17, 2012, now Pat. No. 8,294,605, which is a continuation-in-part of application No. 12/970,379, filed on Dec. 16, 2010, now Pat. No. 8,264,390, said application No. 14/697,574 is a continuation-in-part of application No. 14/629,442, filed on Feb. 23, 2015, now Pat. No. 9,225,353, which is a continuation-in-part of application No. 14/056,917, filed on Oct. 17, 2013, now Pat. No. 9,000,967, which is a continuation-in-part of application No. 13/535,037, filed on Jun. 27, 2012, now Pat. No. 8,581,768.

(60) Provisional application No. 61/970,846, filed on Mar. 26, 2014, provisional application No. 61/444,643, filed on Feb. 18, 2011, provisional application No. 61/450,617, filed on Mar. 8, 2011, provisional application No. 61/507,568, filed on Jul. 13, 2011, provisional application No. 61/287,079, filed on Dec. 16, 2009, provisional application No. 61/554,918, filed on Nov. 2, 2011, provisional application No. 61/501,284, filed on Jun. 27, 2011, provisional application No. 61/549,739, filed on Oct. 20, 2011, provisional application No. 61/536,003, filed on Sep. 18, 2011, provisional application No. 62/103,160, filed on Jan. 14, 2015, provisional application No. 62/266,479, filed on Dec. 11, 2015.

(56) References Cited

U.S. PATENT DOCUMENTS

| | | | |
|---|---|---|---|
| 6,888,484 B2 | 5/2005 | Kiss et al. | |
| 7,633,417 B1 | 12/2009 | Yeh | |
| 8,155,238 B2 | 4/2012 | Muller et al. | |
| 8,264,390 B2* | 9/2012 | Pagnanelli | H03M 3/50 341/144 |
| 8,294,605 B1* | 10/2012 | Pagnanelli | H03M 3/358 341/144 |
| 8,581,768 B1* | 11/2013 | Pagnanelli | H03M 3/30 341/143 |
| 8,896,471 B1* | 11/2014 | Pagnanelli | 341/143 |
| 9,000,967 B2* | 4/2015 | Pagnanelli | H03M 3/30 341/143 |
| 9,048,865 B2* | 6/2015 | Pagnanelli | H03M 3/358 |
| 9,225,353 B2* | 12/2015 | Pagnanelli | H03M 3/468 |
| 9,276,602 B1* | 3/2016 | Pagnanelli | H03M 1/661 |
| 2004/0208249 A1 | 10/2004 | Risbo et al. | |
| 2004/0213356 A1 | 10/2004 | Burke | |
| 2005/0099327 A1 | 5/2005 | Robinson et al. | |

OTHER PUBLICATIONS

Eshraghi A et al: "A Comparative Analysis of Parallel Delta—Sigma ADC Architectures", IEEE Transactions on Circuits and Systems Part I: Regular Papers, IEEE Service Center, New York, NY, US, vol. 51, No. 3, Mar. 1, 2004, pp. 450-458, XP011109280, ISSN: 1057-7122, DOI: D01:10.1109/TCSI.2004.823663.
Harris F J et al: "Implementation considerations and limitations for dynamic range enhanced analog to digital converters", IEEE International Conference on Acoustics, Speech, and Signal Processing, 1989. ICASSP-89., May 3, 1989, May 23, 1989, pp. 1286-1289, XP010083173.
D. Anastassiou "Error Diffusion Coding for A/D Conversion," IEEE Transactions on Circuits and Systems, vol. 36, 1989.
A. Petraglia and S. K. Mitra, "High Speed A/D Conversion Using QMF Banks," Proceedings: IEEE Symposium on circuits and Systems, 1990.
Aziz, P., "Multi Band Sigma Delta Analog to Digital Conversion", IEEE International Conference on Acoustics, Speech, and Signal Processing, 1994.
S. R. Velazquez, T. Q. Nguyen, and S. R. Broadstone, "Design of Hybrid Filter Banks for Analog/Digital Conversion," IEEE Transactions on Signal Processing, 1998.
A. Fernandez-Vazquez and G. Jovanovic-Dolecek, "Design of Real and Complex Linear-Phase IIR Modified QMF Banks," IEEE Asia Pacific Conference on Circuits and Systems, 2006.
P. C. R. Brandao and A. Petraglia, "A Switched-Capacitor Hadamard Filter Bank in 0.35 m CMOS," Proceedings: 48th Midwest Symposium on Circuits and Systems, 2005.
P: M. M Furth and A. G. Andreou, "A Design Framework for Low Power Analog Filter Banks", IEEE Transactions on Circuits and Systems I: Fundamental Theory and Applications, 1995.
R. Khoini-Poorfard, L. B. Lim, and D. A. Johns, "Time-Interleaved Oversampling A/D Converters: Theory and Practice," IEEE Transactions on Circuits and Systems II: Analog and Digital Signal Processing, 1997.
K. Chao, S. S. Nadeem, W. Lee, and C. Sodini, "A Higher Order Topology for Interpolative Modulators for Oversampling A/D Converters," IEEE Transactions on Circuits and Systems, 1990.
Prosecution history of parent U.S. Appl. No. 13/400,019 (now U.S. Pat. No. 8,294,605).
J. Pham and A.C. Carusone, "A Time-Interleaved [Delta-Sigma]-DAC Architecture Clocked at the Nyquist Rate," IEEE Transactions on Circuits and Systems II: Express Briefs, 2008.
Prosecution history of parent U.S. Appl. No. 13/647,301 (now U.S. Pat. No. 8,896,471).
Report/Translation of Office Action in corresponding Japanese Patent Application No. 2012-544832.
Krall, C. , et al., "Time-Interleaved Digital-to-Analog Converters for UWB Signal Generation", IEEE International Conference on Ultra-Wideband, 2007. ICUWB 2007, pp. 366-371, ISBN: 978-1-4244-0521-3.
Prosecution history of parent U.S. Appl. No. 14/537,122 (now U.S. Pat. No. 9,048,865).
Prosecution history of parent U.S. Appl. No. 14/056,917 (now U.S. Pat. No. 9,000,967).
Prosecution history of parent U.S. Appl. No. 12/970,379 (now U.S. Pat. No. 8,264,390).
Prosecution history of parent U.S. Appl. No. 13/535,037 (now U.S. Pat. No. 8,581,768).
Prosecution history of parent U.S. Appl. No. 114/629,442 (now U.S. Pat. No. 9,225,353).
Prosecution history of parent U.S. Appl. No. 14/697,574.
Office Action dated Aug. 17, 2015, from European Patent Office in related European application EP 10798430.4.

* cited by examiner

CONVERSION OF A DISCRETE-TIME QUANTIZED SIGNAL INTO A CONTINUOUS-TIME, CONTINUOUSLY VARIABLE SIGNAL

This application claims the benefit of U.S. Provisional Patent Application Ser. No. 62/103,160, filed Jan. 14, 2015, and is a continuation in part of U.S. patent application Ser. No. 14/537,122, filed on Nov. 10, 2014, which claims the benefit of U.S. Provisional Patent Application Ser. No. 61/970,846, filed Mar. 26, 2014, and is a continuation in part of U.S. patent application Ser. No. 13/647,301, filed Oct. 8, 2012 (now U.S. Pat. No. 8,896,471), which is a continuation of U.S. patent application Ser. No. 13/400,019, filed Feb. 17, 2012 (now U.S. Pat. No. 8,294,605), which: (1) claims the benefit of U.S. Provisional Patent Application Ser. Nos. 61/444,643, 61/450,617 and 61/507,568, filed on Feb. 18, 2011, Mar. 8, 2011 and Jul. 13, 2011, respectively; and (2) is a continuation in part of U.S. patent application Ser. No. 12/970,379, filed on Dec. 16, 2010 (now U.S. Pat. No. 8,264,390), which claimed the benefit of U.S. Provisional Patent Application Ser. No. 61/287,079, filed on Dec. 16, 2009. The present application also is a continuation in part of U.S. patent application Ser. No. 14/629,442, filed Feb. 23, 2015, which is a continuation in part of U.S. patent application Ser. No. 14/056,917, filed on Oct. 17, 2013 (now U.S. Pat. No. 9,000,967), which is a continuation in part of U.S. patent application Ser. No. 13/535,037, filed on Jun. 27, 2012 (now U.S. Pat. No. 8,581,768) which claimed the benefit of: U.S. Provisional Patent Application Ser. No. 61/549,739, filed on Oct. 20, 2011, and titled "Linear to Discrete Quantization Conversion with Reduced Sampling Variation Errors"; U.S. Provisional Patent Application Ser. No. 61/501,284 (the '284 Application), filed on Jun. 27, 2011; U.S. Provisional Patent Application Ser. No. 61/536,003, filed on Sep. 18, 2011; and U.S. Provisional Patent Application Ser. No. 61/554,918, filed on Nov. 2, 2011. Each of the foregoing applications is incorporated by reference herein as though set forth herein in full.

FIELD OF THE INVENTION

The present invention pertains to systems, methods and techniques for converting a sampled, quantized (discrete-time) signal into a continuous-time continuously variable (linear) signal. It is particularly applicable to converters that operate at very high sampling rates and with high instantaneous bandwidth.

BACKGROUND

Many applications in modern electronics require that discrete-time signals, generated using computers and digital signal processors, be converted to linear (analog) signals, e.g., for transmission as electromagnetic signals. Typically, this transformation is made using a conventional digital-to-analog converter (DAC). However, the present inventor has discovered that each of the presently existing converters exhibits shortcomings that limit overall performance at very high sampling rates.

Due to parallel processing and other innovations, the digital information processing bandwidth of computers and signal processors has advanced beyond the capabilities of state-of-the art DACs. Therefore, converters with higher instantaneous bandwidth are desired. Existing solutions are limited by instantaneous bandwidth (sampling rate), effective conversion resolution (accuracy), or both.

The resolution of a DAC is a measure of the precision with which a quantized signal can be transformed into a continuous-time continuously variable signal, and typically is specified as a ratio of the total signal power to the total noise plus distortion power at the DAC output. This signal-to-noise-and-distortion ratio (SNDR) of a DAC is commonly expressed on a logarithmic scale in units of decibels (dB). When a discrete-time discretely variable (digital) signal is converted into a continuous-time continuously variable (analog) signal, the quality of the analog signal is corrupted by various limitations and errors introduced during the conversion process. Examples include: 1) the finite granularity of the DAC output levels, which produces quantization noise; 2) the imprecise (e.g., nonlinear) mapping of digital inputs to corresponding discrete output voltage or current levels, which introduces distortion in the form of rounding inaccuracies (rounding errors); 3) the imperfect timing between transitions in output voltages or currents relative to transitions in digital inputs, which causes noise in the form of sampling jitter; and 4) the thermal noise associated with active devices (e.g., switches and amplifiers) which couples onto the DAC output. High-resolution converters transform discrete signals into continuously variable signals using a rounding operation with fine granularity, and a more linear mapping of digital inputs to output voltage and/or current. Instantaneous conversion bandwidth is limited by the Nyquist criterion to a theoretical maximum of one-half the converter sampling rate (the Nyquist limit), such that aliasing occurs when the converted signal contains frequency components which exceed the Nyquist limit. High-resolution conversion (of ≥10 bits) conventionally has been limited to instantaneous bandwidths of about a few gigahertz (GHz) or less.

Converters that transform digital signals into analog signals with fine granularity (i.e., transform a digital signal using many discrete output levels) and a sampling rate $f_S$ that is equal to, or just greater than, twice the maximum frequency $f_{MAX}$ spanned by the digital signal, are conventionally known as Nyquist-rate converters, or Nyquist converters. Conventional Nyquist-rate converters include those implemented using resistor ladder networks (e.g., R-2R ladders), or those employing switched current/voltage sources with unitary (i.e., equal) weighting or binary weighting. A conventional R-2R ladder DAC, such as that shown in FIG. 1A, generates a variable output voltage at levels equal to the binary-weighted sum of multiple, two-level (i.e., digital) inputs. The voltage summation operation is performed using a network of resistors, having appropriately weighted (i.e., binary-weighted) resistance. The voltage at the output of the resistor network sometimes is buffered, and/or sometimes is smoothed using an analog lowpass filter, to produce a continuously variable signal. An alternative DAC structure is illustrated in FIG. 1B, which instead of a resistor ladder network, uses a switched bank of current sources to generate a variable output current equal to the binary-weighted sum of digital inputs. As shown in FIG. 1B, the output current sometimes is converted to a proportional output voltage using a transimpedance amplifier (i.e., a current-to-voltage converter).

Conventional Nyquist-rate converters potentially can achieve very high instantaneous bandwidths, but as discussed in greater detail below, the present inventor has discovered that component mismatches in the resistor ladder network, or in the switched current sources, can introduce rounding errors that significantly limit attainable resolution. In addition, the resolution of conventional Nyquist-rate converters is limited by other practical implementation impairments such as sampling jitter and thermal noise. Although in theory, Nyquist-rate converters potentially could realize high resolution at instantaneous bandwidths greater than 10 GHz, this potential has been unrealized in conventional Nyquist-rate converters due to the foregoing problems.

A conventional approach that attempts to reduce quantization noise and errors uses an oversampling technique. Conventional Nyquist-rate converters transform digital input samples into variable-level output samples (i.e., as a voltage or a current), such that a single input sample is represented by a single output sample, and the value of each output sample is proportional to the digital input. In contrast, conventional oversampling converters transform digital input samples into outputs which are pseudorandom sequences of two-level samples (i.e., output samples having a single positive level or a single negative level), such that: 1) a single input sample is represented by multiple output samples; and 2) the average of these multiple output samples is proportional to the digital input. Therefore, oversampling converters generate coarse (e.g., two-level) analog voltages or currents at a sampling rate (i.e., $f_S$) that is much higher than twice the occupied bandwidth $f_B$ of the input signal (i.e., $f_S \gg f_B$), where: 1) $f_B$ is equal to the Nyquist frequency $f_{MAX}$ for lowpass (baseband) input signals; and 2)

$$N = \frac{1}{2} \cdot f_S / f_B$$

is conventionally referred to as the oversampling ratio of the converter. A continuously variable output that is proportional to the digital inputs is produced from the pseudorandom sequences of two-level outputs, using a filtering operation that effectively averages the output samples. Although this averaging process reduces the instantaneous bandwidth of the oversampling converter (i.e., the maximum frequency that can be converted without exceeding the Nyquist limit), it has the benefit of improving the converter resolution by attenuating quantization noise (i.e., the noise introduced by using only two levels to represent a continuously variable signal) and errors resulting from component mismatches, sampling jitter, and thermal noise. The extent of this benefit is directly related to the output sampling rate $f_S$ (i.e., the benefit increases as the sampling rate increases), and is conventionally enhanced using oversampling in conjunction with an operation referred to as noise-shaped quantization, that ideally attenuates conversion noise and errors in the signal bandwidth without also attenuating the signal itself. Through this noise-shaped quantization operation and subsequent filtering (i.e., output averaging), oversampling converters transform a high-rate intermediate signal having low resolution, into a relatively low bandwidth output signal having improved resolution.

FIGS. 2A&B illustrate block diagrams of conventional, lowpass oversampling converters 5A and 5B, respectively. A conventional lowpass, oversampling converter typically uses delta-sigma (ΔΣ) modulation (e.g., modulators 7A&B) to coarsely quantize a digital input signal, in a manner where the noise introduced by coarse quantization is shaped with a high-pass response. The input (e.g., signal 3) to each of ΔΣ modulators 7A&B is a high-rate signal, with a sampling rate $f_S = f_{CLK} \gg 2 \cdot f_{MAX}$ (i.e., the sampling rate $f_S$ is equal to the modulator clocking rate $f_{CLK}$, and is greater than twice the maximum frequency $f_{MAX}$ spanned by both digital input 2 and modulator input 3). More specifically, modulator input 3 is a high-rate (oversampled) representation of input signal 2, such that modulator input 3 and digital input 2 are, respectively, high-rate and Nyquist-rate representations of the same underlying continuous-time signal. Conventionally, modulator input 3 is generated from digital input 2 using a sample-rate conversion operation (e.g., rate converter 6) which comprises: 1) upsampling by the converter oversampling ratio N (e.g., via zero-insertion within upsampler 6A); and 2) lowpass filtering (e.g., within filter 6B) to remove the unwanted signal images produced by zero-insertion. As the name implies, delta-sigma modulators 7A&B shape the noise introduced by two-level quantizer 10 via difference operation 8 (i.e., delta) and integration operation 13 (i.e., sigma), where $$I(z) = \frac{1}{1 - z^{-1}}$$

is the response of integrator operation 13 and $z^{-1}$ represents a unit delay equal to $1/f_{CLK}$ (i.e., $z^{-1}$ represents a delay corresponding to one cycle of the modulator clocking rate $f_{CLK}$). Converter 5A, shown in FIG. 2A, uses what is conventionally referred to as an interpolative ΔΣ modulator circuit (e.g., modulator 7A). Alternatively, circuit 5B shown in FIG. 2B, utilizes a lowpass ΔΣ modulator (e.g., modulator 7B) with a conventional error-feedback structure. See D. Anastassiou, "Error Diffusion Coding in A/D Conversion," IEEE Transactions on Circuits and Systems, Vol. 36, 1989.

Generally speaking, the delta-sigma modulator processes the signal with one transfer function (i.e., the signal transfer function or STF) and the quantization noise with a different transfer function (i.e., the noise transfer function or NTF). Conventional transfer functions (i.e., after accounting for the implicit delay of the clocking operation on two-level quantizer 10) are of the form $STF(z)=z^{-k}$ and $NTF(z)=(1-z^{-1})^P$, where k is an integer and P is called the order of the modulator (or order of the noise-shaped response). Converter circuits 5A&B employ first-order ΔΣ modulation (i.e., P=1) that produces STF frequency response 30 and NTF frequency response 32 that are shown in FIG. 2C. For both circuits 5A&B, the output sampling rate $f_S$, and therefore the converter oversampling ratio N, is determined by the clock frequency $f_{CLK}$ of delta-sigma modulator 7A&B (i.e., shown as the input clock to the two-level quantizer 10 in FIGS. 2A&B), such that $f_S = f_{CLK}$.

For a given converter resolution, the bandwidth of a conventional oversampling converter typically is increased by increasing the clocking frequency $f_{CLK}$ of the ΔΣ modulator (i.e., increasing the sampling rate $f_S$), thereby making the oversampling ratio N higher. Similarly, for a given bandwidth, a higher oversampling ratio N results in improved converter resolution. Generally speaking, the present inventor has determined that the resolution B of a conventional oversampling converter is given by $$B = \Delta Q - \frac{1}{2} \cdot \log_2 \left( \int_0^{f_S/2} \frac{1}{12} \cdot |NTF(e^{2\pi jfT}, P) \cdot F(e^{2\pi jfT})|^2 df \right),$$

where ΔQ is the number of bits at the output of quantization circuit 10 (i.e., level of coarse quantization which typically is equal to one bit) and $F(e^{2\pi jfT})$ is the frequency response of output filter 12. Increasing the clock frequency $f_{CLK}$ of the ΔΣ modulator requires circuitry with higher speed capability, and generally, higher power dissipation. Alternatively, higher bandwidth and/or improved resolution are realized by increasing the order P of the ΔΣ modulator. Compared to converter circuits 5A&B, lowpass oversampling converter 5C, illustrated in FIG. 2D, realizes higher bandwidth (or improved resolution) using interpolative ΔΣ modulator circuit 7C, which incorporates two integration operations (i.e., circuits 13A&B) to produce a noise-shaped response that is second-order (i.e., P=2). Increasing the modulator order P, however, causes undesirable reductions in the stability of the modulator. The present inventor has discovered, for example, that a ΔΣ modulator of order four or higher is unstable with two-level (i.e., ΔQ=1 bit) quantization. The present inventor also has discovered that the multi-level quantization circuits needed to stabilize high-order modulators introduce rounding errors that are not subjected to the noise-shaped response of the ΔΣ modulator. As a result of constraints on the operating speed (i.e., clocking rate) of conventional ΔΣ modulator circuits and on the rounding accuracy of multi-level quantization circuits, increasing the clocking frequency and/or the order of the ΔΣ modulator has limited utility in improving the bandwidth and/or resolution of conventional oversampling converters.

The delta-sigma converters 5A-C illustrated in FIGS. 2A,B&D are conventionally known as lowpass, delta-sigma converters. A variation on the conventional lowpass converter employs bandpass delta-sigma modulation to allow conversion of narrowband signals that are centered at frequencies other than zero. Exemplary bandpass oversampling converter 40A, illustrated in FIG. 3A, includes bandpass delta-sigma modulator 42 that shapes noise from two-level quantizer 10 by performing difference operation 8 (i.e., delta) and integration operation 14 (i.e., sigma), where $$H(z) = \frac{z^{-1}}{1+z^{-2}}$$

is the response of integration operation 14 and $z^{-1}$ represents a unit delay equal to $1/f_{CLK}$. After accounting for the implicit delay of the clocking operation on two-level quantizer 10, conventional bandpass ΔΣ modulator 42 has a $STF(z)=z^{-1}$ and a second-order $NTF(z)=1-z^{-2}$. Like converter circuits 5A&C, bandpass oversampling converter circuit 40A is an interpolative structure that produces signal response 70, shown in FIG. 3B, that is different from its quantization noise response 71. As shown in FIG. 3B, the bandpass modulator of FIG. 3A has a NTF with a minimum magnitude (i.e., spectral null 72) at a frequency of $$\frac{1}{4} \cdot f_S = \frac{1}{4} \cdot f_{CLK},$$

which is at the center of the converter Nyquist bandwidth. Producing a NTF with a spectral null at a frequency other than zero hertz requires a real ΔΣ modulator with, at minimum, a second-order response (i.e., the delay operator z is raised to a power of −2), and in general, the NTF of a bandpass ΔΣ modulator is of the form $(1+\rho \cdot z^{-1}+z^{-2})^P$, where −2≤ρ≤+2. Although signal response 70 of circuit 40A is all-pass, the present inventor has discovered that, in general, the STF of bandpass oversampling converters is not all-pass when interpolative modulator structures are employed. Conversely, the present inventor has discovered that bandpass oversampling converters which utilize the alternative error-feedback structure of FIG. 2B, have an STF which is uniformly all-pass. After two-level quantization (e.g., within quantizer 10), the bandpass filtering of quantization noise takes place (e.g., within filter 43) in a manner similar to that performed in the standard conventional lowpass oversampling converter (e.g., either of converters 5A&B). In FIG. 3A, it is assumed that the sampling rate of the digital input is equal to the clocking rate $f_{CLK}$ of the overall converter (i.e., the clocking rate of the modulator), and therefore, a sample-rate conversion (upsampling) operation is not included. In cases where the sampling rate of the digital input is lower than the clocking rate $f_{CLK}$ of the overall converter, however, a sample-rate conversion (upsampling) operation would be included.

Although oversampling with noise-shaped quantization can reduce quantization noise and other conversion errors, the output filtering (i.e., smoothing) operations generally limit the utility of oversampling converters to applications requiring only low instantaneous bandwidth (e.g., input signals with low frequency content). Conventional schemes for overcoming the bandwidth and resolution limitations of data converters generally have been devised with a focus on the conversion of analog (linear) signals to digital (discrete) signals (i.e., analog-to-digital conversion), rather than on the conversion of digital signals to analog signals (i.e., digital-to-analog conversion), which is the subject of the present invention. The present inventor has discovered that these conventional schemes for improving bandwidth and/or resolution in analog-to-digital conversion suffer from significant disadvantages, particularly in attempts to directly adapt these schemes for use in digital-to-analog conversion applications.

For example, one attempt to overcome the instantaneous bandwidth limitations of high-resolution, analog-to-digital (A/D) converters is conventional hybrid filter bank (HFB) converter 50, illustrated in FIG. 4A. See A. Petraglia and S. K. Mitra, "High Speed A/D Conversion Using QMF Banks," Proceedings: IEEE Symposium on Circuits and Systems, 1990. A conventional HFB converter consists of multiple narrowband converters that are operated in parallel, such that: 1) a wideband, analog signal is spectrally decomposed into multiple narrowband segments (i.e., sub-bands), using an array of analog bandpass filters (i.e., analysis filters 52A-C) with minimally overlapped frequency responses; 2) each sub-band is downconverted (i.e., within downsamplers 53) and digitized using a low-speed converter (e.g., A/D circuits 54); 3) the digitized outputs of each converter 54 are upconverted (i.e., within upsamplers 56); and 4) the outputs are then combined using an array of digital bandpass filters (i.e., synthesis filters 58A-C) with frequency responses that precisely overlap to create an overall response that is all-pass (i.e., the digital filters have near-perfect signal reconstruction properties). For the conversion of digital signals into analog signals, the present inventor has contemplated a complementary scheme, whereby direct adaptation: 1) analog analysis filters 52A-C at the converter input are moved to the converter output and become signal synthesis filters; 2) analog-to-digital converters 54 are replaced with digital-to-analog converters; and 3) digital synthesis filters 58A-C are moved to the converter input and become signal analysis filters. However, the present inventor has discovered that the performance of this complementary scheme is limited by the intermodulation distortion (i.e., intermodulation or non-ideal cross-products) of the analog mixers needed for the analog upconversion operation. The present inventor also has discovered that at high sampling rates (e.g., greater than several gigahertz), the complexity of multiple digital analysis filters (i.e., one per processing branch) can be prohibitive in many applications, such as those where more than just a few parallel processing branches are needed to realize desired conversion bandwidth and resolution performance.

A second attempt to overcome the instantaneous bandwidth limitations of high-resolution, analog-to-digital (A/D) converters is conventional Multi-Band Delta-Sigma (MBΔΣ) converter 70, shown in FIG. 4B. See Aziz, P., "Multi Band Sigma Delta Analog to Digital Conversion", IEEE International Conference on Acoustics, Speech, and Signal Processing, 1994. The conventional MBΔΣ approach is similar to the conventional HFB approach except that use of bandpass ΔΣ converters, instead of lowpass A/D converters, eliminates the need for analog analysis filters (e.g., filters 52A-C of circuit 50 in FIG. 4A), downconversion operations (e.g., downsamplers 53 of circuit 50 in FIG. 4A), and upconversion operations (e.g., upsamplers 56 of circuit 50 in FIG. 4A). For converting digital signals to analog signals, the present inventor has contemplated a complementary scheme whereby direct adaptation: 1) analog ΔΣ modulators 72 are replaced with equivalent digital ΔΣ modulators; and 2) digital synthesis filters 73A-C are replaced with equivalent analog synthesis filters. The present inventor, however, has discovered that the sampling rate (i.e., oversampling ratio) of this complementary scheme is limited by the clocking rates (i.e., or switching speeds) of the digital logic needed to implement the digital ΔΣ modulators (i.e., a less significant limitation in analog implementations). Furthermore, the present inventor also has discovered that this complementary scheme is impractical because it requires a bank of analog (continuous-time) filters whose individual responses replicate those of high-order, digital filters with perfect reconstruction properties (i.e., a bank of filters with an overall response that is all-pass). Unlike the HFB approach of FIG. 4A, where imperfections in the analog filter bank are mitigated by increasing the complexity of the associated digital filter bank (see S. R. Velazquez, T. Q. Nguyen, and S. R. Broadstone, "Design of Hybrid Filter Banks for Analog/Digital Conversion," IEEE Transactions on Signal Processing, 1998), the conventional MBΔΣ approach provides no means of compensating for the amplitude and group delay distortion introduced by analog filter banks with imperfect signal reconstruction properties. Use of direct digital-to-analog filter transformations (i.e., those based on conventional bilinear or impulse-invariant transforms) to design analog filter banks with an all-pass response, generally results in individual analog filters of unmanageable complexity (i.e., filter orders of 30 or more). Approximations to these direct transformations conventionally support only a small number of parallel processing paths (e.g., see A. Fernandez-Vazquez and G. Jovanovic-Dolecek, "Design of Real and Complex Linear-Phase IIR Modified QMF Banks," IEEE Asia Pacific Conference on Circuits and Systems, 2006), and/or require circuits that are not practical for operation at multi-gigahertz sampling rates, such as switched-capacitor or other impractical circuits (e.g., see P. C. R. Brandao and A. Petraglia, "A Switched-Capacitor Hadamard Filter Bank in 0.35 µm CMOS," Proceedings: 48$^{th}$ Midwest Symposium on Circuits and Systems, 2005; P. M. Furth and A. G. Andreou, "A Design Framework for Low Power Analog Filter Banks", IEEE Transactions on Circuits and Systems I: Fundamental Theory and Applications, 1995). As discussed in greater detail below, however, the present inventor has discovered that with relatively minor modifications to standard filter responses (e.g., only center frequency, bandwidth, and/or order), the residual amplitude and group delay distortion introduced by the analog filter bank can be reduced to levels that are acceptable in many applications.

In addition to the conventional frequency-interleaved schemes employed by converters 50 and 70 (i.e., schemes involving spectral decomposition of the converter input signal), another attempt at overcoming the instantaneous bandwidth limitations of high-resolution, analog-to-digital converters involves the use of conventional time-interleaving to increase the bandwidth, or equivalently, the sampling rate of a ΔΣ modulator. Circuits 80A&B, which are illustrated in FIGS. 5A&B, respectively, are conventional time-interleaved ΔΣ modulators that employ a time-interleaving factor of m=2 (i.e., two parallel processing paths). Conventional time-interleaved ΔΣ modulators, such as circuits 80A&B, are interpolative structures wherein the loop filter, or integrator function (i.e., integrator 13 of circuit 80A and integrators 13A&B of circuit 80B), is performed by circuits that operate in parallel. This process of implementing a particular function using parallel processing paths (i.e., parallel circuits) is sometimes referred to in the prior art as polyphase decomposition, or multirate processing. In conventional multirate processing, the output of each parallel processing path is the sub-rate sequence of samples that would be produced by subsampling, at a particular sample-time offset (i.e., at a particular subsampling phase), the sequence of samples generated at full-rate by a complete function (i.e., the output of each parallel path represents a different polyphase component of a complete signal). The ratio of the effective sampling rate (i.e., the full-rate associated with the complete function) to the parallel subsampling rate (i.e., the sub-rate associated with each parallel processing path) conventionally is referred to as the polyphase decomposition factor, and is generally equal to the number of parallel processing paths. More specifically, the operation of a processing function after polyphase decomposition by m is such that: 1) the data samples from the first parallel output correspond to the subsamples taken every m$^{th}$ (full-rate) sample-time period (i.e., subsampling by m), starting with the first sample (i.e., the outputs of the first parallel path are the even subsamples for m=2); and 2) the data samples from the m$^{th}$ parallel output correspond to the subsamples taken every m$^{th}$ (full-rate) sample-time period, starting with the m$^{th}$ sample (i.e., the output of the second parallel path are the odd subsamples for m=2).

In circuits 80A&B of FIGS. 5A&B, the integrator function has been decomposed into two parallel paths (i.e., resulting in a polyphase decomposition factor of m=2), and the delay operator z represents a sub-rate $$\left(\text{i.e., } \frac{1}{m} \cdot f_S\right)$$

delay equal to 2/f$_S$, where f$_S$ is the sampling rate of the complete converter (i.e., the full-rate before polyphase decomposition). Circuit 80A is a lowpass modulator with a NTF response that is first-order (i.e., P=1), and circuit 80B is a lowpass modulator with a NTF response that is approximately second-order (i.e., P=2). But rather than decomposing the entire modulator into parallel (polyphase) circuits, in such conventional converters the difference function of the modulator (i.e., subtractors 8A&B of circuit 80A&B) and the quantization function of the modulator (i.e., quantizers 10A&B in circuits 80A&B) are simply replicated m times and distributed across the m parallel processing paths. See R. Khoini-Poorfard, L. B. Lim, and D. A. Johns, "Time-Interleaved Oversampling A/D Converters: Theory and Practice," IEEE Transactions on Circuits and Systems II: Analog and Digital Signal Processing, 1997. As discussed in greater detail below, the present inventor has discovered that simple replication and distribution of the difference and quantization functions (i.e., using time-interleaving through simple replication rather than through polyphase decomposition) causes conventional time-interleaved ΔΣ modulators to exhibit undesirable properties that prevent their use in very high-rate converter applications.

Referring to conventional circuit 80A of FIG. 5A, which utilizes transparent (i.e., unclocked) quantizers with no implicit delay, it can be shown that the quantized output $Q(y_n)$ of the time-interleaved (parallel) modulator is described by the difference equation $$Q[y_n] = Q[x_{n-1} + x_{n-2} - Q(y_{n-1}) - Q(y_{n-2}) + y_{n-2}],$$

where the Q(•) operator represents quantization (rounding). The above difference equation results in a $STF(z)=z^{-1}$ (i.e., an all-pass response) and a $NTF(z)=1-z^{-1}$, where $z^{-1}$ represents a full-rate delay, equal to one period of the effective sampling rate $f_S$. Although the STF and NTF of the time-interleaved ΔΣ modulator are equal to those of a full-rate ΔΣ modulator with a first-order shaping (i.e., a ΔΣ modulator which is not time-interleaved), the output of the circuit is a function of a previous output $Q(y_{n-1})$ which has been delayed by only one full-rate delay (i.e., one period of the effective sampling rate $f_S$) relative to the output $Q[y_n]$. The present inventor has observed that the need to feed back and process outputs that are delayed by only one full-rate period of $1/f_S$ (i.e., the need for processing computations to take place within one full-rate cycle), rather than one sub-rate period of $m/f_S=2/f_S$, creates a race condition that forces circuit 80A to operate at speeds equivalent to the full-rate sampling frequency of $f_S$, rather than the intended sub-rate speed of $$\frac{1}{m} \cdot f_S = \frac{1}{2} \cdot f_S.$$

This race condition occurs because the difference and quantization functions of the time-interleaved modulator are not implemented as true polyphase (multirate) operations. A similar race condition occurs in the implementation of circuit 80B, which has an output $Q(y_n)$ that is described by the difference equation $$Q(y_n) = Q[x_{n-2} + 2 \cdot x_{n-3} + x_{n-4} - Q(y_{n-1}) -$$
$$2 \cdot Q(y_{n-2}) - Q(y_{n-3}) + Q(y_{n-4}) + 2 \cdot y_{n-2} - y_{n-4}]$$

(i.e., assuming no implicit quantizer delay). Since the output of circuit 80B also depends on an output $Q(y_{n-1})$ that has been delayed by only one full-rate period equal to $1/f_S$, the circuit also must operate at a full-rate of $f_S$, rather than the intended sub-rate of $$\frac{1}{m} \cdot f_S = \frac{1}{2} \cdot f_S.$$

In addition to the computational race condition, the present inventor has discovered that circuit 80B exhibits three other undesirable properties: 1) the time-interleaved modulator has a signal transfer function $STF(z)=z^{-2} \cdot (1+z^{-1})^2/(1+z^{-1}+z^{-3})$ which deviates from a true all-pass response of $STF(z)=z^{-k}$; 2) the time-interleaved modulator has a noise transfer function $NTF(z)=(1-z^{-1})^2/(1+z^{-1}+z^{-3})$ which deviates from the desired form of $(1-z^{-1})^P$ for a full-rate lowpass modulator; and 3) the cascaded integrator structure of the second-order modulator is impractical for use in bandpass converter applications because second-order (bandpass) NTFs of the form $(1+\rho \cdot z^{-1}+z^{-2})^P$, where $-2 \leq \rho \leq +2$, cannot be factored into cascaded first-order functions of the form $(1+\alpha \cdot z^{-1}) \cdot (1+\beta \cdot z^{-1})$.

Besides utilization in analog-to-digital (A/D) converter applications, time-interleaved ΔΣ modulators are employed in conventional circuits which attempt to improve the effective sampling rates and/or instantaneous bandwidths of digital-to-analog (D/A) converters. An example is conventional D/A converter circuit 80C, illustrated in FIG. 5C, which receives a high-rate digital input and consists of: 1) a time-interleaved ΔΣ modulator (e.g., modulator 16A) with an error-feedback structure and a time-interleaving factor of m (i.e., the modulator has m parallel processing paths); and 2) an m-to-1 multiplexer (e.g., multiplexer 16B) with m inputs and one output. See J. Pham and A. C. Carusone, "A Time-Interleaved ΔΣ-DAC Architecture Clocked at the Nyquist Rate," IEEE Transactions on Circuits and Systems II: Express Briefs, 2008. The parallel outputs of modulator 16A represent subsampled sequences at different sample-time offsets (i.e., phases), such that data samples from the first parallel output correspond to subsampling by m at the first sample-time offset, and data samples from the $m^{th}$ parallel output correspond to subsampling by m at the $m^{th}$ sample-time offset. Output multiplexer 16B converts the m parallel outputs, which switch (toggle) at a sub-rate of $1/m \cdot f_S$, into a single output which switches (toggles) at the full-rate of $f_S$. The operation of conventional multiplexer 16B can be represented functionally as upsampling (i.e., zero insertion), delaying, and combining. As illustrated, time-interleaved ΔΣ modulator 16A comprises: 1) polyphase loop filter 15 with m inputs and m outputs; 2) an array consisting of m truncation/rounding elements (e.g., quantization circuits 10A&B); and 3) multiple adders and subtractors (e.g., arithmetic operators 8A-D). Conventionally, loop filter 15 is implemented as a parallel circuit with m processing paths, using polyphase decomposition techniques for finite-impulse response (FIR) filters. Each of the m parallel paths is coupled to a quantization circuit (e.g., quantizers 10A&B) and arithmetic operators (e.g., adders 8A&B and subtractors 8C&D), which are simply replicated multiple times rather than being subjected to a polyphase decomposition process.

The present inventor has discovered that like conventional circuits which utilize time-interleaved ΔΣ modulators for A/D conversion, race conditions (i.e., conditions where outputs must be fed back as inputs for processing within one full-rate cycle) limit the effective sampling rate and instantaneous bandwidth of conventional circuits which utilize time-interleaved ΔΣ modulators for D/A conversion. More specifically, race conditions occur because in these conventional D/A converters (e.g., circuit 80C), polyphase decomposition is applied to only a portion of the time-interleaved ΔΣ modulator. As illustrated by conventional converter 80C, shown in FIG. 5C, the loop filter (e.g., loop filter 15) of modulator 16A is a polyphase structure, while truncation elements (e.g., quantizers 10A&B) and arithmetic operators (e.g., subtractors 8C&D) are simply replicated (i.e., duplicated without polyphase decomposition). As a result of polyphase decomposition, the computations associated with loop filter 15 would occur at the subsampling rate of $1/m \cdot f_S$, if loop filter 15 operated as a standalone filter, rather than as a component in the feedback loop of a larger system (i.e., a $\Delta\Sigma$ modulator). It is well understood by those skilled in the art (i.e., see the filter decomposition discussion in Pham 2008), however, that for a polyphase loop filter having a response of order n (i.e., a discrete-time transfer function where the highest power of delay operator z is n), the computation of each filter output (e.g., the input to adders 8A&B) is a function of n previous inputs, or for the case of a time-interleaved modulator, n previous modulator outputs (i.e., the inputs to loop filter 15 are the outputs of quantizers 10A&B after further processing within subtractors 8C&D). For shaping of quantization noise, loop filter 15 must have a response with nonzero order (i.e., n≥1), and therefore, its operation is such that: 1) the second output of the loop filter cannot be computed until the first input of the loop filter is ready (i.e., until the loop filter input that is coupled to quantizer 10B and subtractor 8D is available); 2) the third output of the loop filter cannot be computed until the second input of the loop filter is ready; and ultimately 3) the $m^{th}$ output of the loop filter (i.e., the loop filter output that is coupled to quantizer 10A and subtractor 8C) cannot be computed until the $m^{th}-1$ input of the loop filter is ready. As a result of the above sequential processing operation, each of the m modulator outputs is a function of a previous modulator output that has been delayed by only one full-rate cycle of $f_S$ (i.e., the delay between the $m^{th}-1$ modulator output and the m modulator output is only one full-rate sampling period equal to $1/f_S$). More specifically, although the clocking frequency of each modulator is the sub-rate of $$f_{CLK} = \frac{1}{m} \cdot f_S,$$

computational results must propagate from the first modulator output (i.e., the output of quantizer 10B) to the input of the $m^{th}$ truncation element (i.e., the input of quantizer 10A) in a time of less than m full-rate cycles (i.e., a total time of less than $m/f_S$). Consequently, the modulator computations occur at a speed equivalent to the full-rate sampling frequency of $f_S$, or with a computational latency of $1/f_S$, to ensure that m computations (i.e., one computation per parallel path) can traverse through the parallel processing blocks during the allotted time of $m/f_S$. The maximum effective sampling rate of conventional converter 80C is further constrained because the conventional m-to-1 multiplexer (e.g., multiplexer 16B), which combines modulator outputs, must run at the full-rate of $f_S$, requiring the multiplexer to be implemented using high-speed circuitry with correspondingly high power consumption.

The present inventor has discovered that conventional lowpass $\Delta\Sigma$ converters, as illustrated in FIGS. 2A-C, and conventional bandpass $\Delta\Sigma$ converters, as illustrated in FIG. 3A, have several disadvantages that limit their utility in discrete-to-linear (digital-to-analog) converter applications requiring very high instantaneous bandwidth and high resolution. The present inventor also has discovered that these disadvantages cannot be overcome by: 1) direct adaptations of the conventional parallel processing approaches devised for A/D conversion, as illustrated in FIG. 4A&B; or 2) by adopting conventional time-interleaved approaches for $\Delta\Sigma$ modulation, as illustrated in FIGS. 5A-C. These disadvantages, which are discussed in greater detail in the Description of the Preferred Embodiment(s) section, include: 1) conversion bandwidth that is limited by the narrow lowpass, or narrow bandpass, filtering operations used to attenuate the shaped quantization noise and errors; 2) conversion resolution (SNDR) that is limited by the clock frequency $f_{CLK}$ of the delta-sigma modulator (i.e., the clock frequency of a two-level quantizer); 3) conversion resolution that is limited by a low-order noise-shaped response (i.e., generally second-order for bandpass modulators), which is needed for stable operation with two-level quantizers; and 4) effective sampling rates that are limited by race conditions occurring when outputs must be fed back as inputs for processing within one full-rate cycle. In addition, conventional oversampling digital-to-analog converters cannot be operated in parallel as hybrid filter banks (i.e., HFB scheme) or multi-band arrays (i.e., MB$\Delta\Sigma$ scheme), without suffering from the amplitude and group delay distortion introduced by imperfect analog filter banks, and/or the nonlinear (intermodulation) distortion introduced by upconverting analog mixers. Because of these disadvantages, the resolution of conventional oversampling converters cannot be increased without: 1) reducing bandwidth to improve the quantization noise attenuation of the output (smoothing) filters; or 2) increasing the converter sampling rate by using digital circuits with higher switching speeds (i.e., or sampling rates), since high-order modulators are unstable with two-level quantization. In addition, conventional oversampling converters employ delta-sigma modulator structures that do not provide a means of dynamically varying, or re-programming, the frequency ($f_{notch}$) where a minimum magnitude occurs in the quantization-noise response. The present inventor has discovered that such a feature can be advantageous in multi-mode applications (e.g., frequency synthesizers and tunable radios) where, depending on its programming, a single converter preferably can operate on different (multiple) frequency bands.

SUMMARY OF THE INVENTION

The present invention provides an improved DAC, particularly for use at very high sampling rates and instantaneous bandwidths (e.g., maximum input frequencies) approaching the Nyquist limit. The improved DAC overcomes the resolution limitations of conventional Nyquist-rate converters and the bandwidth limitations of conventional oversampling converters.

Thus, one specific embodiment of the invention is directed to an apparatus for converting a discrete-time quantized signal into a continuous-time, continuously variable signal and includes: 1) an input line for accepting a high-rate input signal that is discrete in time and in value; 2) a demultiplexer coupled to the input line that distributes the samples of the high-rate input signal to multiple, parallel outputs having a lower sampling rate; 3) a discrete-time noise-shaping/quantization circuit having a plurality of parallel processing paths, such that the inputs of the parallel paths are either coupled to the multiple outputs of the demultiplexer or are coupled to the outputs of other parallel paths, with each such parallel path generating a different subsampling phase of a complete signal that is output by the discrete-time noise-shaping/quantization circuit; 4) a multiplexer coupled to the parallel outputs of the discrete-time noise-shaping/quantization circuit that converts low-rate, parallel inputs into a serial (multi-level) output signal which reflects high-rate sampling; 5) a multi-bit-to-variable-level signal converter coupled to an output of the discrete-time noise-shaping/quantization circuit; and 6) an analog bandpass filter coupled to an output of the discrete-time noise-shaping/quantization circuit. Together, the parallel paths of the discrete-time noise-shaping/quantization circuit produce a conversion-noise frequency response with a minimum magnitude at a frequency which corresponds to a band selected by the analog bandpass filter. The parallel outputs of the discrete-time noise-shaping/quantization circuit operate at a subsampling rate ($f_{CLK}$) which is m times less than the sampling rate ($f_S$) of the high-rate input signal, such that $$f_{CLK} = \frac{1}{m} \cdot f_S$$

where m is the number of parallel paths, and the outputs of at least some of the parallel paths are a function only of: 1) samples of the input signal (i.e., inputs to the parallel paths); and 2) previous outputs from the parallel paths that have been delayed by at least one period of the subsampling rate at which a parallel path operates (i.e., a minimum delay of $1/f_{CLK}$=m/$f_S$).

An alternate specific embodiment of the invention is directed to an apparatus for converting a discrete-time quantized signal into a continuous-time, continuously variable signal and includes: 1) an input line for accepting an input signal that is discrete in time and in value; 2) an adder having a first input coupled to the input line, a second input and an output; 3) a multi-bit, discrete-time noise-shaping/quantization circuit coupled to the output of the adder; 4) a multi-bit-to-variable-level signal converter coupled to the output of the discrete-time noise-shaping/quantization circuit; 5) an analog bandpass filter coupled to the output of the discrete-time noise-shaping/quantization circuit; 4) a nonlinear bit-mapping component, having an input coupled to the output of the discrete-time noise-shaping/quantization circuit and also having an output; and 5) a feedback-loop filter having a first input coupled to the output of the nonlinear bit-mapping component, a second input coupled to the output of the adder, and an output coupled to the second input of the adder. The discrete-time noise-shaping/quantization circuit has a conversion-noise frequency response with a minimum magnitude at a frequency which corresponds to a band selected by the analog bandpass filter. The nonlinear bit-mapping component scales different bits of a multi-bit signal at its input, using different multi-bit factors to produce an output with an intentionally imperfect binary weighting, such as an imperfect binary weighting that is matched to the unintentionally imperfect binary weighting of a conventional R-2R ladder network.

A third specific embodiment of the invention is directed to an apparatus for converting a discrete-time quantized signal into a continuous-time, continuously variable signal and includes: 1) an input line for accepting an input signal that is discrete in time and in value; 2) multiple processing branches coupled to the input line; and 3) an adder. Each of the processing branches includes: (a) a discrete-time noise-shaping/quantization circuit; (b) a multi-bit-to-variable-level signal converter coupled to an output of the discrete-time noise-shaping/quantization circuit; and (c) an analog bandpass filter coupled to the output of the discrete-time noise-shaping/quantization circuit. The adder is coupled to an output of the analog bandpass filter in each of the processing branches. The discrete-time noise-shaping/quantization circuits in different ones of the processing branches have conversion-noise frequency responses with minima at different frequencies, and each of the discrete-time noise-shaping/quantization circuits produce a conversion-noise frequency response with a minimum magnitude at a frequency which corresponds to a band selected by the analog bandpass filter in the same processing branch. The analog filters in the various processing branches have frequency response orders that are not greater than 10 and preferably have standard analog filter responses (e.g., Butterworth, Chebychev, coupled-resonator), where the center frequencies, bandwidths, and/or orders of one or more filters has been made intentionally unequal to the others to minimize the amplitude and group delay distortion introduced by the composite filter bank response (i.e., the summed frequency responses of the filters in the various processing branches). It is noted that in applications where conversion at zero frequency (i.e., DC) is desired, one of the processing branches preferably includes an analog bandpass filter that is centered at zero frequency to produce a lowpass response.

A fourth specific embodiment of the invention is directed to an apparatus for converting a discrete-time quantized signal into a continuous-time, continuously variable signal that includes: 1) an input line for accepting an input signal that is discrete in time and in value; 2) a digital pre-distortion linearizer (DPL) coupled to the input line; 3) multiple processing branches coupled to the DPL; and 4) an adder. Each of the processing branches includes: (a) a discrete-time noise-shaping/quantization circuit; (b) a multi-bit-to-variable-level signal converter coupled to an output of the discrete-time noise-shaping/quantization circuit; and (c) an analog bandpass filter coupled to an output of the discrete-time noise-shaping/quantization circuit. The adder is coupled to an output of the analog bandpass filter in each of the processing branches. The discrete-time noise-shaping/quantization circuits in different ones of the processing branches have conversion-noise frequency responses with minima at different frequencies, and each of the discrete-time noise-shaping/quantization circuits produce a conversion-noise frequency response with a minimum magnitude at a frequency which corresponds to a band selected by the analog bandpass filter in the same processing branch. Unlike conventional HFB schemes that use analog filters to divide an input signal into narrowband segments, the DPL is a digital filter that does not perform such a frequency decomposition function in the representative embodiment of the invention. Instead, the frequency response of the DPL preferably has intentional amplitude and group delay (i.e., phase) variation, such as intentional amplitude and group delay variation that is equal and opposite to the unintentional amplitude and group delay variation that occurs within an analog filter bank which is constructed from analog filters with standard frequency responses (e.g., Butterworth, Chebychev, coupled-resonator, etc.). It is noted that the cascaded response of the DPL and the imperfect analog filter bank preferably is approximately all-pass, and therefore, forms a filter bank with near-perfect signal reconstruction properties.

A fifth specific embodiment of the invention is directed to an apparatus for converting a discrete-time quantized signal into a continuous-time, continuously variable signal and includes: 1) an input line for accepting an input signal that is discrete in time and in value, and is sampled at Nyquist-rate; 2) a demultiplexer (deserializer) coupled to the input line that converts an input signal into a high-rate (oversampled) output signal, the samples of which are distributed to multiple, parallel outputs having a lower sampling rate, such that in combination, the low-rate parallel outputs represent a high-rate signal; 3) a discrete-time noise-shaping/quantization circuit having a plurality of parallel processing paths, such that the inputs of parallel paths are either coupled to the multiple outputs of the demultiplexer or are coupled to the outputs of other parallel paths, with each such parallel path generating a different subsampling phase of a complete signal that is output by the discrete-time noise-shaping/quantization circuit; 4) a multiplexer coupled to the parallel outputs of the discrete-time noise-shaping/quantization circuit that converts low-rate, parallel inputs into a serial (multi-level) output signal which reflects high-rate sampling; 5) a multi-bit-to-variable-level signal converter coupled an output of the discrete-time noise-shaping/quantization circuit; and 6) an analog bandpass filter coupled to an output of the discrete-time noise-shaping/quantization circuit. Through parallel processing (i.e., within the plurality of parallel paths), the discrete-time noise-shaping/quantization circuit has a conversion-noise frequency response with a minimum magnitude at a frequency which corresponds to a band selected by the analog bandpass filter. The parallel outputs of the discrete-time noise-shaping/quantization circuit operate at a sampling rate ($f_{CLK}$) which is no more than twice the maximum frequency spanned by the input signal, such that $f_{CLK} \leq 2 \cdot f_{MAX}$, and the outputs of at least some of the parallel paths are a function only of: 1) samples of the input signal (i.e., inputs to the parallel paths); and 2) previous outputs from the parallel paths that have been delayed by more than a sample period of the input signal times a total number of the parallel paths (i.e., a minimum delay of $m/(2 \cdot f_{MAX})$ for a number of parallel paths equal to m).

A sixth specific embodiment of the invention is directed to an apparatus for converting a discrete-time quantized signal into a continuous-time, continuously variable signal and includes: 1) an input line for accepting the full-rate samples of an (underlying) input signal that is discrete in time and in value; 2) a parallel signal processor having an input coupled to said input line and also having a plurality of sub-rate outputs; 3) a multi-bit-to-variable-level signal converter which is coupled to a sub-rate output of the parallel signal processor, and which operates at a sampling rate that is less than or equal to the full-rate sampling frequency of the input signal; and 5) a signal combiner coupled to an output of the multi-bit-to-variable-level signal converter. The parallel signal processor includes a serial-to-parallel demultiplexing operation that sequentially couples input samples to multiple sub-rate outputs, such that the sequence of samples provided at each sub-rate output represents a subsampled version of the underlying (complete) input signal at a particular subsampling phase, with the different sub-rate outputs representing different subsampling phases. The samples on each sub-rate output are provided at a sampling rate (i.e., a sub-rate) which is less than or equal to the full-rate sampling frequency of the input signal. Additionally, the relationship between the sampling rate (i.e., sub-rate) on each sub-rate output and the sampling rate associated with the underlying input signal depends on the processing which occurs within the parallel signal processor: 1) the samples on each sub-rate output are provided at a lower sampling rate than the sampling rate of the underlying input signal when the parallel signal processor includes no upsampling (e.g., the full-rate sampling frequency of the input signal divided by the number of processing branches); and 2) the samples on each sub-rate output are provided at a sampling rate which can equal (or even exceed) the sampling rate of the underlying input signal when the sub-rate signal processor includes some form of upsampling, such as zero insertion, sample repetition, and/or interpolation. Using delay and summation operations, the sub-rate outputs of multi-bit-to-variable level signal converters are combined as continuous-time signals to produce an output sequence of values which represents a filtered version of the full-rate, underlying input signal. Typically, the filter response is a lowpass (e.g., a sin (x)/x) function with a bandwidth smaller than the full-rate sampling frequency and larger than a maximum frequency component of the underlying input signal. The delay operations introduce different time-offsets in increments equaling integer multiples of a corresponding full-rate period (i.e., the period associated with full-rate sampling). In one variation of the present embodiment, the delay operations introduce time-offsets via digital resampling on different phases of a sub-rate clock, and outputs of the delay operations are coupled to inputs of the multi-bit-to-variable-level signal converters. In an alternate variation of the present embodiment, the delay operations introduce time-offsets via signal propagation through continuous-time circuitry (e.g., passive delay lines, ladder networks, etc.), and inputs of the delay operations are coupled to outputs of the multi-bit-to-variable-level signal converters.

According to another aspect of any of the foregoing embodiments, the invention also encompasses an apparatus for combining the multiple sub-rate outputs of a polyphase (parallel) processor into a single full-rate output, and includes: 1) a plurality of input lines for accepting the sub-rate samples of an input signal; 2) a plurality of delay elements which are coupled to the input lines and which introduce different time-offsets in increments equaling integer multiples of a corresponding full-rate period; and 3) a signal combiner with inputs that are coupled to the outputs of the delay elements. The sub-rate samples on each of the plurality of input lines preferably are a sequence of values representing different subsampling phases of a full-rate and complete underlying signal. The plurality of output signals provided by the delay elements are summed within the combiner to produce an output sequence of values which represents a full-rate and filtered version of the complete signal. Typically, the filter response is a lowpass (e.g., a sin (x)/x) function with a bandwidth smaller than the full-rate sampling frequency.

A digital-to-analog (D/A) converter apparatus created by incorporating one or more of the specific embodiments of the invention described above, typically can provide a better combination of high resolution and wide bandwidth than is possible with conventional D/A converters and can be used for various commercial, industrial and military applications, e.g., in various direct conversion transmitters, software-defined or cognitive radios, multi-channel communication transmitters, all-digital RADAR systems, and high-speed arbitrary waveform generators.

The foregoing summary is intended merely to provide a brief description of certain aspects of the invention. A more complete understanding of the invention can be obtained by referring to the claims and the following detailed description of the preferred embodiments in connection with the accompanying figures.

BRIEF DESCRIPTION OF THE DRAWINGS

In the following disclosure, the invention is described with reference to the attached drawings. However, it should be understood that the drawings merely depict certain representative and/or exemplary embodiments and features of the present invention and are not intended to limit the scope of the invention in any manner. The following is a brief description of each of the attached drawings.

DESCRIPTION OF THE PREFERRED EMBODIMENT(S)

Figure 1A:
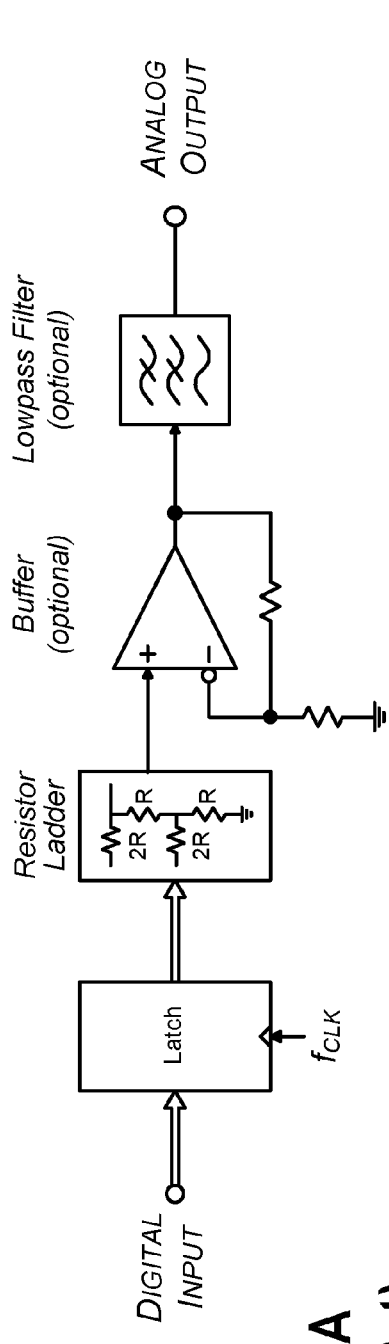
FIG. 1A is a block diagram of a conventional DAC that converts binary-weighted digital inputs to binary-weighted voltage outputs using a resistor ladder network, a buffer amplifier and an analog smoothing (lowpass) filter.
Figure 1B:
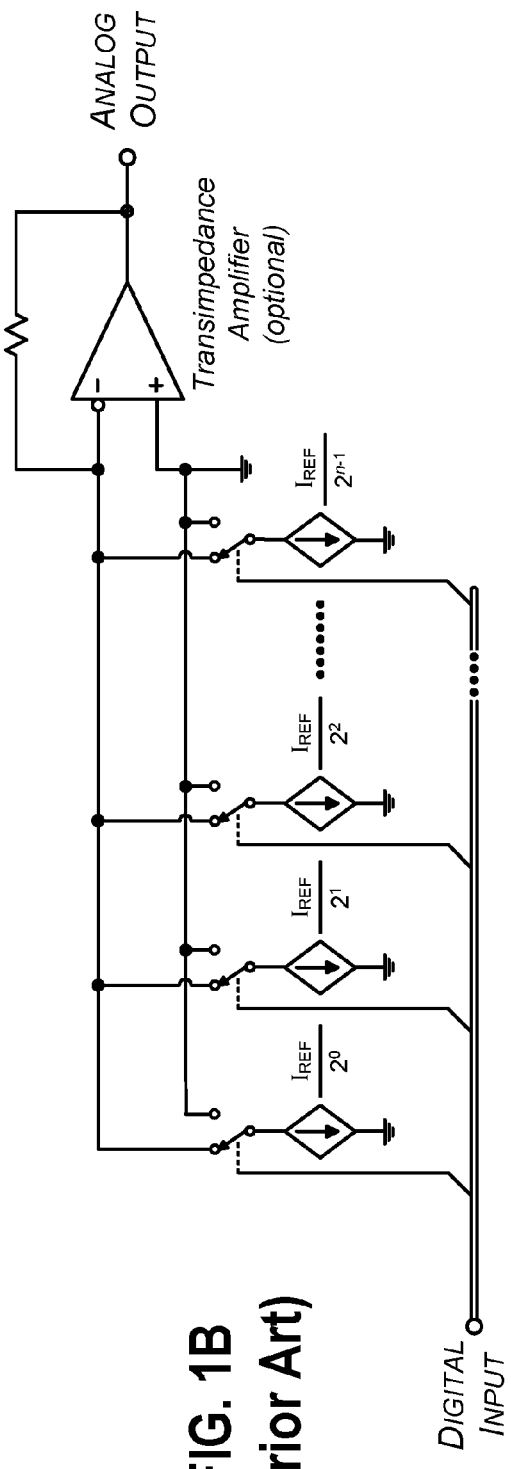
FIG. 1B is a block diagram of a conventional DAC that converts binary-weighted digital inputs to binary-weighted voltage outputs using switched current sources and a transimpedance amplifier.
Figure 2A:
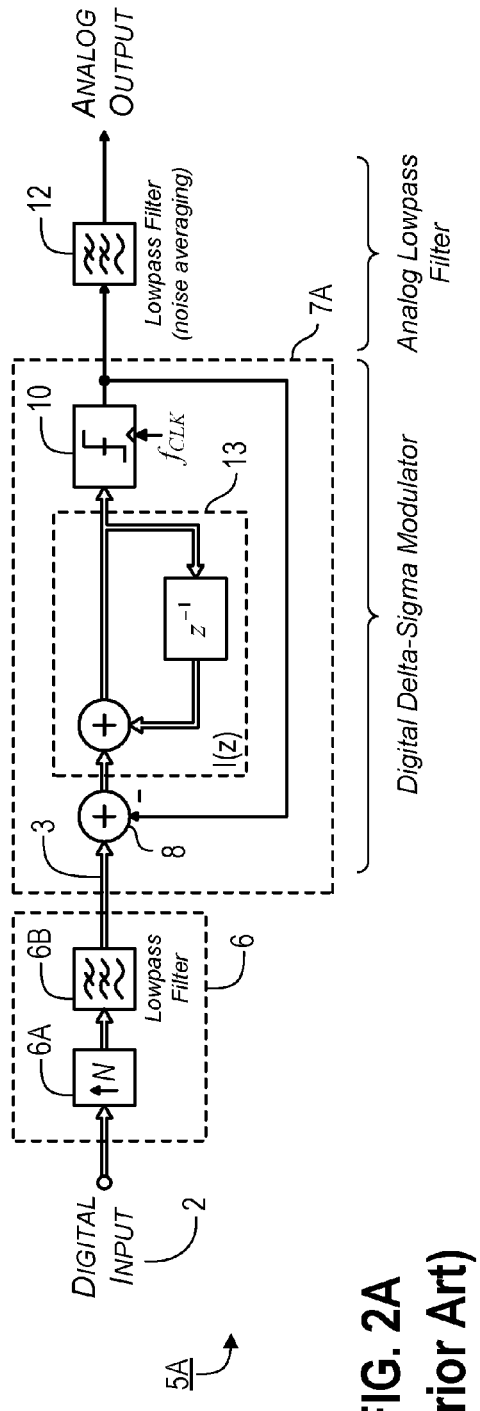
FIG. 2A is a block diagram of a conventional lowpass oversampling converter having an interpolative delta-sigma modulator with a first-order response and two-level quantization.
Figure 2B:
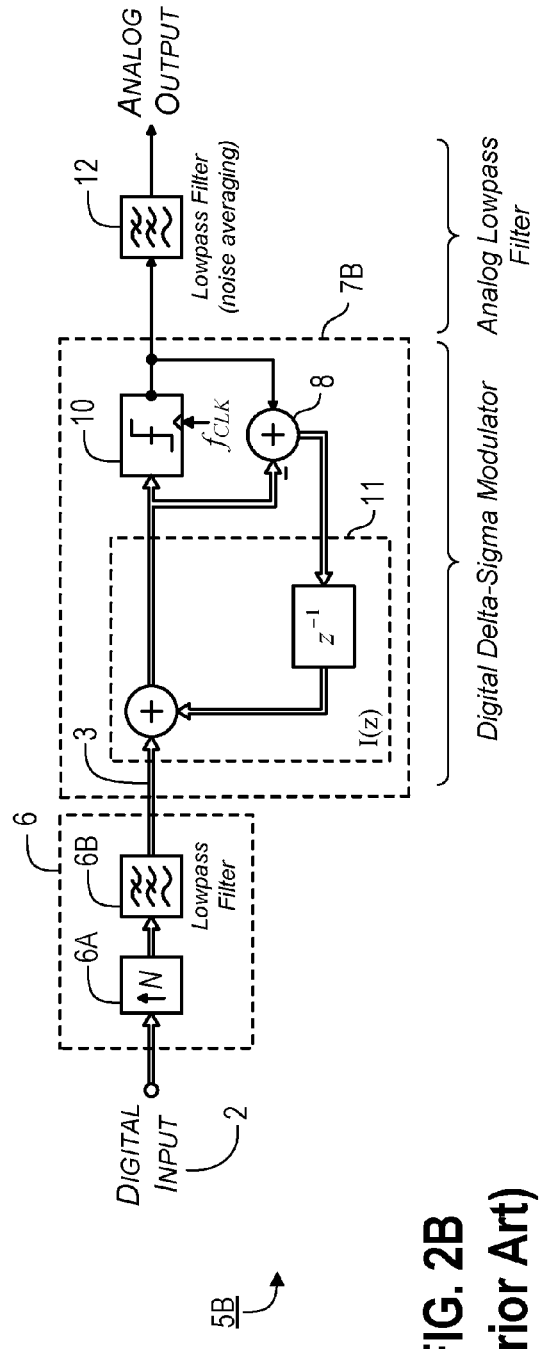
FIG. 2B is a block diagram of a conventional lowpass oversampling converter having an error-feedback delta-sigma modulator with a first-order response and two-level quantization.
Figure 2C:
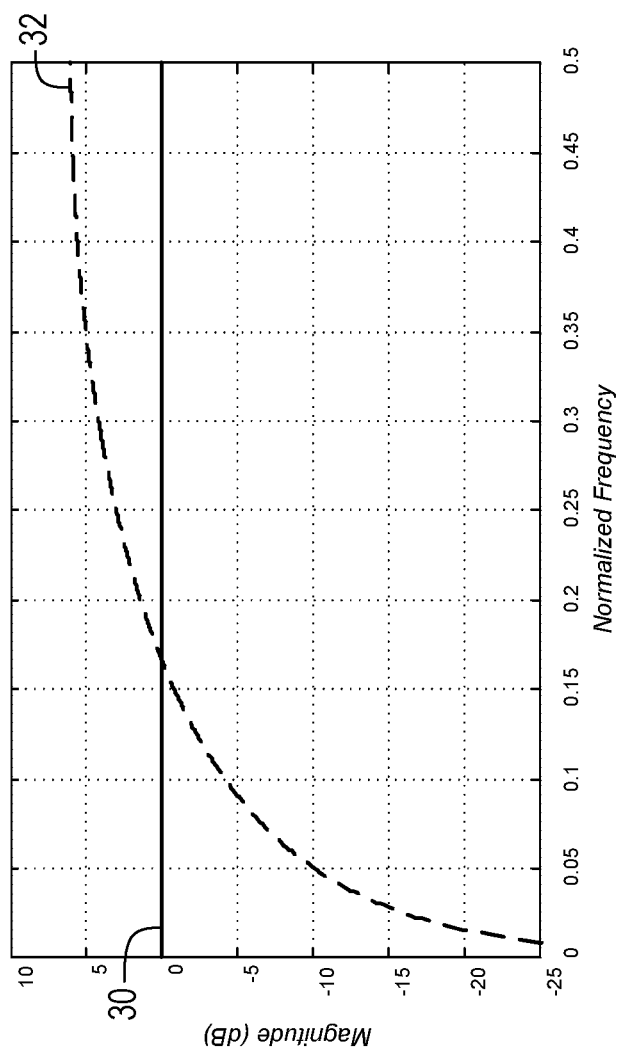
FIG. 2C illustrates the signal transfer function (STF) and quantization-noise transfer function (NTF) for a conventional, first-order, lowpass delta-sigma modulator.
Figure 2D:
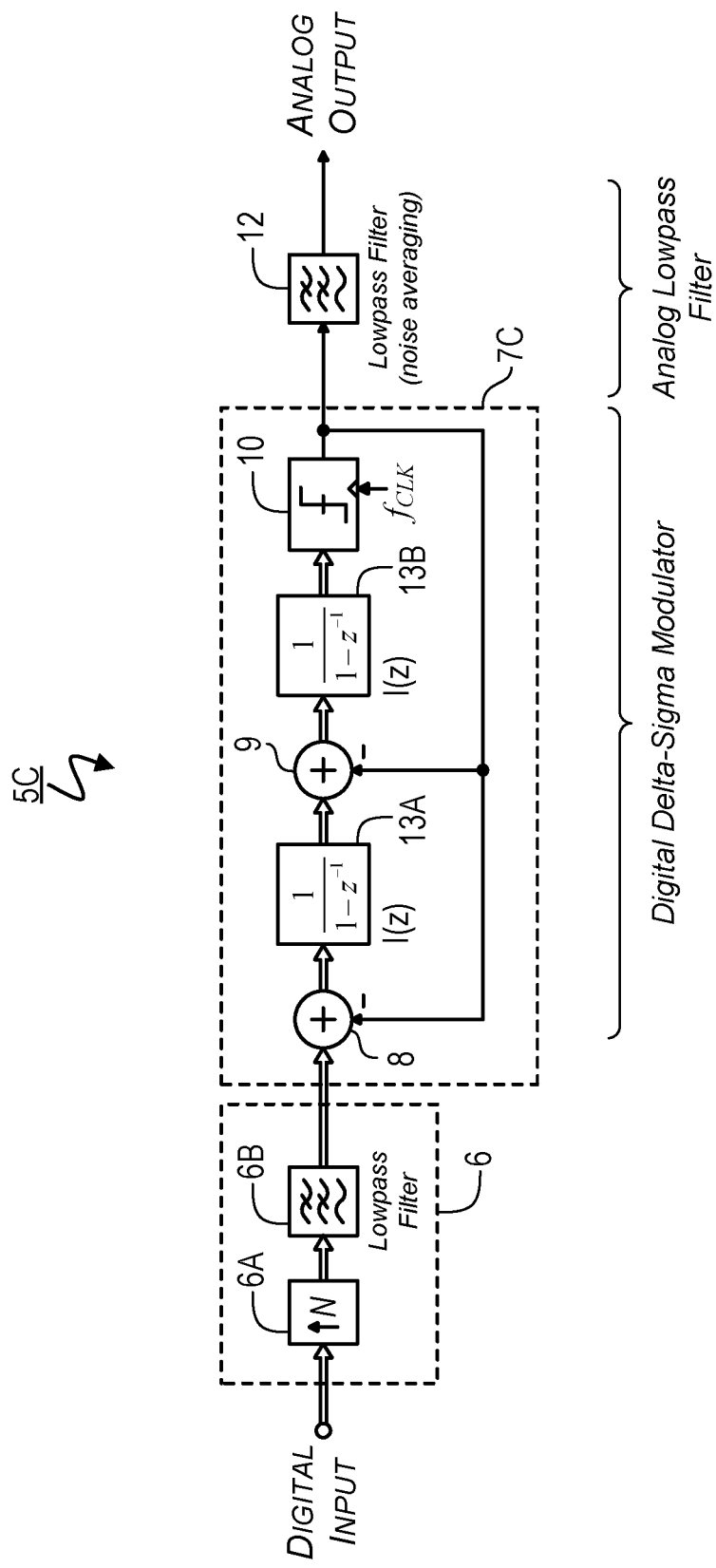
FIG. 2D is a block diagram of a conventional lowpass oversampling converter having an interpolative delta-sigma modulator with a second-order response and two-level quantization.

In a manner somewhat comparable to conventional, oversampling digital-to-analog (D/A) converters, a preferred discrete-to-linear converter according to the present invention employs a form of "oversampling" (as that term is broadly used herein) in conjunction with noise-shaped quantization to mitigate the resolution-degrading effects of coarse quantization, rounding errors (i.e., distortion), and thermal noise. However, a converter according to the preferred embodiments of the present invention incorporates one or more of the following technological innovations to improve instantaneous bandwidth and resolution: 1) multiple oversampling converters (e.g., each processing a different frequency band) are operated in parallel to overcome the bandwidth limitations of conventional oversampling converters; 2) multirate (i.e., polyphase) delta-sigma modulators (preferably second-order or higher) are used in place of conventional delta-sigma (ΔΣ) modulators, or conventional time-interleaved ΔΣ modulators, so that the effective oversampling ratio of the modulator is not strictly dependent on the modulator clocking frequency $f_{CLK}$ (or the switching/sampling speed of digital modulator circuits); 3) multi-bit quantizers are used in conjunction with multi-bit-to-variable-level signal converters, such as resistor ladder networks or current source networks, to allow stable operation with noise-shaped responses that are higher than second-order; 4) nonlinear bit-mapping is used to compensate for mismatches (rounding errors) in the multi-bit-to-variable-level signal converters (e.g., by replicating such mismatches so that the resulting distortion is shaped into a frequently range where it will be attenuated by a corresponding bandpass filter); 5) multi-band (e.g., programmable NTF response) delta-sigma modulators are used in place of single-band (i.e., fixed NTF response) delta-sigma modulators to enable a single modulator circuit to be configured for operation on arbitrary frequency bands; and 6) a digital pre-distortion linearizer (DPL) is used so that an analog signal reconstruction filter bank, based on standard analog filter structures of low order, can effectively attenuate conversion noise and errors without introducing appreciable amplitude and phase distortion. Certain combinations of such techniques are sometimes is referred to herein as Multi-Channel Bandpass Oversampling (MBO). An MBO converter can in some respects be thought of as comprising unique and novel methods of combining two distinct conventional techniques: 1) continuous-time, bandpass oversampling; and 2) multi-channel, frequency-decomposition. As discussed in more detail below, the use of such techniques often can overcome the problems of limited conversion resolution and precision at very high instantaneous bandwidths.

Simplified block diagrams of converters 110A&B and 200A-C according to certain preferred embodiments of the present invention are illustrated in FIGS. 6A-E, respectively. Converter circuits 110A&B preferably operate on the principle of oversampling with noise-shaped quantization, using feedback and coarse rounding/truncation to convert each sample of digital input signal 102 into low-resolution, pseudorandom output sequence 135 (i.e., analog signal), which has a mean level that is proportional to the binary value represented by digital input 102. According to the representative embodiment of converter 110A, and as discussed in greater detail below, input signal 102 is provided to discrete-time noise-shaping/quantization circuit 112A via demultiplexer 107A, which distributes the input signal samples to the multiple, parallel processing paths comprising noise-shaping/quantization circuit 112A. As used herein, the term "distributes", or any other form of the word, is intended to mean provides, either through direct connection or through one or more other processing blocks, e.g., for the purpose of preprocessing. In certain representative embodiments of the invention, demultiplexer 107A receives a high-rate input signal in parallel format (i.e., receives an input signal on multiple, parallel inputs), and directly provides the input signal to multiple, parallel outputs. In other representative embodiments, demultiplexer 107A receives a high-rate input signal in serial format, and converts the input signal into a parallel format, such that: 1) the high-rate input signal samples appear sequentially on multiple, parallel outputs; 2) each parallel output operates at a lower sampling (i.e., subsampling) rate than the input line. In still other representative embodiments, demultiplexer 107A receives a Nyquist-rate input signal, in serial or parallel format, and replicates each input sample by the number of parallel outputs, such that: 1) a replica of the input signal appears on each parallel output; and 2) the sampling rate of the input signal increases by a factor equal to the number of parallel outputs (i.e., demultiplexer 107A performs sample rate conversion which increases the effective sampling rate). In the representative embodiment of circuit 110A, demultiplexer 107A has a number of parallel outputs equal to m, and discrete-time noise-shaping/quantization circuit 112A has a corresponding number of parallel processing paths. But in other embodiments, the number of parallel processing paths may be different from m.

In any event, parallel outputs 108A of demultiplexer 107A (i.e., signals $x_{m-1} \ldots x_0$) are coupled to the parallel inputs of discrete-time noise-shaping/quantization circuit 112A, which processes demultiplexer outputs 108A using parallel paths (e.g., $\Delta\Sigma$ processing paths 105A-C) to produce low-resolution, noise-shaped outputs 108B (i.e., signals $y_{m-1} \ldots y_0$). Outputs 108B of parallel processing paths 105A-C are fed back as inputs to the parallel paths, and are also coupled to the parallel inputs of multiplexer 107B. Multiplexer 107B, in conjunction with multi-bit-to-variable-level converter 113A (e.g., a resistor ladder network or current source network), combines parallel outputs 108B of discrete-time noise-shaping/quantization circuit 112A, to produce a serial output signal (i.e., analog output signal 109B) which reflects coarse quantization and a high effective sampling rate. High-rate, analog output 109B is then coupled to bandpass filter 115, which in addition to smoothing the output of multi-bit-to-variable-level converter 113A, attenuates the shaped quantization noise at the outputs of $\Delta\Sigma$ processing paths 105A-C. The parallel operation of discrete-time noise-shaping/quantization circuit 112A is based on polyphase decomposition, except that unlike conventional approaches where only a portion (i.e., only the integrator or loop filter) of a $\Delta\Sigma$ modulator is decomposed, race conditions are eliminated by preferably decomposing the entire noise-shaping/quantization circuit into a polyphase structure, using the means described in greater detail in the Noise-Shaping and Quantizing Considerations section below. Generally speaking, the outputs of parallel paths are fed back into the inputs of parallel paths, with subsequent preprocessing ensuring that the mean level of high-rate, coarsely-quantized output 109B, is proportional to the value of digital signal 102 (i.e., the signal input on line 103). Through such preprocessing, the residual quantization noise at the output of the noise-shaping/quantization circuit is shifted away (i.e., noise-shaped) from the frequency band occupied by digital input signal. As used herein, the term "coupled", or any other form of the word, is intended to mean either directly connected or connected through one or more other processing blocks, e.g., for the purpose of preprocessing.

It should be noted that converter 110A (shown in FIG. 6A) may represent an entire converter circuit, or alternatively, may represent a processing branch contained within a larger parallel system (e.g., a system with M parallel processing branches), where each such processing branch operates on a portion of the frequency band associated with the input signal. It should be noted further that in embodiments where demultiplexer 107A performs sample rate conversion, methods other than the replication of the input samples (i.e., other than a zero-order hold function) may be utilized and should be considered within the scope of the present invention, including methods based on conventional interpolation filters (e.g., see for example Pham 2008). Sample rate conversion using adaptive (dynamic) interpolation filters should also be considered within the scope of the present invention, including those which utilize sampling error estimators in conjunction with polynomial interpolators (e.g., modified Farrow structures), to perform digital resampling and mitigation of performance degradations caused by variations in a sampling rate (i.e., sampling jitter). Such use of adaptive interpolation filters to mitigate the performance degradations caused by sampling jitter are described in U.S. patent application Ser. No. 14/056,917, titled "Apparatuses and Methods for Linear-to-Discrete Quantization Conversion with Reduced Sampling Variation Errors", which is incorporated by reference herein as though set forth herein in full. See also Farrow, C. W., "A Continuously Variable Digital Delay Element", IEEE International Symposium on Circuits and Systems, 1988.

In the preferred embodiments of the invention, the noise-shaping/quantization circuit (e.g., circuit 112A) utilizes $\Delta\Sigma$ modulation (or other noise-shaped quantization methods) to produce NTFs with noise-shaped responses that are second-order or greater. And when the order of the noise-shaped response is greater than two, multi-bit quantizers (e.g., quantizer 114 shown in FIG. 6B) preferably are utilized to ensure modulator stability. According to the representative embodiment of converter 110B, illustrated in FIG. 6B, the distortion (differential nonlinearity) resulting from the imperfect binary scaling (i.e., rounding errors as opposed to quantization noise) within multi-bit-to-variable-level converter 113B, preferably is mitigated using a nonlinear bit-mapping operation. More specifically, rather than being fed back directly into loop filter 150, the multi-bit output 109A of quantizer 114 is first processed by nonlinear bit-mapping component 161. Nonlinear bit-mapping component 161 preferably replicates the imperfect binary scaling (i.e., nonlinearities) at the output 109B of multi-bit-to-variable-level converter 113B (e.g., an R-2R ladder or current source network), such that input 109B to bandpass filter 115 is a more precise digital representation of actual signal 109C that is fed back into the modulator loop filter 150. Feeding back a more precise digital representation (i.e., signal 109C) of the actual analog output signal (i.e., signal 109B) ensures that quantization errors in earlier samples are accurately taken into account in generating later quantized samples, and effectively subjects the nonlinearities of multi-bit-to-variable-level converter 113B to the noise-shaped response of $\Delta\Sigma$ modulator 112B.

To maximize discrete-to-linear (i.e., digital-to-analog) conversion bandwidth and resolution, multiple converters can be operated in parallel using a structure that is somewhat similar to conventional MB$\Delta\Sigma$ approaches for analog-to-digital conversion, but with key differences that will become clear below. Such a technique of operating multiple converters in parallel, with each converter processing a different portion of the frequency band occupied by the input signal, sometimes is referred to herein as Multi-Channel Bandpass Oversampling (MBO). Simplified block diagrams of MBO converters 200A-C according to the preferred embodiments of the present invention are illustrated in FIGS. 6C-E, respectively. Like conventional HFB and MB$\Delta\Sigma$ analog-to-digital converters, digital-to-analog converters 200A-C generally operate on the principle of frequency (spectral) decomposition, or frequency-interleaving, with the total bandwidth of input digital signal 102 being conceptually separated (i.e., subdivided) into multiple, smaller sub-bands, which are independently transformed (in separate processing branches) into continuous-time signals, that are then recombined in order to produce an output signal having the same bandwidth as the input signal. The word "conceptually" is used in the preceding sentence because in converter 200A, only after transformation into continuous-time signals and bandpass filtering (e.g., within filters 115 and 125) is the frequency-band separation performed. However, prior to that point, the processing is performed in anticipation of such ultimate frequency-band separation.

In certain conventional frequency-interleaved converters, such as an HFB analog-to-digital converter, each sub-converter in the interleaved array operates at a submultiple of the effective sampling rate $$\left(\text{i.e., } f_{CLK} = \frac{1}{M} \cdot f_S,\right.$$

where M is the number processing branches$\left.\right)$, due to the reduced signal bandwidth in each of the subdivided bands. In contrast, converters 200A-C according to the present invention separately processes M different frequency bands, with each band preferably operating at the effective sampling rate of $f_S$, rather than at a submultiple of the effective sampling rate. This approach results in an oversampling ratio of M, sometimes referred to herein as an "interleaved oversampling ratio" or "interleave factor". It should be noted that the interleave factor M is different from the excess-rate oversampling ratio N of a conventional oversampling converter, but generally has the same or similar effect on conversion noise and errors. It is noted that, except to the extent specifically indicated to the contrary, the term "oversampling" is used herein in a broad sense, referring to processing techniques in which a signal, or some portion of the signal, is digitally represented during some intermediate stage at a higher sampling rate (but typically at a lower resolution) than the signal, or portion thereof, that ultimately is output. In the preferred embodiments of the present invention, input digital signal 102 is processed in different channels or branches (e.g., branches 110 and 120), the purpose of each being to convert a different frequency band. It is noted that each such processing branch could be implemented, e.g., using either of the structures shown in FIG. 6A or FIG. 6B, and all references herein to branch 110 or other processing branches encompass either such embodiment, as well as any other embodiment contemplated herein. The outputs of all such channels or branches 110 and 120 are combined to provide final output signal 135. As discussed in greater detail below, each channel or branch operates at an effective sampling rate which is higher than twice the bandwidth of the frequency band that is processed, thereby resulting in a condition of oversampling.

Referring to FIG. 6C, converter 200A processes input digital (discrete-time) signal 102 as M different frequency bands, using a separate branch (e.g., branch 110 or 120) to process each such band, and then sums up all the branch outputs in adder 131 in order to provide a final output signal (e.g., analog signal 135). In one embodiment of the invention, the M different frequency bands are orthogonal, or at least approximately orthogonal, with respect to an output data rate of overall converter 200A. More specifically, signal 102 (typically multi-bit) is input on line 103 that could be implemented, e.g., as a physical port for accepting a multi-bit external signal or as internal wires, conductive traces or a similar conductive paths for receiving a multi-bit signal from another circuit within the same device.

In the present embodiment of converter 200A, the samples of input digital signal 102 are first coupled, or distributed, to M different branches (e.g., branches 110 and 120), each processing a different frequency band and each preferably including: 1) a discrete-time noise-shaping/quantization circuit (e.g., noise-shaped quantizer 112 or 122); 2) a multi-bit-to-variable-level signal converter, such as resistor ladder network 113B; and 3) a bandpass (signal reconstruction) filter (e.g., filter 115 or 125). Lastly, adder 131 sums the outputs of these M branches (more specifically, the outputs of the signal reconstruction filters) to produce final output signal 135. As used herein, the term "distributes", or any other form of the word, is intended to mean provides, either through direct connection or through one or more other processing blocks, e.g., for the purpose of preprocessing. Rather than replicating the finite impulse response (FIR) of the relatively high-order, transversal window filters (e.g., Hann, Hamming, etc.) used in conventional MB$\Delta\Sigma$ schemes, each of the bandpass filters (e.g., filter 115 and 125) at the output of a processing branch preferably is a relatively low-order filter (i.e., order of 7-10 or less) with a standard analog filter response, such as a Butterworth, Chebychev, Bessel or coupled-resonator response. Particularly at high frequency (e.g., gigahertz frequencies), these standard analog filter responses can be realized as passive structures without excessive circuit complexity. The center frequency, bandwidth, and/or order of the filters in each of the multiple processing branches preferably are independently adjusted to minimize the amplitude and group delay distortion introduced by all the filter responses in combination (i.e., the amplitude and group delay distortion introduced by imperfect signal reconstruction). Preferably, the filter responses are adjusted to produce amplitude variation of less than ±1.5 dB and group delay variation of less than ±12.5 periods of the effective sampling rate $f_S$. Often, for ease of reference, the following discussion refers only to the components of branch 110, it being understood that similar processing preferably occurs in each of the other branches (e.g., branch 120).

Similar processing to that described above occurs within converters 200B&C of FIGS. 6D&E, respectively, except that in the present embodiments of converters 200B&C, the samples of input digital signal 102 are first coupled to digital pre-distortion linearizer (DPL) 104A or 104B. The DPL (e.g., DPLs 104A&B) preferably does not divide the input signal into narrowband segments (i.e., frequency decomposition). However, one function of the DPL preferably is to expand input signal 102 into a sufficiently long word length for further processing (e.g., up to 16 bits). The output of the DPL is distributed to M different branches (e.g., branch 110 and 120), each processing a different frequency band and each preferably including: 1) a discrete-time noise-shaping/quantization circuit (e.g., noise-shaped quantizer 112 or 122); 2) a multi-bit-to-variable-level signal converter, such as resistor ladder network 113B; and 3) a bandpass (signal reconstruction) filter (e.g., filter 115 or 125). Lastly, adder 131 sums the outputs of these M branches (more specifically, the outputs of the signal reconstruction filters) to produce final output signal 135. Compared to converter 200B, multi-bit-to-variable level converter 113C in each of the processing branches of converter 200C incorporates a driver/power amplifier to boost the level of the analog signal prior to bandpass filtering. The primary purpose of the DPL (e.g., DPLs 104A&B) is to compensate for amplitude and group delay (phase) distortion introduced by imperfections in the analog reconstruction filter bank (i.e., bandpass filters 115 and 125 and the bandpass filters in each of the other branches). In the embodiment shown in FIG. 6D, DPL 104A is a static (fixed-coefficient, fixed-parameter or non-variable) filter. However, in alternate embodiments, such as converter 200C of FIG. 6E, DPL 104B is an adaptive filter that compensates for variations in the responses of the bandpass filters (e.g., filters 115 and 125) that occur, for example, with temperature changes. The adaptation of DPL 104B, which can be based on a conventional algorithm, such as the constant modulus adaptation algorithm, is implemented by processing block 144A and preferably forces output signal 135 of the data converter to have a particular characteristic (e.g., such as a constant envelope, on average, for constant modulus adaptation). More generally, as discussed in greater detail below, the adaptation algorithm implemented by processing block 144A preferably uses the amplitude and phase characteristics of output signal 135, converted to a digital signal, to generate control signal 156 that adjusts the response of DPL 104B to account for variations in the bandpass filter response.

Although the representative embodiments described above and illustrated in FIGS. 6C-E incorporate a noise-shaping/quantization circuit (e.g., 112 and 122), alternate embodiments use a quantizer without a noise-shaped response (i.e., quantization with a noise-shaped response that is zero-order). That is, converters that do not employ a noise-shaped response should be considered within the scope of the present invention. Also, in the representative embodiments shown in FIGS. 6A-E each discrete-time noise-shaping/quantization circuit (e.g., circuits 112A&B which are collectively referred to as circuit 112 herein) has a multi-bit output (e.g., 3 to 8 bits), but use of discrete-time noise-shaping/quantization circuits which instead have a single-bit output is within the scope of the present invention.

In any event, each such noise-shaping/quantization circuit 112 preferably reduces the word length (and, correspondingly, the resolution) of its input signal so it is possible to use a less-complex resistor ladder network (e.g., ladder network 113B or other structure for conversion to a single multi-level continuous-time signal).

The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion. The term "bandpass", as used herein, refers to a filter or other circuit that provides higher gain for a desired band of frequencies as compared to other frequencies within the input signal, where the desired band could be centered at zero (in which case it could be referred to as a lowpass filter) or at any other frequency.

Furthermore, in the present embodiments, the typically multi-bit output of each noise-shaping/quantization circuit 112 is converted into a single variable-level signal, which, via a resistor ladder network (e.g., R-2R network 113B), switches among a fixed number of discrete levels when the output of the corresponding noise-shaping/quantization circuit 112 changes. However, other multi-bit-to-variable-level signal converters known in the art, such as binary-weighted or unitary-weighted current sources, instead may be used. Also, as in converter 200C shown FIG. 6E, multi-bit-to-variable-level signal converters 113C which incorporate buffer amplifiers or power amplifiers to boost the signal level at the output of the converter should be considered within the scope of the present invention. In FIG. 6E, an analog amplifier is shown coupled to the output of the resistor ladder network; alternatively, multiple digital amplifiers could be coupled to the input of the resistor ladder network. A multi-bit-to-variable-level signal converter, as referred to herein, could be implemented as converter 113A-C, or any of the other variations discussed herein. Finally, the M channels preferably are combined in adder 131 using summing resistors, but in alternate embodiments any of various other (e.g., other conventional) analog adders, including passive and/or active signal combining structures, instead may be used.

In accordance with one aspect of certain preferred embodiments, the present invention overcomes the problems of limited conversion resolution and precision at high instantaneous bandwidths via a novel method of combining two established techniques—bandpass oversampling and a variant of frequency interleaving. By combining multiple bandpass noise-shaped channels in parallel, such that each noise-shaping/quantization circuit minimizes conversion noise in a particular region of the converter's Nyquist bandwidth, the present invention can provide a frequency interleaved or time-interleaved converter simultaneously having high resolution and high instantaneous bandwidth.

Noise-Shaping and Quantizing Considerations

Figure 3A:
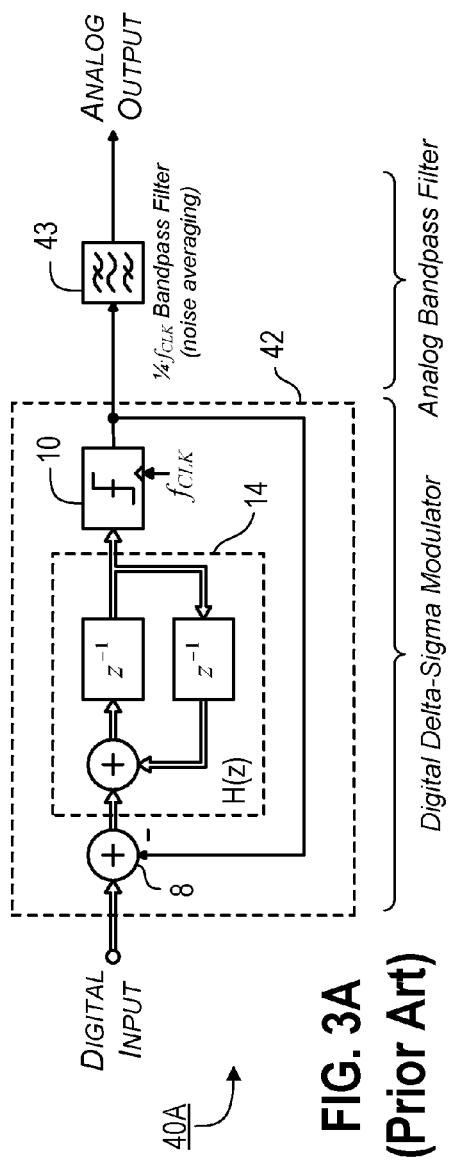
FIG. 3A is a block diagram of a single-band bandpass oversampling converter having a discrete-time, interpolative delta-sigma modulator with a second-order response and two-level quantization.
Figure 3B:
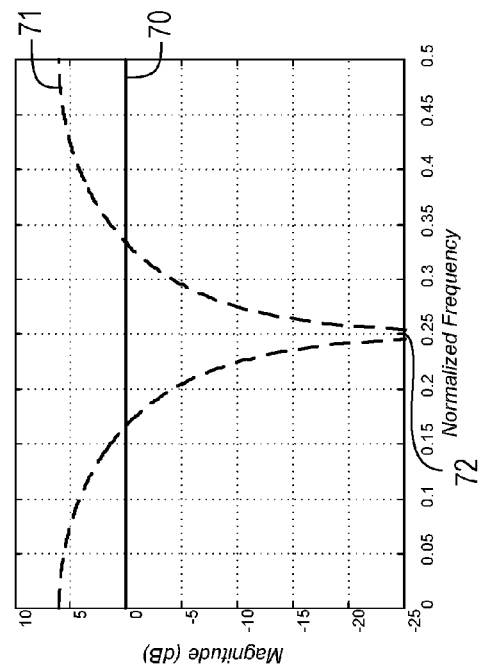
FIG. 3B illustrates the signal transfer function (STF) and quantization-noise transfer function (NTF) for the delta-sigma modulator of the single-band bandpass converter shown in FIG. 3A.
Figure 4A:
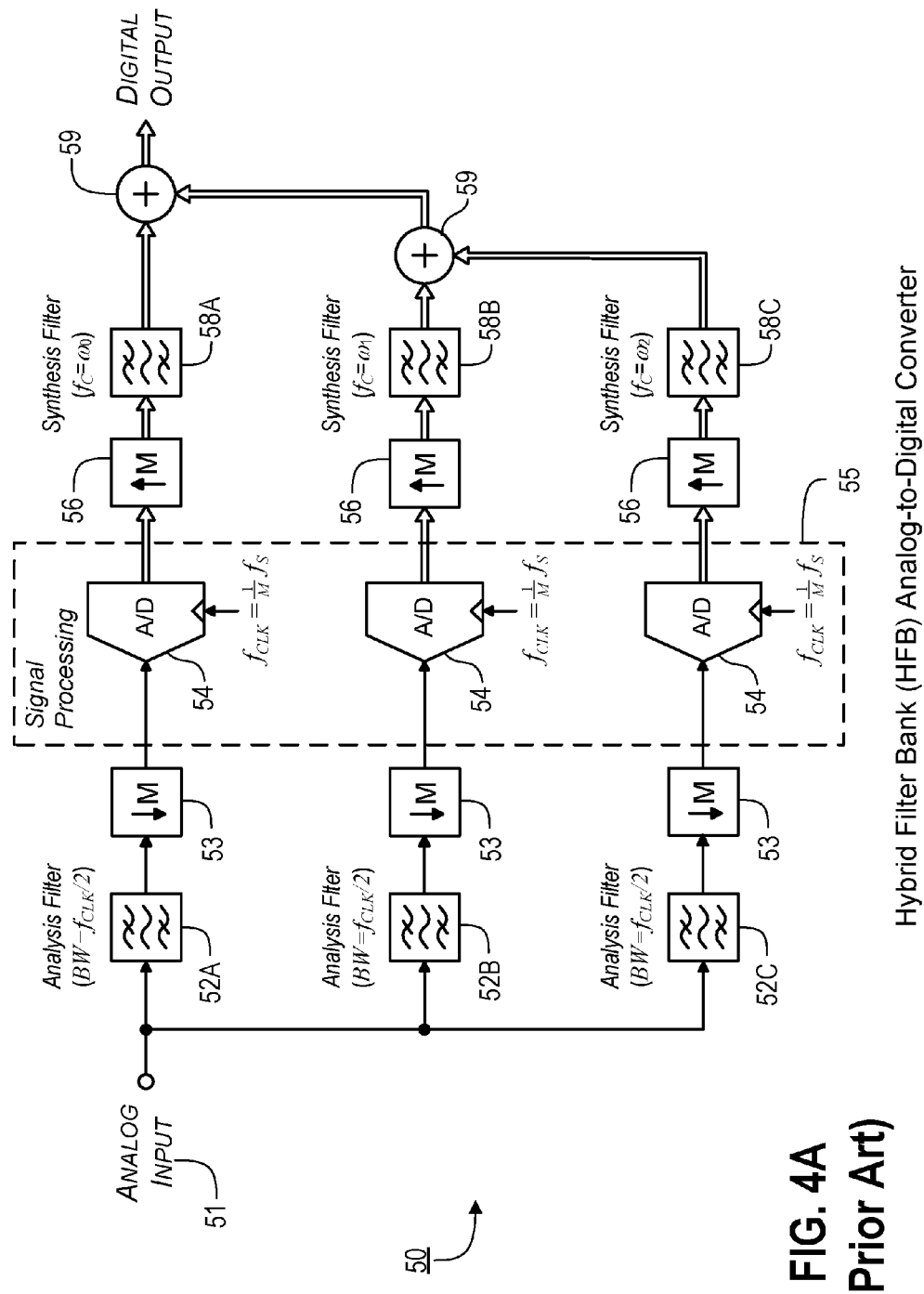
FIG. 4A is a block diagram of a conventional frequency-interleaved converter for transforming an analog signal into a digital signal, that is sometimes referred to as a hybrid filter bank (HFB) converter.
Figure 4B:
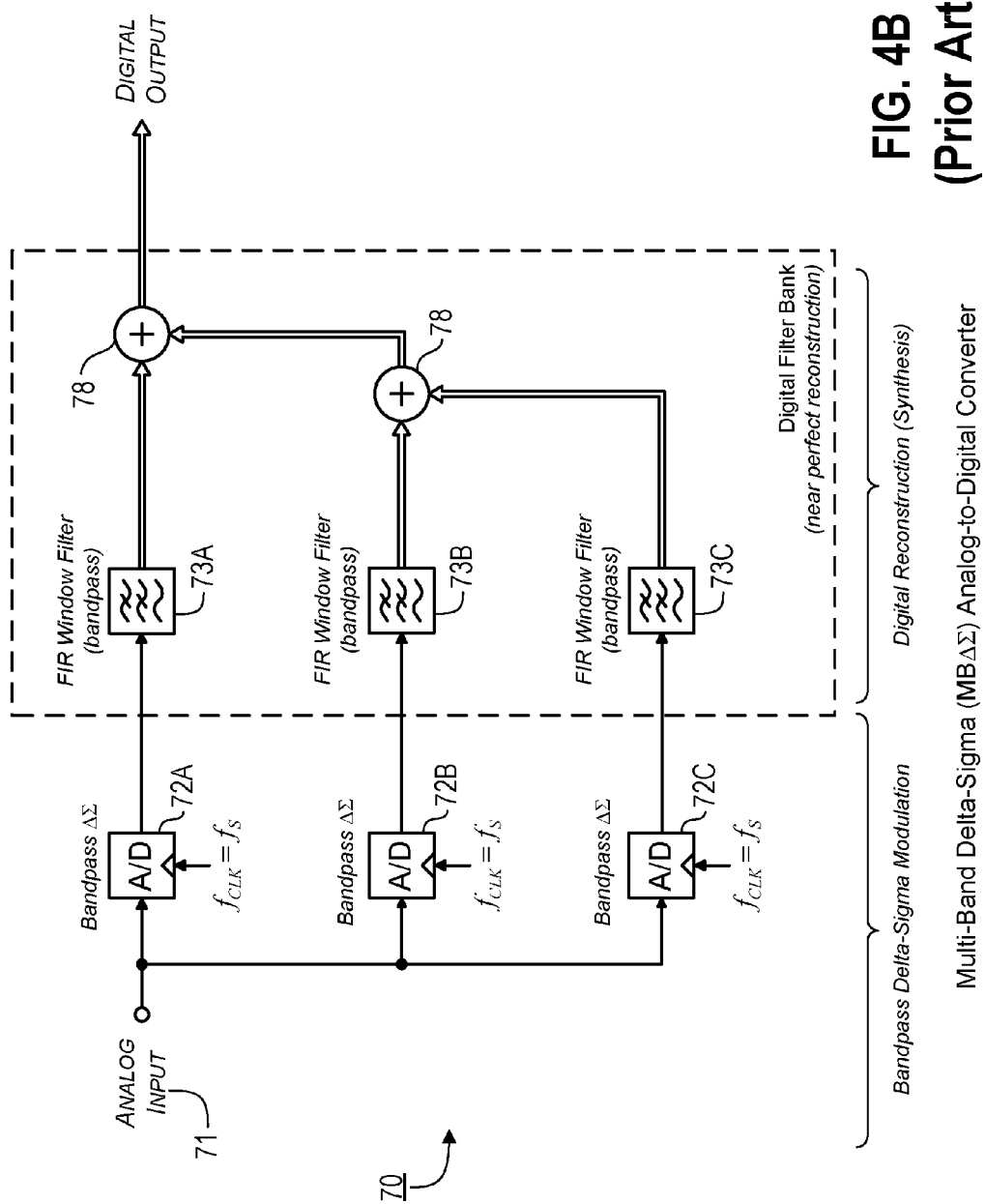
FIG. 4B is a block diagram of a conventional frequency-interleaved converter for transforming an analog signal into a digital signal, that is sometimes referred to as a multi-band delta-sigma (MBΔΣ) converter.
Figure 5A:
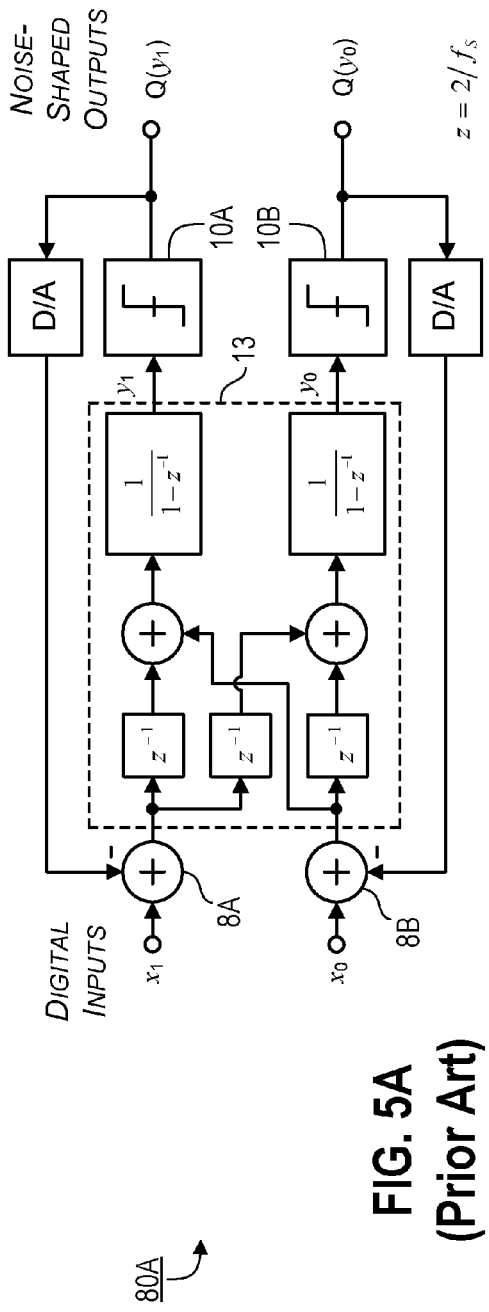
FIG. 5A is a block diagram of a conventional time-interleaved oversampling converter having an interpolative delta-sigma modulator with a first-order lowpass response and two-level quantization.
Figure 5B:
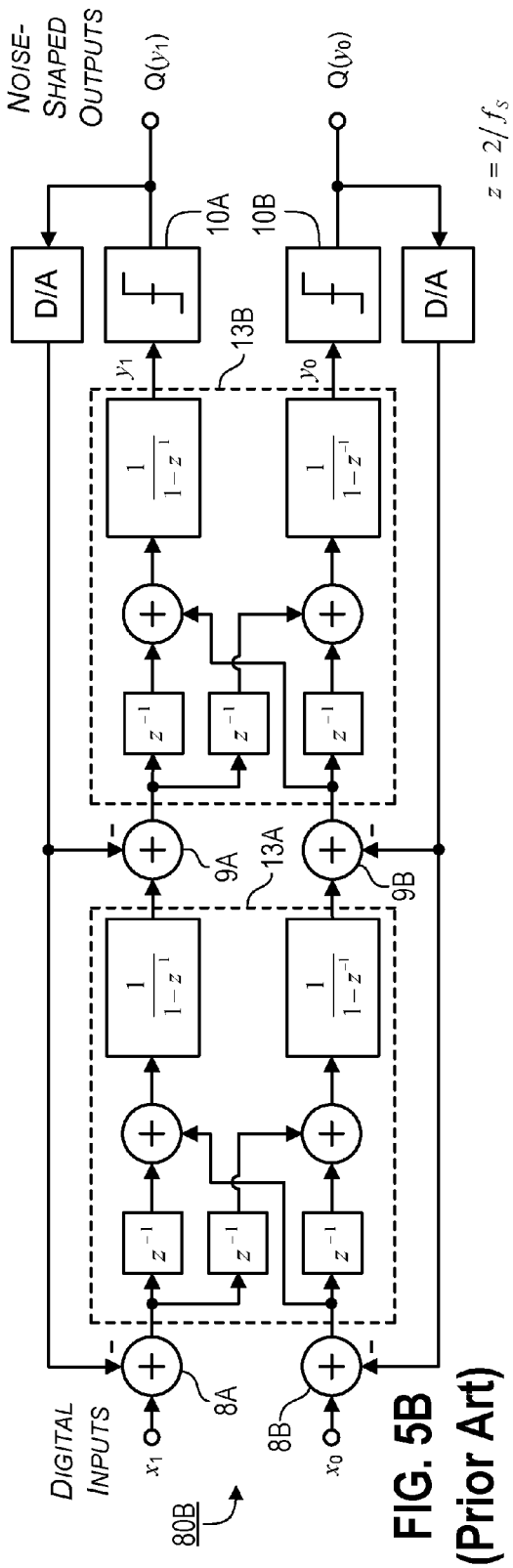
FIG. 5B is a block diagram of a conventional time-interleaved oversampling converter having an interpolative delta-sigma modulator with a second-order lowpass response and two-level quantization.
Figure 5C:
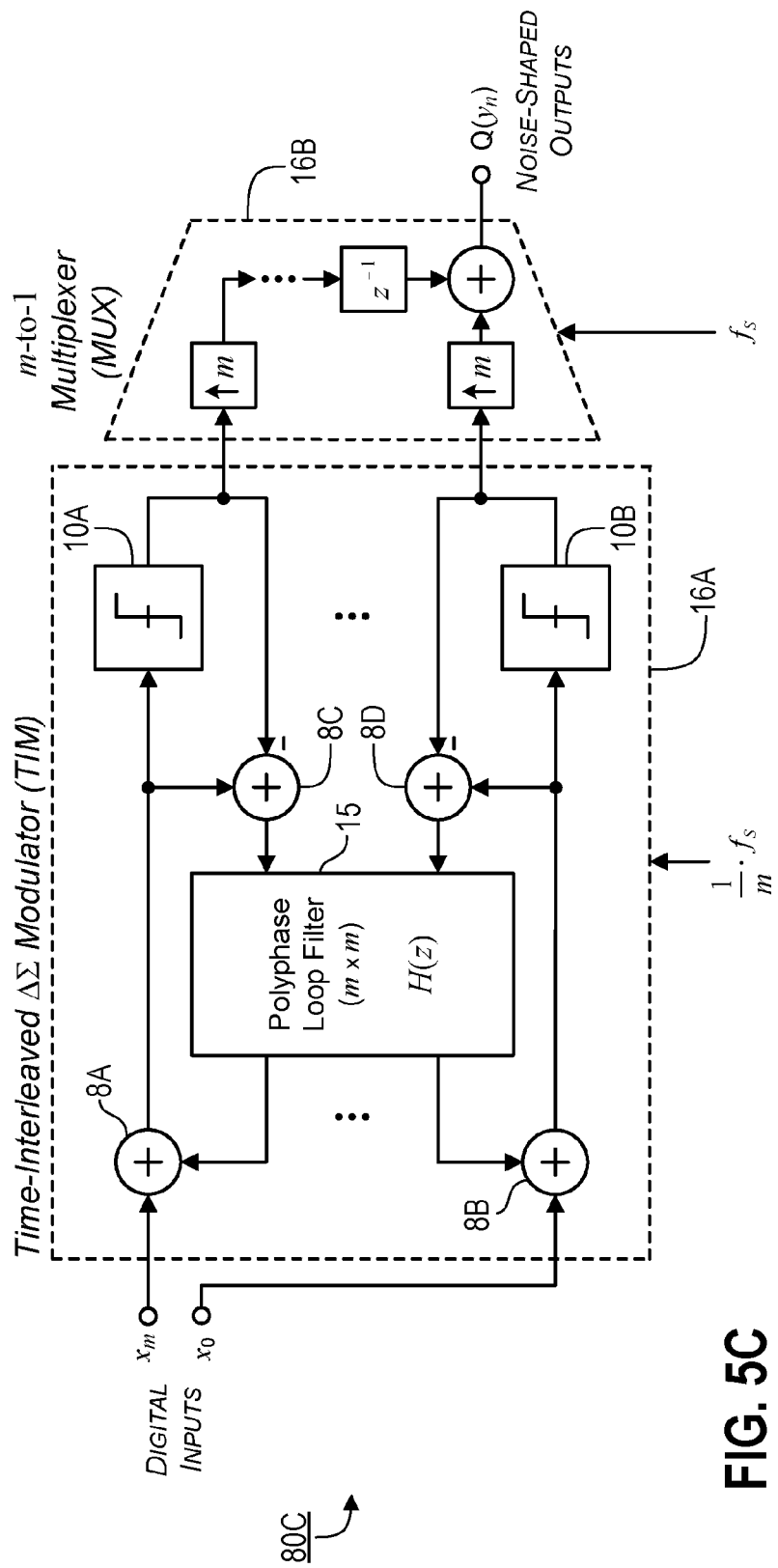
FIG. 5C is a block diagram of a conventional oversampling D/A converter that utilizes a time-interleaved ΔΣ modulator with an output multiplexer.
Figure 7A:
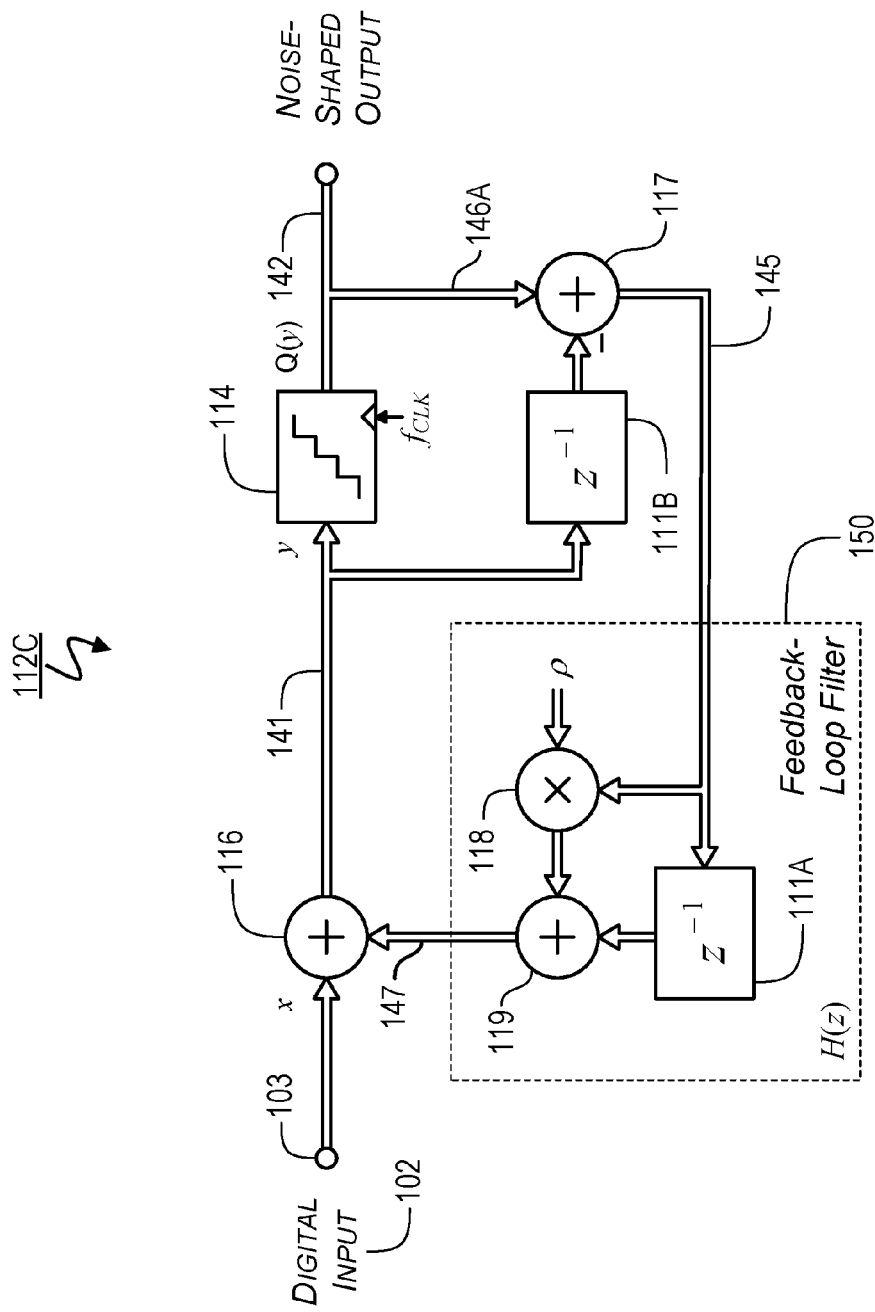
FIG. 7A is a block diagram illustrating a discrete-time noise-shaping/quantization circuit that employs a delta-sigma ($\Delta\Sigma$) modulator, with a programmable feedback-loop filter, to produce conversion noise response minima at arbitrary frequencies, according to a representative embodiment of the present invention.

In the embodiments described above, each of the noise-shaping/quantization circuits (e.g., 112 and 122) preferably is constructed differently from those shown in FIGS. 2, 3, and 5. In the preferred embodiments, a modified error-feedback structure, referred to herein as a multirate, delta-sigma ($\mu\Delta\Sigma$) modulator, is used for the noise-shaped quantization operation of circuit 112 or 122 within each processing branch 110 or 120, respectively, because such a circuit has been found to achieve the best combination of effectiveness, ease of construction, and ease of configuration. However, it should be noted that it is possible to use other kinds of noise-shaping/quantization circuits, in alternate embodiments of the invention, including: 1) full-rate delta-sigma (ΔΣ) modulators; and 2) parallel delta-sigma (ΔΣ) modulators based on interpolative structures. In any event, the primary considerations for the noise-shaping/quantization circuits to be used preferably derive from the desire for stable and accurate operation at very high sampling rates. Therefore, each noise-shaping/quantization circuit according to the preferred embodiments has one or more of the following properties: 1) the primary performance impairments of the noise-shaping/quantization circuit, such as those related to quantization/rounding errors, sampling uncertainty/jitter, and thermal noise are subject to a noise-shaped response and/or to bandlimiting; 2) the noise-shaping/quantization circuit produces stable responses with noise-shaped orders of two or greater; 3) the effective oversampling ratio of the noise-shaping/quantization circuit is not limited by race conditions, or by circuit construction, to the maximum switching frequency (i.e., clocking rate) of the constituent components; 4) the noise-shaping/quantization circuit has a signal transfer function (STF) with an all-pass (or at least approximately all-pass) response; and 5) the noise transfer function (NTF) of the noise-shaping/quantization circuit has a bandstop response, such that the null in the NTF is determined by the value of a programmable (or otherwise selectable or settable) parameter (e.g., a feedback-loop filter coefficient). As discussed in greater detail below, the noise that is subject to shaping preferably includes noise introduced by any quantization circuit that is used (e.g., quantization circuit 114 that is internal to circuit 112C and is shown in FIG. 7A), but also (or instead) can include noise introduced by other components, such as a multi-bit-to-variable-level signal converter (e.g., converter 113A-C). As used in the preceding sentence, the word "noise" can refer to actual random noise, or can refer to other impairments that degrade signal quality, such as those introduced by circuit imperfections. Achieving the above noise-shaped properties generally precludes the use of conventional delta-sigma modulators, or conventional time-interleaved delta-sigma modulators for the noise-shaping/quantization function.

Figure 7B:
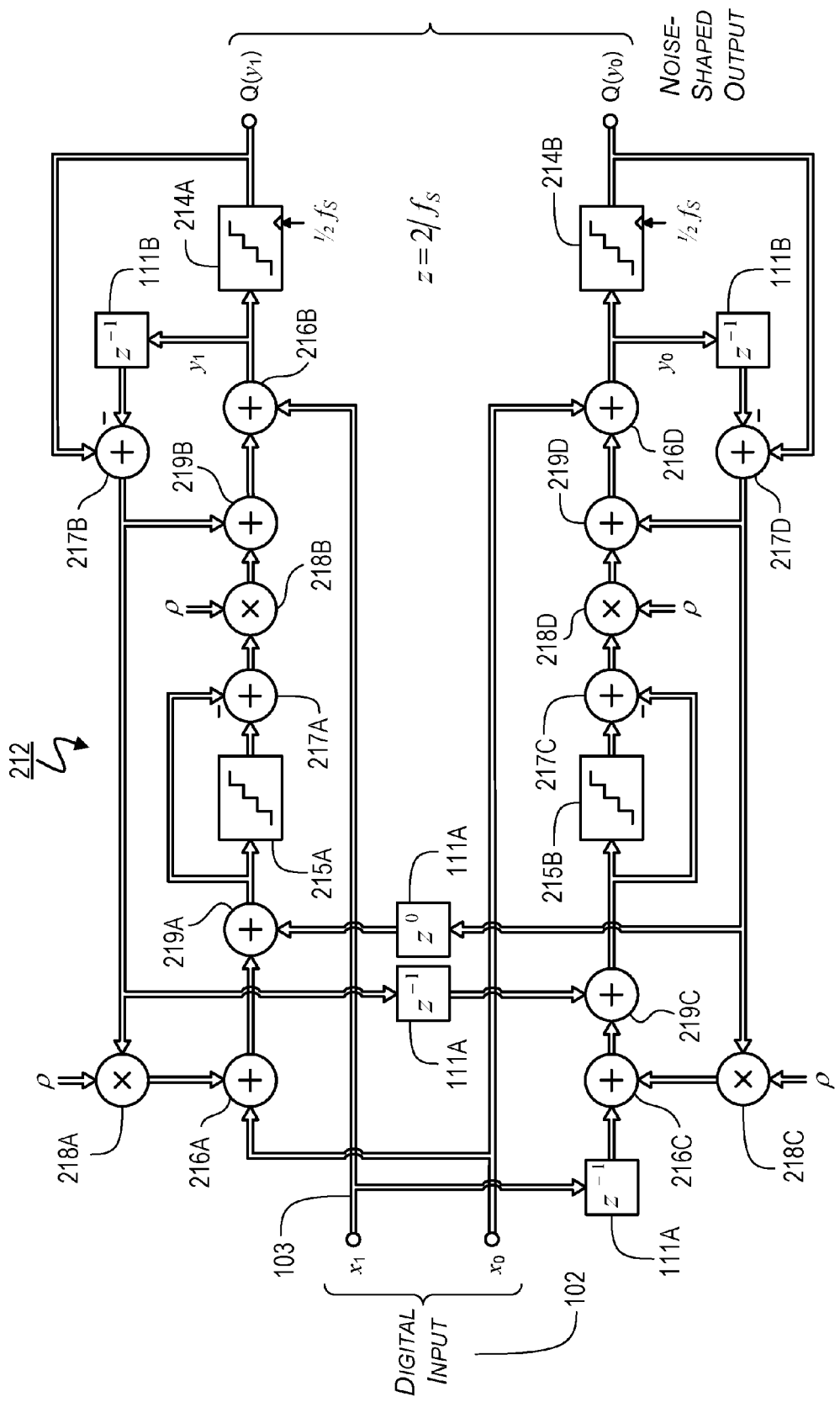
FIG. 7B is a block diagram illustrating a multirate delta-sigma ($\mu\Delta\Sigma$) modulator that has a polyphase decomposition factor m=2, according to a representative embodiment of the present invention.
Figure 7C:
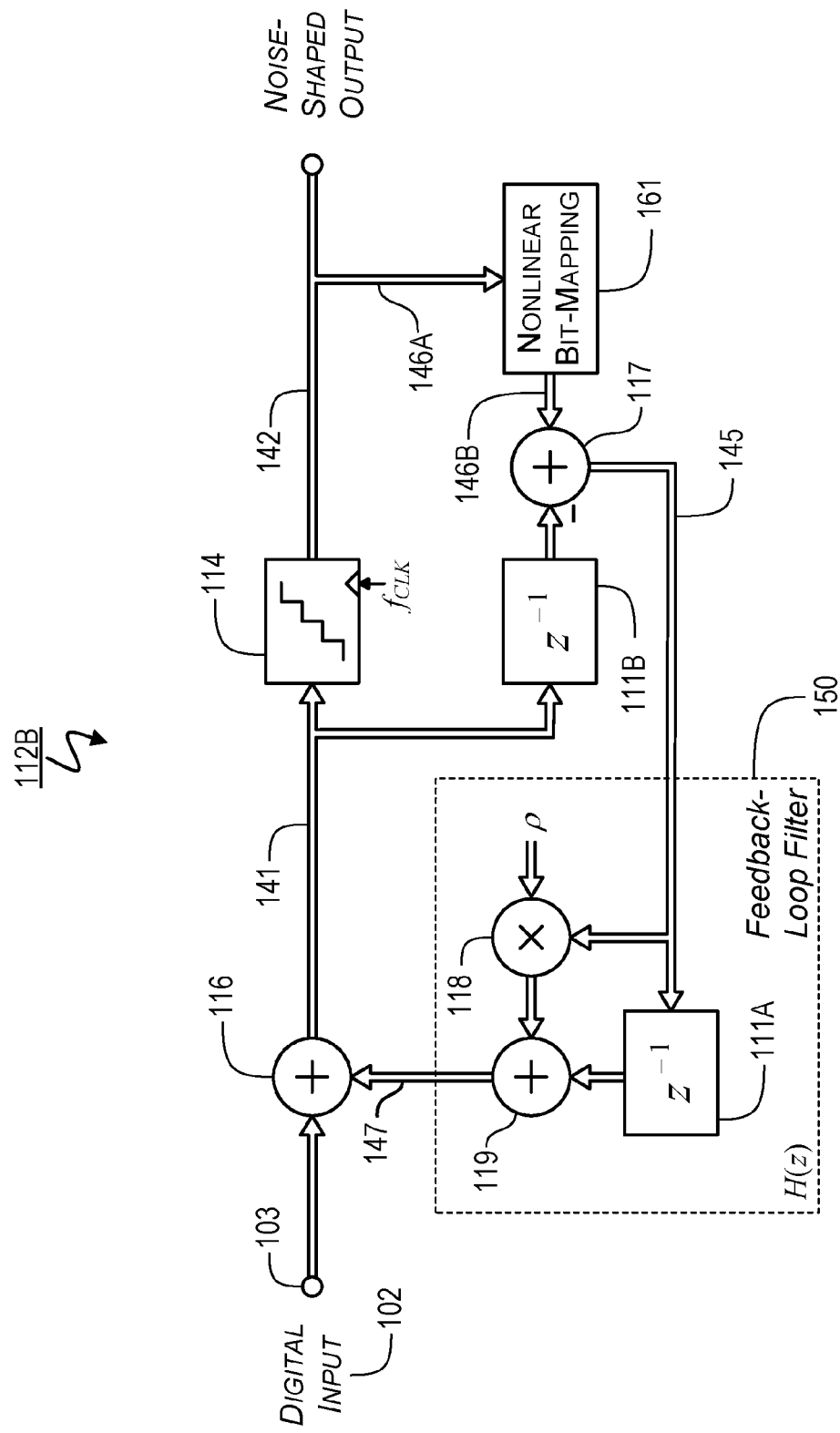
FIG. 7C is a block diagram illustrating a discrete-time noise-shaping/quantization circuit that employs a delta-sigma ($\Delta\Sigma$) modulator, with a programmable feedback-loop filter and a nonlinear bit-mapping function, according to a representative embodiment of the present invention.

A simplified block diagram of an exemplary noise-shaping/quantization circuit 112C, employing a programmable feedback-loop filter (e.g., loop filter 150) in combination with a multi-bit quantization circuit (e.g., quantizer 114), is shown in FIG. 7A for a polyphase decomposition factor of m=1; and a simplified block diagram of an exemplary μΔΣ modulator (e.g., modulator 212) is shown in FIG. 7B for a polyphase decomposition factor of m=2. Circuit 112B of FIG. 7C is an alternative representative embodiment that incorporates nonlinear bit-mapping component 161 to compensate for imperfect binary scaling in the multi-bit-to-variable-level conversion of the output of quantizer 114. Generally speaking, the embodiments described herein refer to a combined (i.e., full-rate) noise-shaping/quantization circuit 112C, which is not decomposed into m parallel paths. The reason for this treatment is that, particularly when m≥2, it can be difficult to neatly separate the quantization components from the noise-shaping components. However, the functionalities of these components are in fact distinct and, particularly when m=1, it sometimes is desirable to conceptualize such components separately, e.g., as shown in FIG. 7A.

Whereas a conventional delta-sigma (ΔΣ) modulator with a clocking rate of $f_{CLK}$, is limited by race conditions (i.e., processing of outputs within one full-rate sampling cycle) and/or circuit construction to an oversampling ratio $$N = \frac{1}{2} \cdot f_{CLK} / f_B$$

(i.e., where $f_B$ equals $f_{MAX}$ for lowpass operation), the multirate delta-sigma (μΔΣ) modulators illustrated in FIGS. 7A&B have an excess-rate oversampling ratio $$N' = \frac{1}{2} \cdot m \cdot f_{CLK} / f_B,$$

where m is the polyphase decomposition factor of the μΔΣ modulator. The excess-rate oversampling ratio of μΔΣ modulator is m times greater than that of conventional time-interleaved modulators because the entire μΔΣ modulator, including its arithmetic (i.e., summation and difference) functions and quantization operations, is distributed among parallel processing paths using polyphase decomposition. In general, the circuit complexity of the μΔΣ modulator (e.g., the number of quantizers 114) increases as m². It should be noted that although the μΔΣ modulator is a parallel processing structure, a μΔΣ modulator is different from a conventional MASH (i.e., Multi-stAge SHaping) modulator, which conventionally is sometimes referred to as a "parallel" modulator. In a conventional MASH structure, full-rate ΔΣ modulators are grouped in a parallel arrangement to increase the order P of the noise-shaped response. In contrast, the parallel μΔΣ modulator architecture increases the effective oversampling ratio N', regardless of the order P of the noise-shaped response. It should further be noted that the μΔΣ modulator is different from a conventional, time-interleaved ΔΣ modulator in that polyphase decomposition is applied to the entire modulator circuit, rather than simply to the function of the loop filter. Therefore, the parallel, sub-rate (i.e., subsampling) outputs of the μΔΣ modulator are a function only of: 1) delayed samples of the input signal; and 2) previous output samples that have been delayed by a least one sub-rate delay of $m/f_S$, where m is the number of parallel μΔΣ modulator outputs (i.e., the polyphase decomposition factor is m).

In an exemplary μΔΣ modulator, as most clearly illustrated in FIG. 7A, signal 141 that is output from adder 116 and input into quantizer 114, is delayed in element 111B (e.g., by one sub-rate cycle of $f_{CLK}$) and is subtracted from signal 146A in subtractor 117. The resulting combined signal (e.g., output 145) is filtered within loop filter 150, using a filter transfer function H(z), thereby resulting in signal 147. Finally, signal 147 is combined with input signal 102 in adder 116. It can be shown that such processing shapes input signal 102 with an all-pass response, and shapes the quantization noise introduced by quantization element 114 with a second-order response. Similar processing is illustrated in FIG. 7B, although in that embodiment the μΔΣ modulator is comprised of a larger number of components in order to realize a polyphase decomposition factor of m=2. One of the key differences between the circuitry of a conventional time-interleaved ΔΣ modulator and a μΔΣ modulator, is the number of arithmetic functions (i.e., subtractors 216A-D of circuit 212 in FIG. 7B) and the number of quantization (rounding/truncation) operations (i.e., clocked quantization operations 214A&B and transparent rounding/truncation operations 215A&B of modulator 212 in FIG. 7B). In a conventional time-interleaved ΔΣ modulator, the arithmetic functions (e.g., subtractors 8A&B in FIGS. 5A&B) and quantization operations (e.g., quantizers 10A&B in FIGS. 5A&B) are simply replicated and distributed among the m parallel processing paths. As a result, a conventional time-interleaved ΔΣ modulator with a polyphase decomposition factor of m=2, contains m=2 difference functions (i.e., subtractors 8A&B in FIGS. 5A&B) and m=2 quantization operations (i.e., quantization operations 10A&B in FIG. 5A&B). In contrast, the difference functions (i.e., subtractor 116 in FIG. 7A) and quantization operations (i.e., clocked quantizer 114 in FIG. 7A) of the µΔΣ modulator are subjected to polyphase decomposition; and for a µΔΣ modulator with a polyphase decomposition factor of m=2, such as µΔΣ modulator 212 in FIG. 7B, this results in m²=4 difference functions (i.e., subtractors 216A-D) and m²=4 quantization operations (i.e., clocked quantizers 214A&B and transparent rounding/truncation operations 215A&B). Therefore, compared to a conventional full-rate ΔΣ modulator and a conventional time-interleaved ΔΣ modulator, the µΔΣ modulator 212 in FIG. 7B avoids race conditions and can: 1) operate at clocking rate equal to one-half the effective sampling rate $$\left(\text{i.e., } f_{CLK} = \frac{1}{2} \cdot f_S\right)$$

for the same oversampling ratio N; or 2) can achieve twice the oversampling ratio (i.e., 2·N) for the same clocking rate of $f_{CLK}$.

Generally speaking, in reference to converter 112C of FIG. 7A, the addition of correction signal 147 to input signal 102 ensures that future quantizer output samples 142 on average will compensate for earlier quantization errors, while the preprocessing of the quantization error prior to such addition ensures that the quantization noise introduced by quantizer 114, will be shifted away from the passband of a particular processing branch (e.g., the passband of the reconstruction filter associated with branch 110 or 120). Depending upon the value of the feedback-loop filter parameter, ρ, filter 150 can cause conversion noise to be shifted away from a selected (e.g., predetermined) frequency within the overall converter Nyquist bandwidth, equal to $$\frac{1}{2} \cdot m \cdot f_{CLK}.$$

Feedback-loop filter 150 of µΔΣ modulator 112C, introduces frequency-dependent delaying and frequency-dependent amplitude variation to feedback signal 145, such that the noise transfer function (NTF) of the µΔΣ modulator has a bandstop response with a null at a predetermined frequency (i.e., a frequency determined by feedback-loop filter parameter ρ). In the present embodiment, feedback-loop filter 150 uses multiplier 118, adder 119 and delay register 111A to produce a frequency response with the correct amount of frequency-dependent delaying and frequency-dependent amplitude variation. As will be readily appreciated, multiplier 118 can be replaced by a combination of shift and add components to potentially reduce feedback-loop filter complexity, especially for the case where the feedback-loop filter parameter ρ can be represented by a small number of digital bits (i.e., ρ's binary representation contains few terms). The term "adder", as used herein, is intended to refer to one or more circuits for combining two or more signals together, e.g., through arithmetic addition and/or (by simply including an inverter) through subtraction. The term "additively combine" or any variation thereof, as used herein, is intended to mean arithmetic addition or subtraction, it being understood that addition and subtraction generally are interchangeable through the use of signal inversion.

As illustrated in FIGS. 7A-C, the µΔΣ modulator preferably is implemented in conjunction with a multi-bit quantization circuit (e.g., quantization/rounding circuit 114 in FIG. 7A or quantization/rounding circuits 214A&B and 215A&B in FIG. 7B), which in reference to FIG. 7A, reduces the rounding precision (i.e., granularity or bit-width) of quantizer input 141 relative to quantizer output 142. A multi-bit quantizer, and more preferably a multi-bit quantizer having a granularity of 4 or more bits, has been found to ensure stable operation for µΔΣ modulators with a noise-shaped response of order P>2 (i.e., a shaping factor of P>2). For shaping factors of P≤2, modulator stability is not contingent on the use of multi-bit quantizers, and therefore in such embodiments, the multi-bit quantizers shown in FIGS. 7A&B preferably are replaced by single-bit (i.e., two-level) quantizers to reduce circuit complexity, especially for polyphase decomposition factors of m>>1.

Figure 7D:
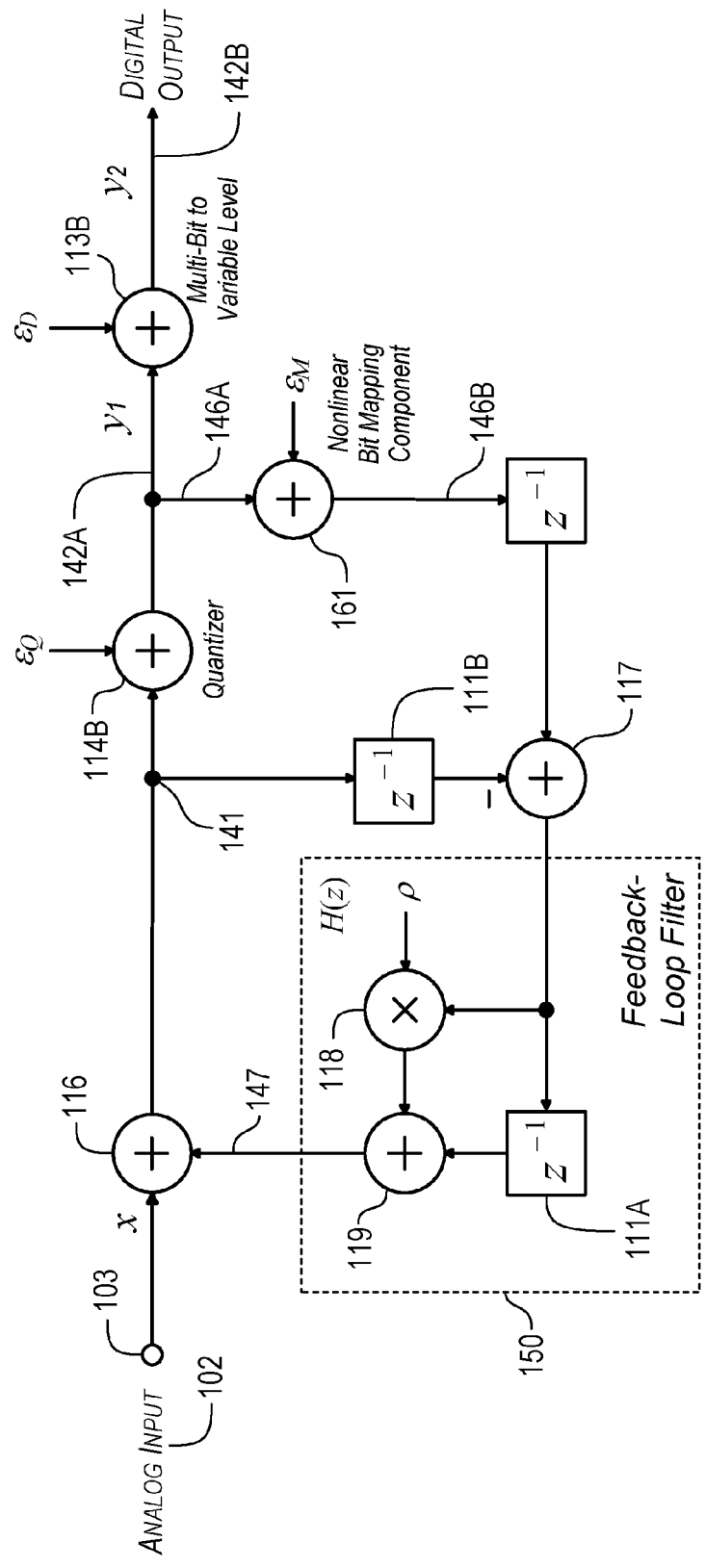
FIG. 7D is a block diagram illustrating a linearized model of a discrete-time noise-shaping/quantization circuit that accounts for errors due to quantization, nonlinear bit mapping, and multi-bit-to-variable-level conversion, according to a representative embodiment of the present invention.

Like conventional ΔΣ modulators, the µΔΣ modulator processes input signal 102 with one transfer function (STF) and the conversion noise (e.g., from quantizer 114 in reference to FIG. 7A) with a different transfer function (NTF). Referring to the block diagram shown in FIG. 7D, the linearized signal transfer function (STF) between input line 103 and output 142B ($y_2$) of quantizer 114B is STF(z)=$z^{-1}$. The linearized quantization-noise transfer function (NTF) between the quantization noise ($\epsilon_Q$) entry point and output 142B ($y_2$) of quantizer 114B, is NTF(z)=1+H(z).

Therefore, the signal response is all-pass and the noise response depends on the loop filter transfer function, H(z), of the µΔΣ modulator. To produce quantization noise nulls at predetermined frequencies across the Nyquist bandwidth of the converter, the feedback-loop filter 150 preferably has a second-order transfer function of the form H(z)=ρ·$z^{-1}$+$z^{-2}$, where ρ is a programmable value. Then, the noise transfer function is given by NTF(z)=1+H(z)=1+ρ·$z^{-1}$+$z^{-2}$ and the location of the noise minimum is determined by the coefficient ρ. To produce a noise minimum at an arbitrary frequency within the operating bandwidth of the overall converter, it is preferable for ρ to be capable of varying over a range of −2 to +2. Specifically, a value of ρ=−2·cos(2·π·f/(m·$f_{CLK}$)), produces a noise minimum, or null, at a frequency equal to f (i.e., the center frequency of a given processing branch), where $f_{CLK}$ is the quantizer/modulator clocking rate. In the absence of quantization noise (i.e., $\epsilon_Q$=0) and input signal (i.e., x=0), the output 142A ($y_1$) of the sampling/quantization circuit is $y_1$=$\epsilon_{M'}$(ρ·$z^{-1}$+$z^{-2}$), and the output 142B ($y_2$) of the nonlinear bit-mapping component is $y_2$=$y_1$+$\epsilon_D$=$\epsilon_{M'}$(ρ·$z^{-1}$+$z^{-2}$)+$\epsilon_D$, where: 1) $\epsilon_M$ is the intentional nonlinear distortion introduced by nonlinear bit-mapping component 161; and 2) $\epsilon_D$ is the unintentional nonlinear distortion introduced by multi-bit-to-variable-level converter 113B. When the nonlinear distortion introduced by nonlinear bit-mapping component 161 is equal to the nonlinear distortion introduced by multi-bit-to-variable-level converter 113B, such that $\epsilon_M = \epsilon_D$, then the overall distortion transfer (DTF=$y_2/\epsilon$) is $$DTF(z) = 1 + \rho \cdot z^{-1} + z^{-2} = NTF(z),$$

and therefore, distortion ($\epsilon_D$) is subjected to the same noise-shaped response as quantization noise ($\epsilon_Q$).

The effective oversampling ratio of an MBO converter, according to the preferred embodiments of the invention, is given by the product of the interleaved oversampling ratio M equal to the number of parallel processing branches, and the excess-rate oversampling ratio N', equal to $$\frac{1}{2} \cdot m \cdot f_{CLK} / f_B.$$

Therefore, the resolution performance of an MBO converter can be increased independently of N' by increasing the number M of parallel processing branches (e.g., branch 110 or 120). Furthermore, the excess-rate oversampling ratio N' can be increased independently of the clocking rate $f_{CLK}$, by increasing the order m of the polyphase decomposition (i.e., the number of parallel outputs of the μΔΣ modulator). However, processing branches are added at the expense of increasing the number of analog bandpass filters (e.g., filters 115 and 125) in the filter bank that performs output signal reconstruction, while simultaneously increasing the minimum quality factor (Q=$f_C/BW_{3\ dB}$) of each such filter. Problems with controlling the amplitude and phase distortion of the filter-bank, coupled with the design complexities associated with building multiple high-Q analog filters, generally makes increasing the interleave factor, M, a less desirable alternative for increasing the effective oversampling ratio of the converter, than increasing the excess-rate oversampling ratio, N'. Therefore, the MBO converter preferably has an excess-rate oversampling ratio N'>1.

Conventionally, increasing the excess-rate oversampling ratio N is realized by increasing the clocking rate ($f_{CLK}$) of the noise-shaping modulator. As mentioned previously, however, the effective excess-rate oversampling ratio N' of a μΔΣ modulator is not limited by $f_{CLK}$ due to the multirate (i.e., polyphase) decomposition of the entire μΔΣ modulator circuit. Polyphase decomposition of the entire μΔΣ modulator into parallel paths eliminates race conditions and allows the effective sampling rate ($f_S$) of the converter to increase without increasing the clocking rate ($f_{CLK}$) of the modulator, at the expense of additional circuitry (i.e., at the expense of addition arithmetic and quantization/rounding operations). For illustrative purposes, consider a noise-shaping/quantization circuit 112C as illustrated in FIG. 7A with $$H(z) = \rho + z^{-1}$$

and $$NTF(z) = 1 + \rho \cdot z^{-1} + z^{-2}.$$

The quantized output 142 of noise-shaping/quantization circuit 112C, $Q(y_n)$, can be represented by the difference equation $$Q(y_n) = Q[x_n + \rho \cdot Q(y_{n-1}) - \rho \cdot y_{n-1} + Q(y_{n-2}) - y_{n-2}],$$

and therefore, the difference equations for the first two output samples (i.e., n=0, 1) are $$Q(y_0) = Q[x_0 + \rho \cdot Q(y_{-1}) - \rho \cdot y_{-1} + Q(y_{-2}) - y_{-2}]$$

and $$Q(y_1) = Q[x_1 + \rho \cdot Q(y_0) - \rho \cdot y_0 + Q(y_{-1}) - y_{-1}].$$

Substitution of $y_0$ into $y_1$ results in $$Q(y_1) = Q[x_1 + \rho \cdot Q(x_0 + \rho \cdot Q(y_{-1}) - \rho \cdot y_{-1} + Q(y_{-2}) - y_{-2}) - \rho \cdot (x_0 + \rho \cdot Q(y_{-1}) - \rho \cdot y_{-1} - Q(y_{-2}) - y_{-2}) + Q(y_{-1}) - y_{-1}],$$

which can be generalized to $$Q(y_n) = Q[x_n + \rho \cdot Q(x_{n-1} + \rho \cdot Q(y_{n-2}) - \rho \cdot y_{n-2} + Q(y_{n-3}) - y_{n-3}) - \rho \cdot (x_{n-1} + \rho \cdot Q(y_{n-2}) - \rho \cdot y_{n-2} + Q(y_{n-3}) - y_{n-3}) + Q(y_{n-2}) - y_{n-2}].$$

The above equation differs from the equation in the '079 application in that the last two terms (i.e., $Q(y_{n-2})$ and $y_{n-2}$), which appear in the preceding equations for $y_0$ into $y_1$, were inadvertently excluded from the final result in the '079 application (i.e., an error was made substituting $y_0$ into $y_1$). Also, the block diagram of FIG. 7B has been updated from the '079 application to reflect these corrections. This substitution error, however, does not alter the discovery that at the acceptable expense of additional rounding operations and arithmetic terms, the output $Q(y_n)$ can be calculated using only: 1) modulator inputs $x_{n-i}$; and 2) modulator outputs (i.e., outputs $y_{n-2}$ and $y_{n-3}$) that have been delayed by two or more full-rate ($1/f_S$) periods for a polyphase decomposition factor of m=2. That is, a present output $y_n$ a parallel path is solely dependent upon: 1) the signal samples $x_n$, that are input to the parallel paths of the overall noise-shaping/quantization circuit; 2) signal samples that are generated within such path itself; and/or 3) prior output samples from various other parallel paths, that have been delayed by at least one sub-rate delay of $m/f_S$ (i.e., $y_{n-i}$ such that i≥m). In particular, a present output sample $y_n$, from any parallel path, is independent of the present output samples (i.e., $y_{n-i}$ such that i<m) from any other parallel path. In the above example, parallel processing enables the μΔΣ modulator to run at one-half the clocking rate $$\left( \text{e.g., } f_{CLK} = \frac{1}{m} \cdot f_S = \frac{1}{2} \cdot f_S \right)$$

for the same oversampling ratio N, or at twice the oversampling ratio for the same clocking rate. This novel polyphase decomposition approach, described above for a polyphase decomposition factor of m=2, can be extended to higher polyphase decomposition factors and to arbitrary feedback-loop filter functions (H(z)). This is an important consideration, particularly for converters that operate at a high sampling rate. FIG. 7B illustrates a μΔΣ modulator having a polyphase decomposition factor of m=2 per the above example. As indicated above, when m≥2 each of the parallel paths generates a different subsampling phase of the complete signal that is output by the discrete-time noise-shaping/quantization circuit (e.g., circuit 112 of branch 110). As used herein, a "subsampling phase" refers to one of the k possible phases, or sample-time intervals, at which subsampling by a factor k of can occur. Although a present output sample (e.g., current output sample $Q(y_n)$) does not depend on a previous output sample which has been delayed by less than a sub-rate period (e.g., previous output sample $Q(y_{n-1})$), the resulting noise-shaped response is degraded when the quantization/truncation function Q(•) is distributed across multiple terms to allow, for example, pipelining of the digital logic within each parallel processing path. In such a pipelined arrangement, maintaining a desired degree of noise-shaped performance preferably is realized by: 1) using higher-order noise shaping; 2) increasing the oversampling ratio; and/or 3) employing finer levels of quantization (i.e., quantization using more bits).

Each of the μΔΣ circuits shown in FIGS. 7A-C has a noise-shaped response which is second-order. However, noise-shaped responses of higher-order can result in improved converter resolution performance, because high-order responses shift more noise away from the passband of a particular processing branch than low-order responses, thereby increasing the amount of noise attenuated by the branch's bandpass (signal reconstruction) filter. For example, for a sixth-order noise-shaped response, the feedback-loop filter shown in FIG. 7A would have the general transfer function $$H(z) = NTF(z) - 1$$

$$= (1 - \rho_0 z^{-1} + z^{-2}) \cdot (1 - \rho_1 z^{-1} + z^{-2}) \cdot (1 - \rho_2 z^{-1} + z^{-2}) - 1$$

$$= -(\rho_0 + \rho_1 + \rho_2) \cdot z^{-1} + (3 + \rho_0\rho_1 + \rho_0\rho_2 + \rho_1\rho_2) \cdot z^{-2} - (2\rho_0 + 2\rho_1 + 2\rho_2 + \rho_0\rho_1\rho_2) \cdot z^{-3} + (3 + \rho_0\rho_1 + \rho_0\rho_2 + \rho_1\rho_2) \cdot z^{-4} - (\rho_0 + \rho_1 + \rho_2) \cdot z^{-5} + z^{-6}$$

Typically, the coefficients (or parameters) $\rho_0$, $\rho_1$, and $\rho_2$ of the noise-shaping circuit are equal, such that the zeros of the noise transfer function occur at a common frequency. In the case of roots having equal magnitudes, the resulting noise transfer function simplifies to $$H_1(z) = H_{NOISE}(z) - 1 = (1 - \rho \cdot z^{-1} + z^{-2})^3 - 1 = -3 \cdot \rho \cdot z^{-1} + 6 \cdot \rho^2 \cdot z^{-2} - 7 \cdot \rho^3 \cdot z^{-3} + 6 \cdot \rho^2 \cdot z^{-4} - 3 \cdot \rho \cdot z^{-5} + z^{-6}.$$

However, this simplified condition is not necessarily optimal with respect to minimizing output noise, particularly for small interleave factors (M) where there is a correspondingly small number of analog output filters. Conventionally, a high-order modulator is said to be "zero-optimized" when output noise is minimized by employing a NTF with unequal zeros. See K. Chao, S. Nadeem, W. Lee, and C. Sodini, "A Higher Order Topology for Interpolative Modulators for Oversampling A/D Converters," IEEE Transactions on Circuits and Systems, 1990. A zero-optimized NTF enables the bandwidth of the NTF bandstop response to be increased at the expense of reducing the depth of the noise null. For small interleave factors M, this difference in noise response can result in improved converter resolution.

For the μΔΣ modulator, however, a NTF with unequal zeros also can reduce the circuit complexity associated with the multirate architecture. When feedback structures, such as μΔΣ modulators, are implemented using parallel-processing methods, such as polyphase decomposition, coefficient dynamic range expansion can reduce digital precision and cause the NTF response to deviate from the preferred NTF response. This occurs because in polyphase feedback structures, input and output values are multiplied by the same coefficient (i.e., ρ) multiple times, causing needed arithmetic precision to grow geometrically. A large number of binary terms (i.e., large bit-widths) is needed to represent values with high precision. This resulting increase in complexity can be offset by approximating an optimal NTF with an NTF that has unequal zeros, and has rational coefficients which can be represented as simple binary fractions (i.e., fractions with denominators that are powers of two). In signal processing applications, the technique of approximating high-precision values with the sum of binary fractions is conventionally referred to as canonic-signed-digit (CSD) representation (see for example Pham 2008). Use of coefficients that can be represented by simple binary fractions (e.g., values represented by no more than 3-8 bits), allows the multipliers comprising the loop filter of the μΔΣ modulator to be replaced by less complex circuits consisting of adders and/or bit-shifting operations. This complexity-reduction technique is sometimes referred to herein as "bit-optimization". Therefore, in the preferred embodiments of the invention, μΔΣ modulators with a bit-optimized NTF are employed. It should be noted that zero-optimization for the purpose of reducing complexity (i.e., bit-optimization) is different from zero-optimization for the purpose of noise reduction. However, sometimes bit-optimization can result in NTFs having beneficial responses compared to NTFs with equal zeros.

Figure 8:
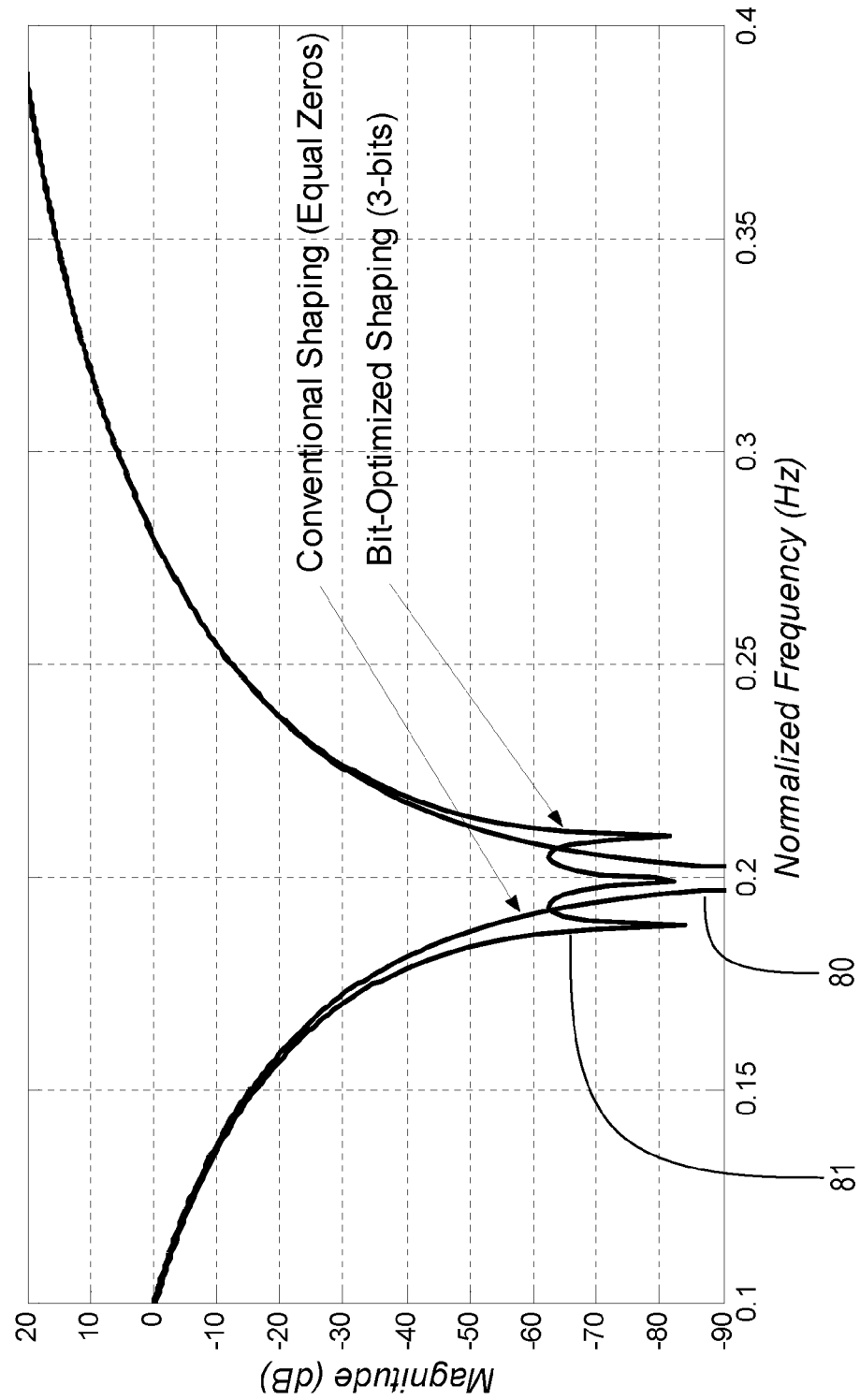
FIG. 8 illustrates the noise transfer function (NTF) of a conventional, single-band bandpass delta-sigma modulator and the noise transfer function of a multirate delta-sigma modulator with bit-width optimized zeros, according to a representative embodiment of the invention.

FIG. 8 provides a comparison of two different noise-shaped responses (i.e., NTF frequency responses): 1) a conventional $6^{th}$-order response with equal zeros, such that $\rho_0 = \rho_1 = \rho_2 = 0.618034 \ldots$; and 2) a bit-optimized $6^{th}$-order response with $\rho_0 = \frac{1}{2}$, $\rho_1 = \frac{5}{8}$, and $\rho_2 = \frac{3}{4}$. As shown in FIG. 8, conventional NTF 80 with equal zeros has a noise null which reaches a depth of greater than 90 dB at a normalized frequency of 0.2 Hz; whereas the depth of bit-optimized NTF 81 reaches a depth of just greater than 60 dB. However, compared to NTF 80 with equal zeros, bit-optimized NTF 81 has a 60-dB bandwidth that is approximately 55% wider (0.025 Hz versus 0.016 Hz). For MBO converters with a small number M of parallel processing branches (e.g., branches 110 or 120), a NTF with wider bandwidth and lower maximum attenuation can result in less noise at the output of a signal reconstruction filter (e.g., bandpass filter 115) than a NTF with narrower bandwidth and higher maximum attenuation.

Due to faster accumulation of quantization errors caused by greater amplification of quantization noise in out-of-band regions, when using noise-shaped quantization circuits of high-order, it is preferable to use greater than single-bit quantization to ensure that the noise-shaped output remains bounded. As a result, quantizer 114 shown in FIGS. 7A-C preferably is a multi-bit quantizer, for the above exemplary NTF with a $6^{th}$-order response. However, single-bit quantizers (i.e., comparators) with noise-shaped responses of low-order could be used instead, and should be considered to be within the scope of the present invention.

Bandpass (Signal Reconstruction) Filter Considerations

The primary considerations for the bandpass filters (e.g., filters 115 and 125) used in MBO signal reconstruction according to the preferred embodiments of the present invention are: 1) design complexity (preferably expressed in terms of filter quality factor and order); 2) frequency response (particularly stopband attenuation); and 3) amplitude and phase distortion. With regard to quantization noise attenuation and conversion resolution, the best performance is obtained for output filters (i.e., bandpass or signal reconstruction filters 115) having frequency responses that exhibit high stopband attenuation, which generally increases with increasing filter order. To minimize complexity, however, the implementation of the analog filters preferably is based on relatively low-order (i.e., $5^{th}$ to $7^{th}$ order) standard analog filter responses (e.g., Butterworth, Chebychev, and coupled-resonator), rather than on direct transformation (e.g., impulse invariance and bilinear transformations) of the FIR window filters used in MBΔΣ analog-to-digital converters. In addition, it is preferable that the filter responses introduce as little amplitude and group delay (phase) distortion as possible to minimize the complexity of circuits that can equalize the distortion, such as digital pre-distortion linearizer (e.g., DPL 104A&B). The performance improvement realized by increasing the converter interleave factor (M) is contingent on a proportionate increase in the quality factor of the reconstruction filters, defined as the ratio of the filter center frequency to the filter 3 dB bandwidth (i.e. $f_C/f_{3\ dB}$). For an MBO converter, according to the preferred embodiments of the invention, the limiting quality factor is the one calculated for the highest-frequency filter in the reconstruction filter bank $$\left(\text{i.e., } f_C \approx \frac{1}{2} \cdot f_S\right).$$

Therefore, the preferred quality factor for the analog filters (e.g., filters 115 and 125) is directly related to the interleave factor of the converter and, more preferably, is equal to M $$\left(\text{i.e., since } f_{3dB} \approx \frac{1}{2} \cdot f_S/M\right).$$

Conventionally, the quality factor for standard lumped-element or distributed-element analog filters is limited to about 30. As a result, a practical limitation on the interleave factor for the MBO converter is a typical value of M≈32. However, because of the complexity associated with an analog reconstruction filter bank comprised of 32 filters, the preferred embodiments of the invention limit the interleave factor to M=16 or less (i.e., a bank of 16 or fewer analog filters 115).

Figure 9A:
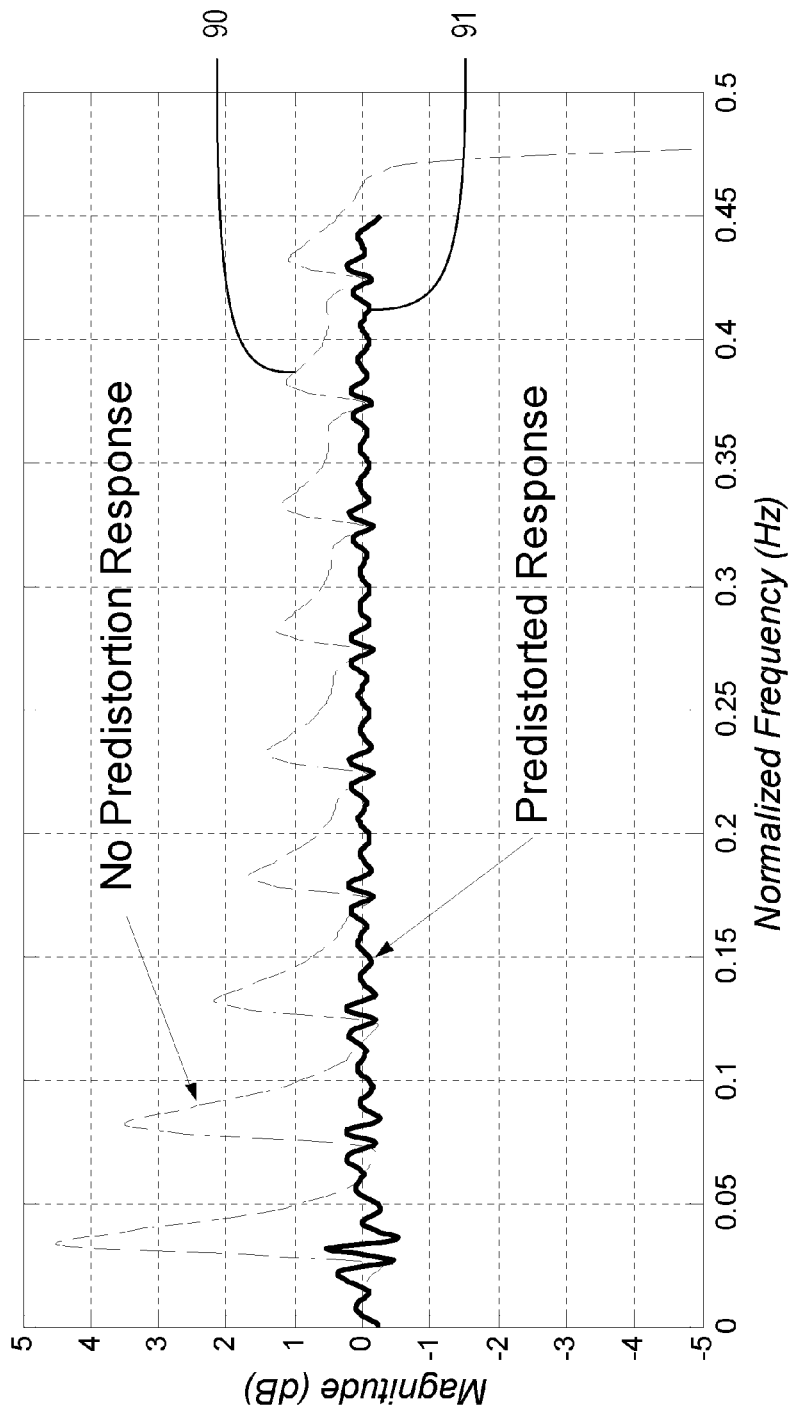
FIG. 9A illustrates the overall frequency responses, with and without digital pre-distortion, for an analog signal reconstruction (ASR) filter bank comprised of $5^{th}$-order Butterworth filters, according to representative embodiments of the present invention.
Figure 9B:
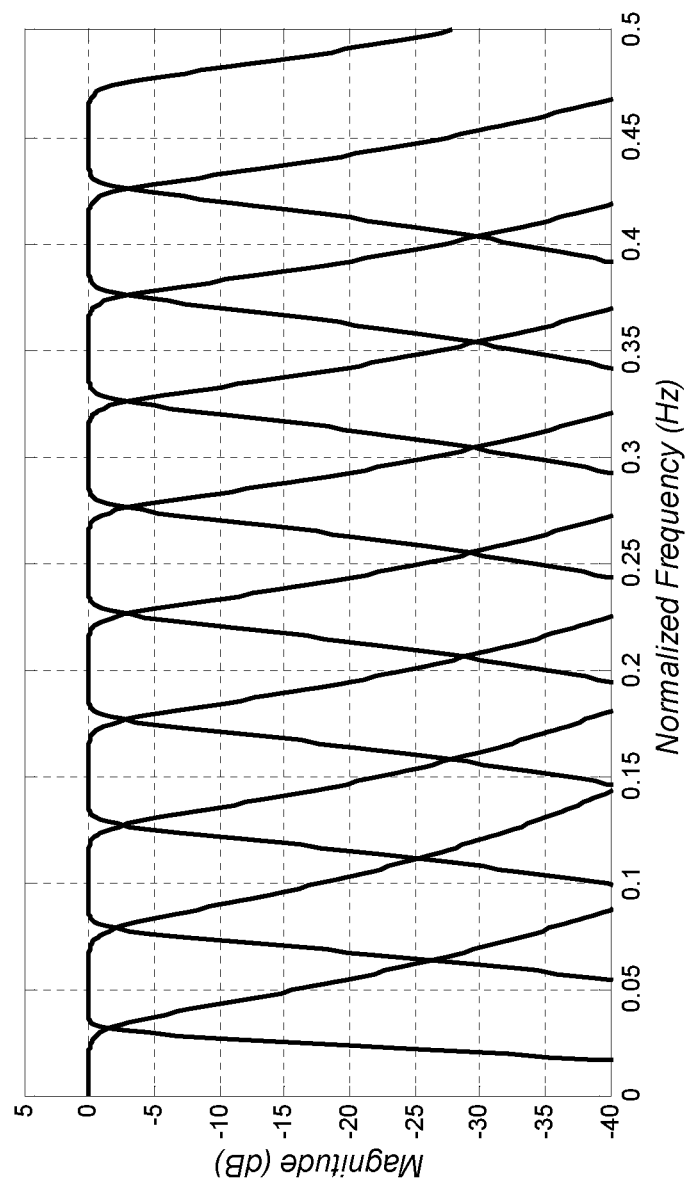
FIG. 9B illustrates the frequency response magnitudes for the individual filters that make up a $5^{th}$-order Butterworth filter bank, according to a representative embodiment of the present invention.
Figure 9C:
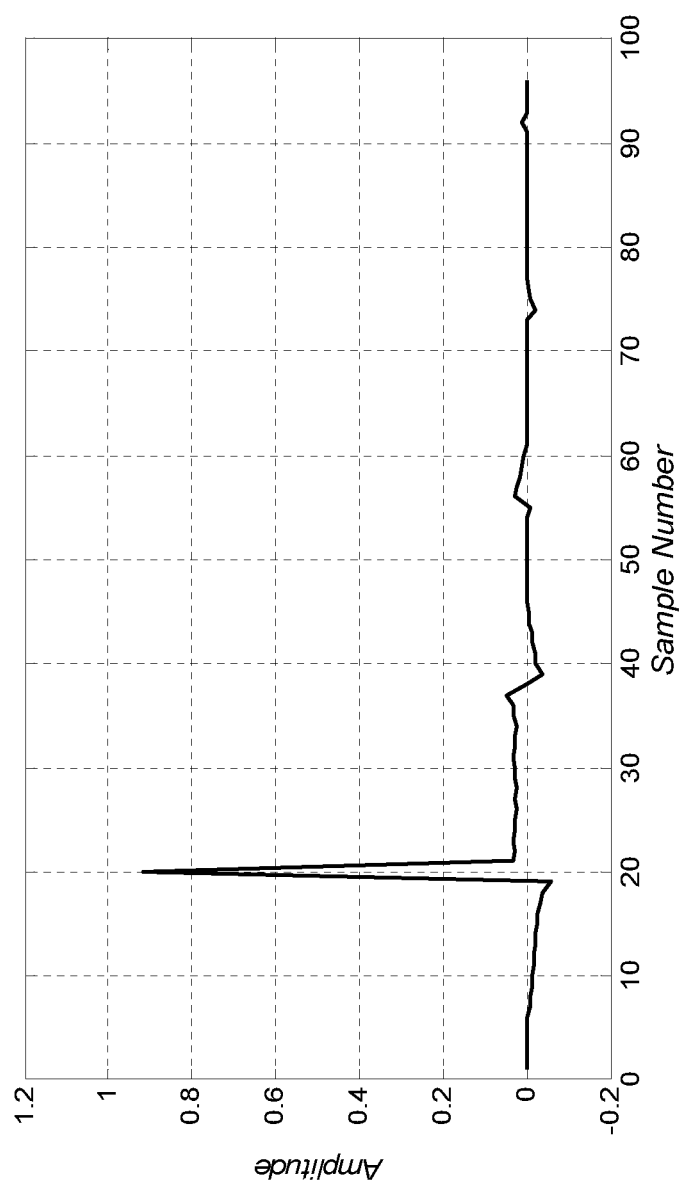
FIG. 9C illustrates the impulse response (i.e., coefficient values) of a digital pre-distortion linearizer (DPL) for use with a $5^{th}$-order Butterworth filter bank, according to a representative embodiment of the present invention.

For an interleave factor of M=16, $5^{th}$- to $7^{th}$-order Butterworth filter responses (i.e., with a response given by $F_k(j\omega)$) provide sufficient stopband attenuation of conversion noise. However, the overall response, $F(j\omega)=\Sigma F_k(j\omega)$, of a bank of these analog filters does not exhibit the properties necessary for perfect signal reconstruction in frequency-interleaved applications, namely low amplitude and group delay (phase) distortion. For example, curve 90 labeled "No Predistortion Response" in FIG. 9A, illustrates the overall magnitude of the frequency response for a Butterworth filter bank having the individual frequency responses shown in FIG. 9B. According to curve 90, the overall frequency response for this Butterworth filter bank exhibits amplitude (magnitude) distortion on the order of several decibels (dB). However, for converters according to the preferred embodiments of the present invention, near perfect signal reconstruction is not strictly dependent on the analog filter bank having an all-pass response (i.e., $F(j\omega)=e^{-jn\omega T}$), as conventionally, is the generally accepted view. Instead, it is only desirable that the filter bank response be all-pass in convolution with a second filter transfer function, L(z), implemented by digital pre-distortion linearizer (DPL) 104A (shown in FIG. 6D), such that $$F(j\omega) \cdot L(z) = F(j\omega) \cdot \frac{\sum_{i=0}^{K1} \beta_i \cdot z^{-i}}{1 + \sum_{i=1}^{K2} \alpha_i \cdot z^{-i}} = z^{-n}\bigg|_{z=e^{-j\omega t}}$$

where L(z) is a physically realizable transfer function (e.g., stable and causal). This second filter with transfer function L(z) intentionally predistorts input signal 102 with added phase and/or amplitude distortion, such that the added intentional distortion cancels the unintentional distortion of the analog reconstruction filter bank (i.e., the aggregate distortion across all of bandpass filters 115, 125, etc.). As represented in the equation above, the transfer function L(z) of DPL 104A preferably employs both feed-forward and feedback components (preferably simple weighted delay components), represented by coefficients $\beta_i$ and $\alpha_i$, respectively. FIG. 9C illustrates an exemplary DPL impulse response that can effectively reduce the distortion introduced by an analog filter bank having the individual Butterworth responses given in FIG. 9B. The exemplary DPL impulse response of FIG. 9C differs from the exemplary DPL response given in the '079 application in that the filter coefficients have been reversed to minimize filter latency (i.e., propagation delay). DPLs with minimum latency are preferred in certain converter applications, such as servo loop applications, which are sensitive to the propagation delay of the system elements. In any event, as shown by curve 91 labeled "Predistorted Response" in FIG. 9A, this DPL response combines with the overall analog filter bank response to produce a linearized, frequency response with an overall magnitude having amplitude distortion of much less than 1 dB.

The coefficients, $\beta_i$ and $\alpha_i$, for a fixed pre-distortion linearizer (e.g., DPL 104A) that maximally equalizes the impulse response of a particular analog filter bank, can be determined using conventional methods for solving simultaneous linear equations (e.g., zero-forcing or minimum mean square error solutions), or can be determined using conventional adaptive techniques, such as those based on a least mean squares (LMS) principle. Under conditions where the overall response of the analog filter bank (i.e., the filter bank comprised of analog bandpass filters 115, 125, and the filters in the remainder of the processing branches) varies, for example due to temperature or other environmental conditions, the coefficients of DPL 104B are variable and preferably continuously adapt based on the measured amplitude and phase characteristics of the data converter output. Converter 140 of FIG. 10 incorporates a means for adapting DPL 104B according to a representative embodiment of the present invention. More specifically, converter 140 uses input spectrum analyzer 151A and output spectrum analyzer 151B, to compare the complex (i.e., magnitude and phase as a Cartesian value) frequency response (spectrum) $X_k$ of input signal 102, to the complex frequency response (spectrum) $Y_k$ of output signal 135, respectively. Within processing block 144B, the coefficients $c_n$ of DPL 104B (i.e., assuming a finite impulse response filter) are preferably computed as the inverse Fourier transform of the ratio of the input spectrum $X_k$ to the output spectrum $Y_k$, such that $$c_n = \text{impulse}(\beta, \alpha)$$
$$= \frac{1}{2 \cdot K} \sum_{k=0}^{2 \cdot K - 1} (X_k, X^*_{K-k})/(Y_k, Y^*_{K-k}) \cdot \exp\left(2 \cdot \pi \cdot j \cdot \frac{n \cdot k}{2 \cdot K}\right),$$

where the * superscript represents complex conjugate and j is equal to $\sqrt{-1}$. Input spectrum analyzer 141A computes the 2·K-point, discrete Fourier transform (DFT) of real input signal 102, at frequency points k=0, . . . , K−1, using: 1) multipliers 153A; 2) cosine sequence 152A and sine sequence 152B, both having an angular frequency of $\omega_k$; 3) moving-average filters 148; and 4) downsample-by-K functions 143. Output spectrum analyzer 141B performs similar processing on output signal 135. In the preferred embodiments, moving average-filter 148 is single-stage, K-point rectangular window filter, but more preferably, the magnitude of the DFT side lobes is reduced using cascaded moving-average filters of the type described in U.S. Pat. No. 8,089,382, titled "Sampling/Quantization Converters", which is incorporated by reference herein as though set forth herein in full. Furthermore, to minimize residual output amplitude and phase distortion at the output of converter 140, DPL 104B has an impulse response of length K≥2·M (i.e., K coefficients) in the preferred embodiments, where M is the number of MBO processing branches. In applications where higher power dissipation and circuit complexity are tolerable, DPL 104B preferably has an impulse response of length K≥4·M.

Figure 10:
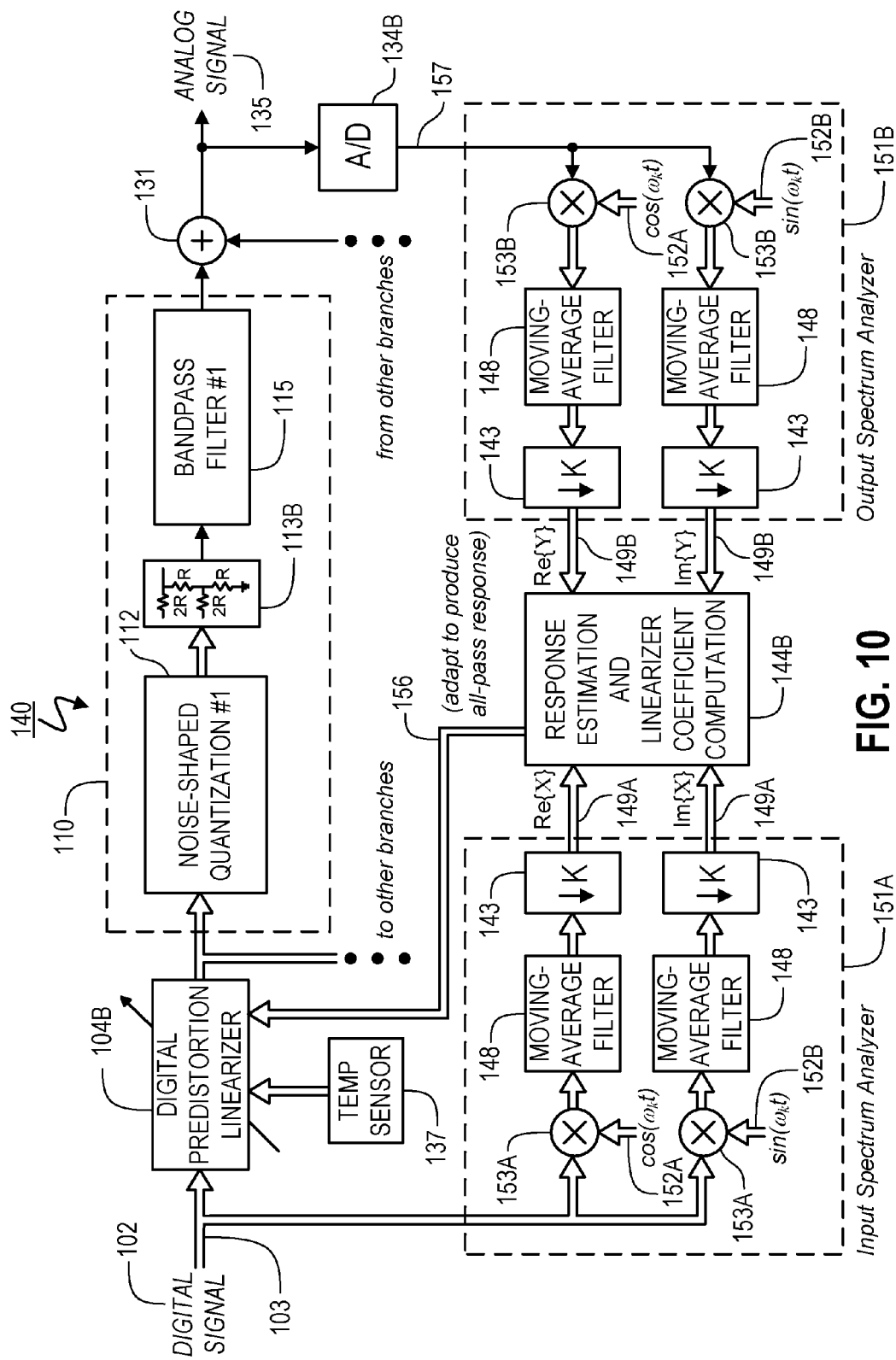
FIG. 10 is a simplified block diagram illustrating a Multi-Channel Bandpass Oversampling (MBO) converter that incorporates an adaptive digital predistortion linearizer (DPL) to compensate for amplitude and group delay variation, introduced by an analog signal reconstruction (ASR) filter bank comprising individual bandpass filters with standard frequency responses, according to a representative embodiment of the present invention.

As illustrated in FIG. 10, the exemplary embodiment of converter 140 also includes a means for directly adjusting the coefficients of DPL 104B for changes in temperature, using temperature sensor 137. In response to changes in temperature, the coefficients of DPL 104B may be selected from a predetermined set of values, or the coefficients of DPL 104B may be scaled according to a predetermined function established though empirical converter characterization over temperature. DPL temperature compensation may be implemented in conjunction with other adaptation mechanisms, such as that described above which is based on the amplitude and phase characteristics of converter output signal 135, or may be implemented without additional DPL adaptation mechanisms in order to reduce power dissipation and circuit complexity.

Reduced analog filter bank complexity is one reason why the preferred embodiments of the invention employ one or more pre-distortion linearizing filters (e.g., DPL 104A&B). A second reason is that linearizers of this type can be employed to correct signal skew caused by propagation delay differences between converter branches or channels (e.g., branches 110 and 120), and between parallel paths in configurations employing polyphase noise-shaping.

Figure 11A:
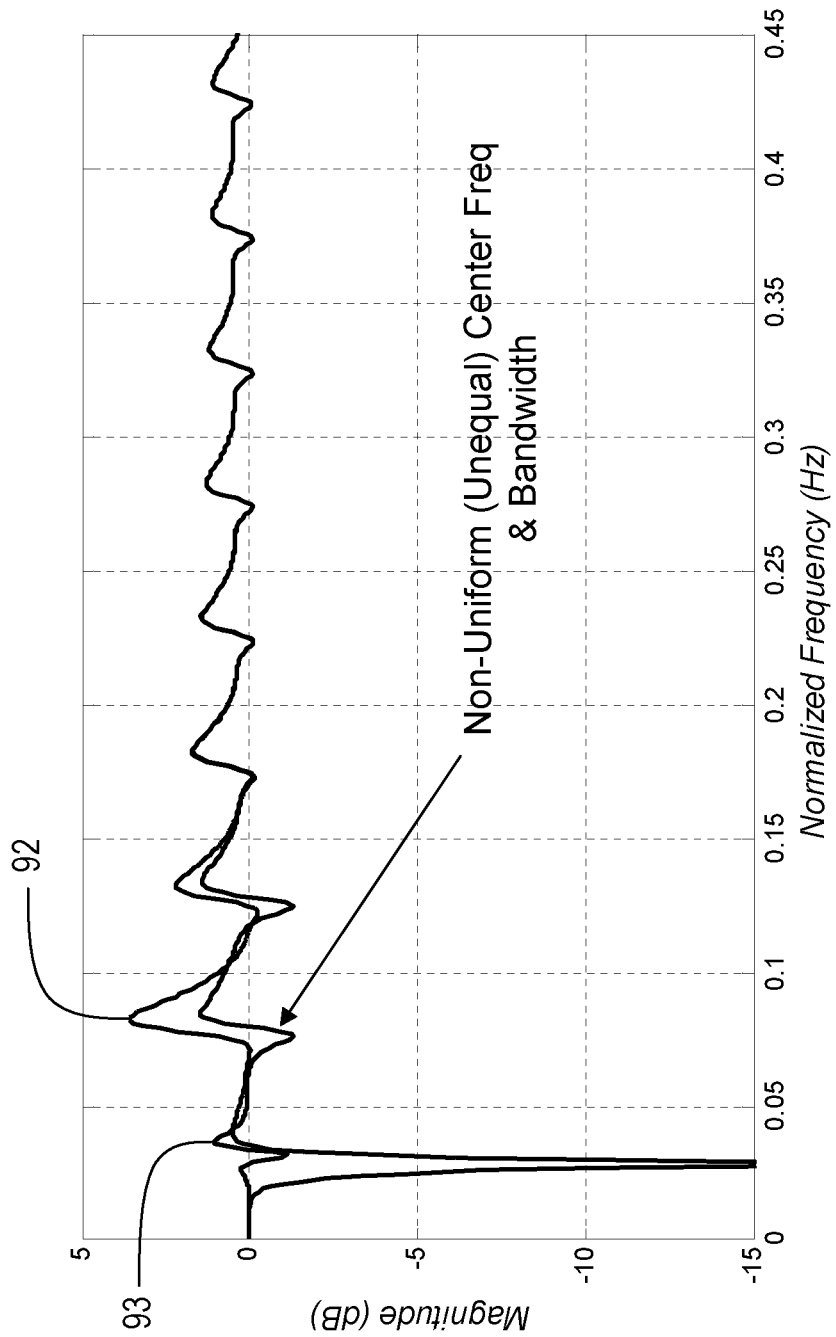
FIG. 11A illustrates the overall magnitude response, as a function of frequency, for different analog signal reconstruction (ASR) filter banks used in a MBO converter, according to representative embodiments of the present invention.
Figure 11B:
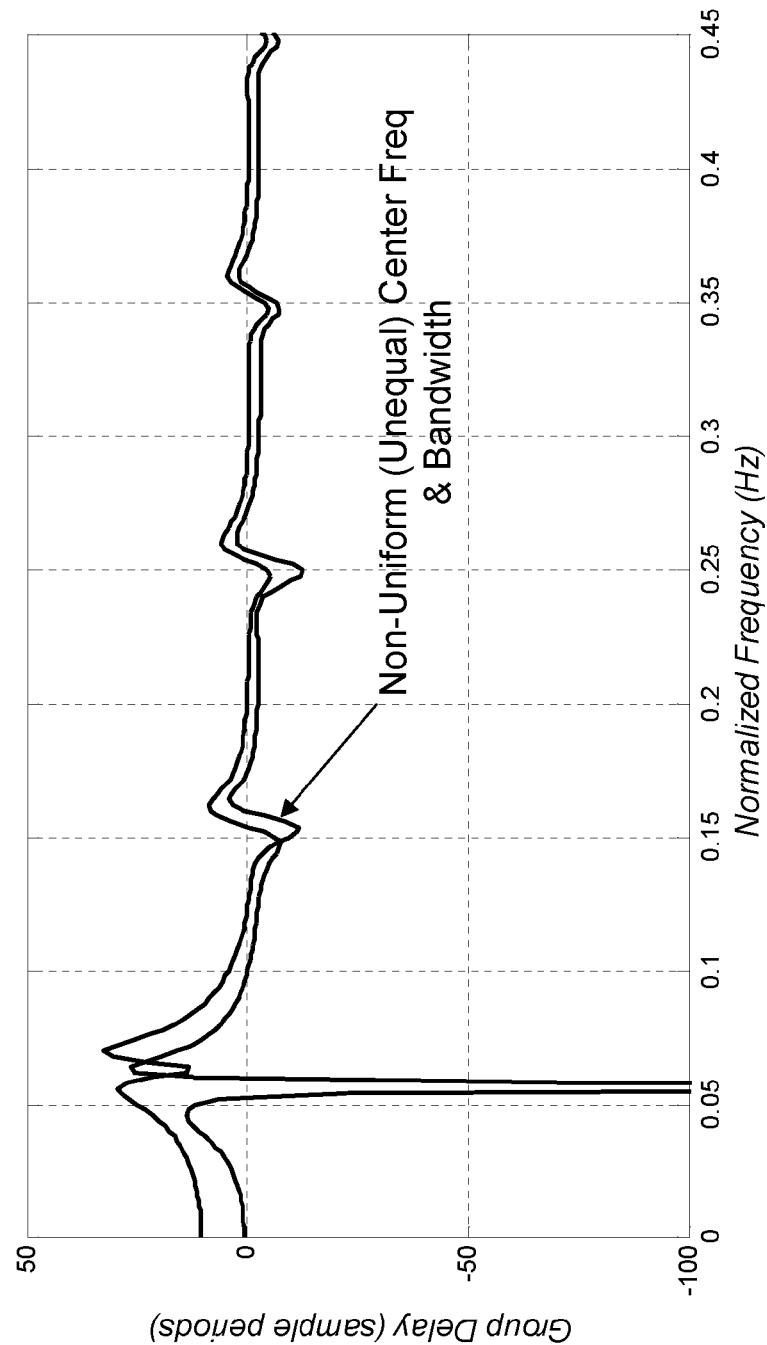
FIG. 11B illustrates the overall group delay response, as a function of frequency, for different analog signal reconstruction (ASR) filter banks used in a MBO converter, according to representative embodiments of the present invention.
Figure 11C:
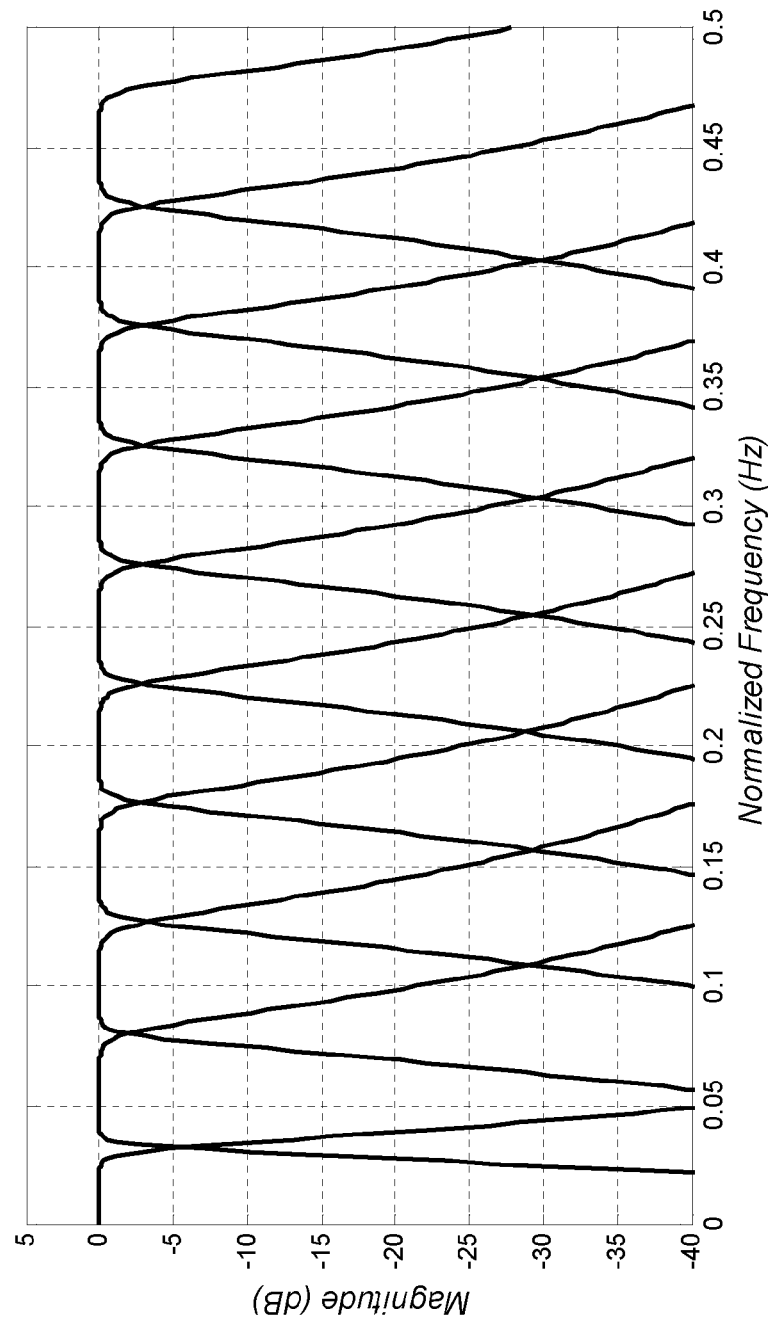
FIG. 11C illustrates the frequency response magnitudes for the individual filters that make up a Butterworth filter bank, according to a representative embodiment of the present invention.

To reduce the complexity of the digital pre-distortion linearizer (e.g., DPL 104A&B), or to allow the DPL to be eliminated in certain applications which are less sensitive to amplitude and phase distortion, the responses for the bandpass filters (e.g., filters 115 and 125) that make up the analog filter bank preferably are selected to minimize the amplitude and phase distortion which produce passband variation and group delay variation (phase dispersion), respectively. To minimize amplitude and phase distortion in the preferred embodiments, individual analog filter bank responses preferably are optimized with respect to: 1) frequency response, 2) filter order, 3) center frequency, and/or 4) bandwidth. For example, a conventional analog filter bank comprised of $5^{th}$-order Butterworth filters having uniformly distributed center frequencies (i.e., center frequencies distributed evenly across the converter Nyquist bandwidth) and equal bandwidths, has a frequency response with magnitude 92, shown in FIG. 11A, for an interleave factor of M=10. As illustrated by magnitude 92 in FIG. 11A, the frequency in response exhibits passband ripple exceeding 15 dB in a negative direction, and exceeding 3 dB in a positive direction. Alternatively, an analog filter bank comprised of Butterworth responses with center frequencies, filter orders, and bandwidths that have been adjusted unequally to reduce amplitude and group delay variation, has a frequency response with magnitude 93, as illustrated in FIG. 11A, that exhibits passband variation of less than ±1.5 dB across the converter Nyquist bandwidth (i.e., for M=10). In addition, as illustrated in FIG. 11B, the group delay variation of the analog filter bank with non-uniform responses is less than ±12.5 sample periods, compared to a group delay variation of greater than ±50 sample periods for the analog filter bank with uniform responses. The magnitude of the frequency responses for the individual filters (e.g., filters 115 and 125) that make up the improved Butterworth filter bank are shown in FIG. 11C.

Polyphase decomposition techniques can be applied to the digital pre-distortion linearizer (DPL) to form a parallel processing structure and reduce the clocking rates of the digital multipliers and adders that are used to implement the DPL. For example, fixed DPL 104A preferably is a recursive (i.e., infinite-impulse response or IIR) structure with transfer function L(z), which performs the discrete-time convolution of the data converter input sequence x(n) and the filter coefficients l(n) according to $$y(n) = x(n) * l(n) \leftrightarrow Y(z) = X(z) \cdot L(z) = X \cdot L.$$

Assuming, without loss of generality, a pre-distortion linearizer with three coefficients (i.e., $\beta_0$, $\beta_1$, and $\alpha_1$) and transfer function $$L(z) = \frac{\beta_0 + \beta_1 z^{-1}}{1 + \alpha_1 z^{-1}},$$

the operation of the pre-distortion linearizer can be represented by the difference equation $$y_n = \beta_0 x_n + \beta_1 x_{n-1} - \alpha_1 y_{n-1}.$$

Therefore, the difference equations for the first two output samples (i.e., n=1, 2) are $$y_2 = \beta_0 x_2 + \beta_1 x_1 - \alpha_1 y_1$$

and $$y_1 = \beta_0 x_1 + \beta_1 x_0 - \alpha_1 y_0,$$

and substitution of $y_1$ into $y_2$ results in $$y_2 = \beta_0 x_2 + \beta_1 x_1 - \alpha_1(\beta_0 x_1 + \beta_1 x_0 - \alpha_1 y_0)$$
$$= \beta_0 x_2 + (\beta_1 - \alpha_1 \beta_0) x_1 - \alpha_1 \beta_1 x_0 - \alpha_1^2 y_0.$$

The above equation can be generalized to $$y_n = \beta_0 x_n + (\beta_1 - \alpha_1 \beta_0) x_{n-1} - \alpha_1 \beta_1 x_{n-2} + \alpha_1^2 y_{n-2}.$$

The above equation differs from the equation in the '079 application, in that the coefficient of the last term is now raised to a power of 2 (i.e., $\alpha_1^2 y_{n-2}$), correcting for an error that was made substituting $y_1$ into $y_2$ in the '079 application. As before, however, it can be noted that $y_n$ only depends on inputs and every other output for the above example, demonstrating that, like the $\mu\Delta\Sigma$ modulator, the digital pre-distortion linearizer function can be implemented as a parallel processing structure with two parallel paths (i.e., with a polyphase decomposition factor of m=2). In the above example, parallel processing enables the DPL clocking rate $f_{CLK}$ to be one-half and effective sampling rate $f_S$, such that $$f_{CLK} = \frac{1}{m} \cdot f_S = \frac{1}{2} \cdot f_S.$$

Figure 12:
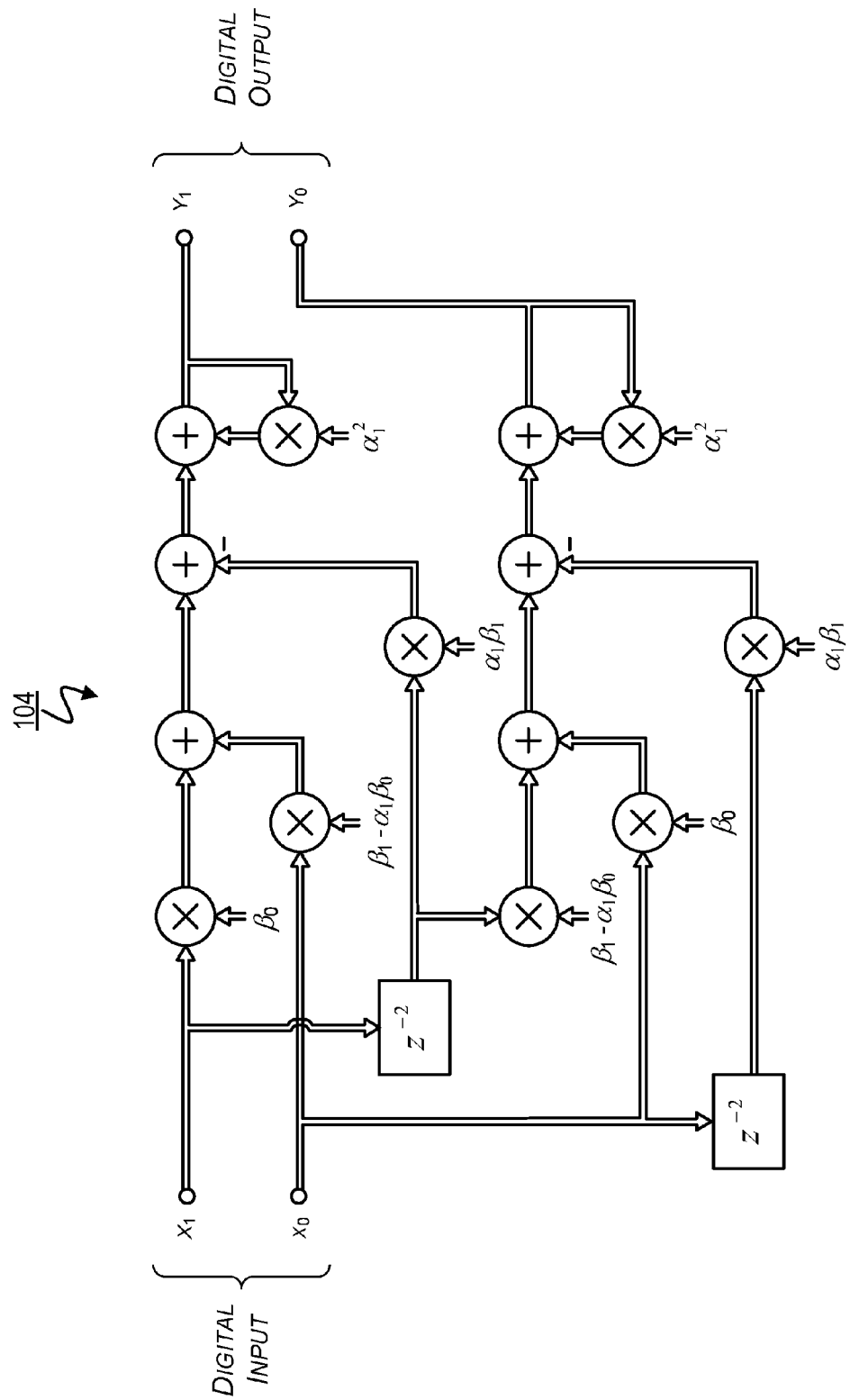
FIG. 12 is a block diagram illustrating a multirate, digital pre-distortion linearizer (DPL) with three coefficients and a polyphase decomposition factor m=2, according to a representative embodiment of the present invention.

Through conventional methods for factoring the denominator of the linearizer transfer function, this polyphase decomposition approach can be extended to higher polyphase decomposition factors (i.e., m>2) and arbitrary DPL transfer functions (L(z)), including transfer functions with only numerator terms (i.e., finite impulse response), to allow the DPL to run at a sub-multiple of the effective sampling rate of the converter. Polyphase decomposition into parallel paths results in an m-times reduction in clocking rate at the expense of no greater than an m-times increase in circuit complexity. This penalty in circuit complexity is generally a favorable alternative in the case of converters that operate at very high sampling rates. FIG. 12 illustrates a block diagram of an exemplary digital pre-distortion linearizer having an IIR transfer function with three coefficients and a polyphase decomposition factor of m=2. FIG. 12 has been updated, relative to the '079 application, so that the coefficient on the past output term $y_{n-2}$ is correctly raised to a power of 2. Therefore, the exemplary circuit shown in FIG. 12 would operate at one-half the effective sampling rate $f_S$ of the overall converter.

Multi-Bit-To-Variable-Level Signal Converter Considerations

In the preferred embodiments of the invention, the binary weighted outputs of the noise-shaping/quantization circuits (e.g., circuits 112A & 112B which are collectively referred to as circuit 112 herein), shown in FIGS. 6A-E, are converted to a single proportional analog voltage level using a modified conventional resistor ladder network. However, other conventional methods for converting a multi-bit signal (i.e., discrete-time) to a single variable-level output (i.e., continuous-time), including binary-weighted current sources and unitary-weighted current sources, instead may be used and should be considered within the scope of the present invention. Where references are made herein to a resistor ladder network or an R-2R ladder, it should be understood that such references are merely exemplary, and generally can be replaced by references to any other multi-bit-to-variable-level signal converter.

Figure 13:
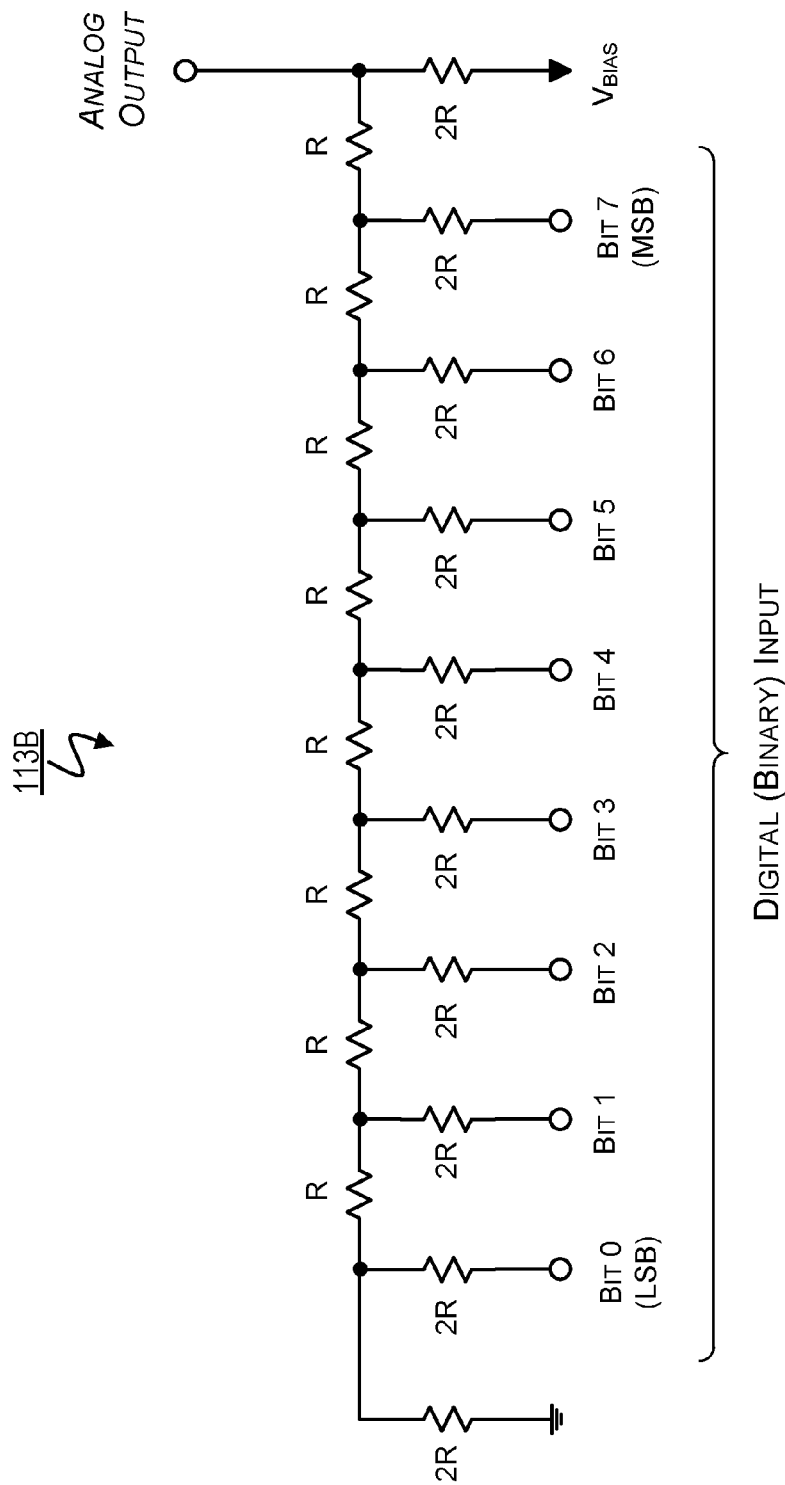
FIG. 13 is a block diagram illustrating an R-2R ladder network, used in a MBO converter according to a representative embodiment of the present invention, for converting a multi-bit digital input to a single, proportional multi-level output voltage.

More specifically, the preferred embodiments of the invention use an R-2R ladder network that has been modified for bipolar operation, where R is matched to the characteristic impedance of analog filter 115. This impedance is generally between 50 ohms and 100 ohms. FIG. 13 is an exemplary diagram of a conventional R-2R ladder, with eight inputs, that has been modified for bipolar operation with the addition of a $V_{BIAS}$ input.

An important consideration for the resistor ladder network is the relative matching of the constituent resistive elements. It is conventionally understood that a perfect resistor ladder creates an analog output by weighting each digital input according to a binary scaling factor. Mismatches in the resistive elements of the ladder distort this binary scaling, producing a nonlinear response. This nonlinear response distorts the output waveform and, therefore, degrades the quality of the converted analog signal. In conventional converters that employ resistive ladder networks, the matching requirement ($\epsilon_D$) for the resistive elements is determined by the converter precision according to $$\varepsilon_D = \frac{1}{2^{B+1}} \cdot 100\%,$$

where B in the above equation is the effective resolution of the converter in bits. Therefore, the resistor ladder matching is ~0.2% for 8-bit effective resolution.

The oversampled operation of an MBO converter according to the preferred embodiments of the invention, affords two advantages over conventional converters that are based on resistor ladder networks. One advantage is that because of noise-shaped quantization and filtering, oversampled converters require resistor ladders with fewer inputs to achieve the same effective resolution as Nyquist-rate converters. Thus, oversampling reduces the overall complexity of the resistor ladder network. The reduction in the number of resistor ladder inputs is a function of: 1) the converter effective oversampling ratio (N"·M); 2) the noise-shaping order (P) of the $\mu\Delta\Sigma$ modulators within the noise-shaping/quantization circuits (e.g., circuit 112); and 3) the stopband attenuation of the signal reconstruction filters (e.g., bandpass filter 115). To reduce resistor network complexity (i.e., the number of discrete resistor elements and the number of input lines), the preferred embodiment of the invention uses resistor ladder networks with eight or fewer inputs (i.e., eight or fewer digital inputs to the resistor ladder network in each processing branch).

A second and more significant advantage is that oversampling enables the distortion introduced by mismatches, and other imperfections such as the signal amplitude-dependent gain (i.e., buffer amplifier compression in resistor ladder 113C of converter 200C), to be shaped by noise-shaping/quantization circuit 112 and then largely removed by bandpass filter 115. Such distortion shaping and removal is preferably realized through the inclusion of nonlinear bit-mapping, e.g., as illustrated in the representative embodiment of converter 110B in FIG. 6B. Oversampling converters employ error feedback to shape conversion noise and distortion. In conventional oversampling schemes, however, the output of the resistor ladder network is not part of the feedback path of the noise-shaping circuit. Therefore, distortion caused by the imperfect binary scaling of the resistor ladder network conventionally would not be shaped. Also, not subject to a noise-shaped response is the distortion caused by a buffer amplifier gain that varies with input signal amplitude (i.e., large-signal gain is less than small-signal gain). In the prior art, this varying gain phenomenon is referred to as gain compression or AM-AM conversion. An MBO converter according to the preferred embodiments of the invention incorporates nonlinear bit-mapping component 161, in the feedback loop of the noise-shaping/quantization circuit (i.e., the modulator circuit), as shown in the detailed block diagram of FIG. 14A. The purpose of nonlinear bit-mapping component 161 is to mimic the nonlinear effects (e.g., mismatches and gain compression) of resistor (R-2R) ladder network 113C, such that these nonlinear distortions effectively become part of the modulator feedback path (i.e., as if the signal 146B had in fact originated from the output of resistor ladder network 113C). This is possible because the level of digital resolution in the modulator feedback path (i.e., a bit width resolution of n+n' bits) preferably is much greater than the level of digital resolution at the output of quantization circuit 114 (i.e., a bit width resolution of n bits). That is, each bit output from quantizer 114 (i.e., each of bits $b_0$ to $b_{n-1}$) preferably is multiplied by a multi-bit weighting factor ($C_0$ to $C_{n-1}$, respectively), thereby increasing its resolution from one bit to multiple bits, and then is subjected to a nonlinear (i.e., compressive) function of the form:

$$x_{OUT} = \sum_i \lambda_i \cdot x_{IN}^j$$

Figure 14A:
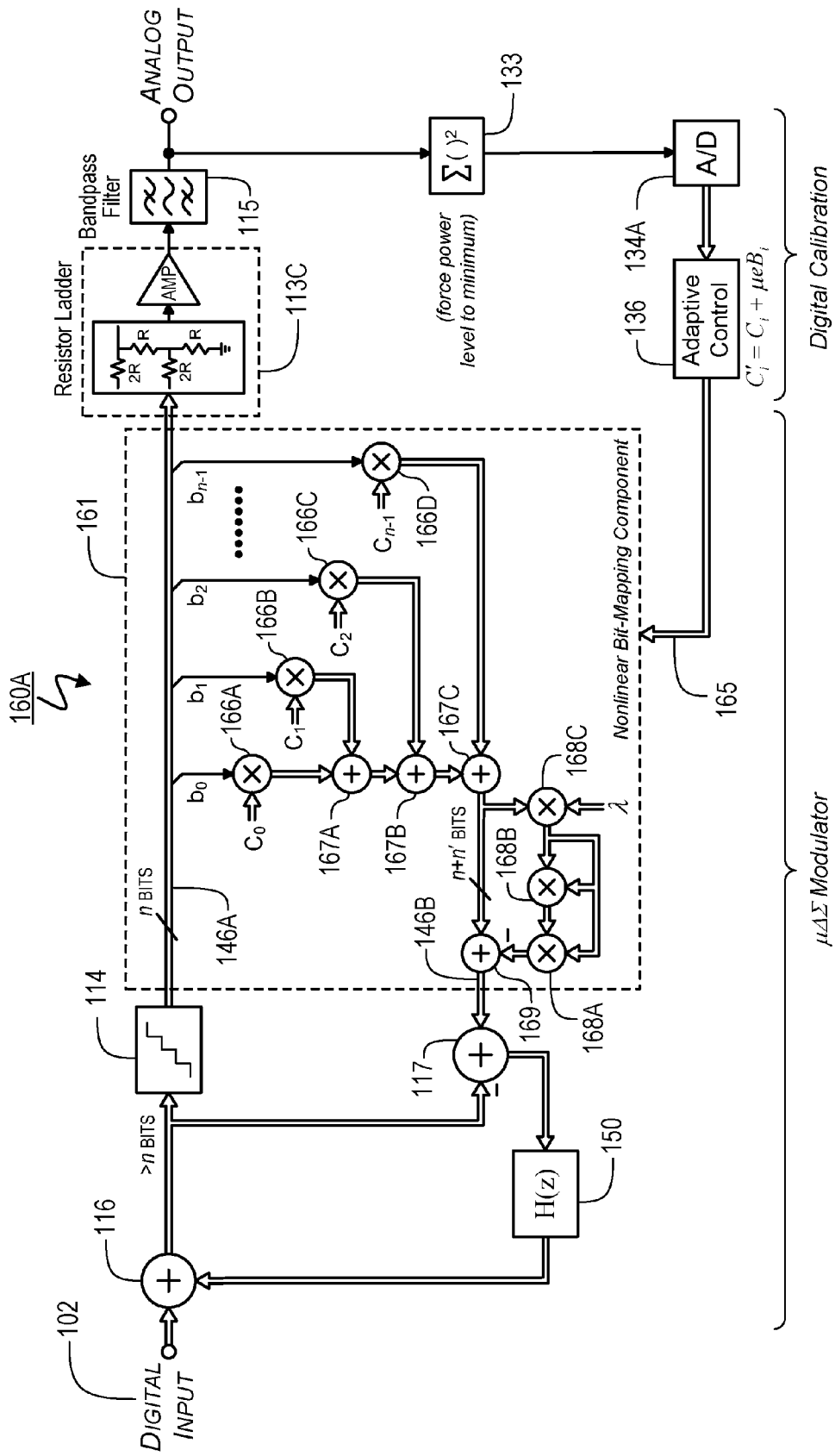
FIG. 14A is a block diagram illustrating a delta-sigma (ΔΣ) modulator that incorporates an adaptive nonlinear bit-mapping component to compensate for mismatches in a multi-bit-to-variable-level signal converter, such as an R-2R ladder network.

(e.g., a Taylor's series). In FIG. 14A, the application of a multi-bit weighting factor is performed using digital multipliers 166A-D and digital adders 167A-C, and the application of a nonlinear function (third-order Taylor's series) is performed using digital multipliers 168A-C and adder 169. In alternative embodiments, however, these nonlinear bit-mapping operations can be implemented by other conventional means, such as by using digital memory devices (e.g., read-only or random-access memory) or digital multiplexers, and/or a more complex Volterra series can be used in place of the Taylor's series for greater matching accuracy.

Applying relatively high-resolution weighting factors to each such bit output from quantizer 114, prior to feeding signal 146B back to adder 116 through feedback-loop filter 150, makes it possible to more accurately match the binary scaling imperfections of the resistor ladder network (or other multi-bit-to-variable-level signal converter). More precisely, the nonlinear bit-mapping coefficients, $C_0 \ldots C_{n-1}$, shown in FIG. 14A, preferably are set so as to create bit-dependent, binary scaling offsets that align with the binary scaling offsets produced by mismatches in the resistive elements of resistor ladder network 113C. If the resistors in R-2R ladder network 113C are perfectly matched, then the nonlinear bit-mapping coefficients preferably reflect a perfect binary weighting (i.e., $C_2 = 2 \cdot C_1 = 4 \cdot C_0$). Otherwise the coefficient weighting is only approximately binary. Because the conversion noise of the modulator is additive with respect to the input signal, the conversion noise level at the output of reconstruction filter 115 is reduced when the coefficients $C_0 \ldots C_{n-1}$ are perfectly aligned with the actual binary weighting associated with resistor network 113C. Therefore, it is possible to adjust the nonlinear bit-mapping coefficients $C_0 \ldots C_{n-1}$ for minimum conversion noise and distortion (i.e., and a corresponding minimum level at the output of bandpass filter 115), by using an adaptive digital control algorithm within processing block 136, and by sensing the signal-plus-noise level (or strength) at the output of reconstruction filter 115, e.g., via analog square-law component 133 (as shown in FIGS. 14A), or an analog absolute-value component or other sensor of analog signal strength, in conjunction with a low-frequency A/D converter (e.g., converter 134A). With respect to circuit 160A shown in FIG. 14A, based on the level at the output of reconstruction filter 115 (e.g., as determined in block 162), the algorithm within processing block 136 preferably generates control signals 165 that correct for mismatches between the nonlinear bit-mapping coefficients $C_0 \ldots C_{n-1}$ and the actual binary weighting associated with resistor ladder 113C. Conventional techniques, such as those based on least mean squares (LMS) principles, may be used within processing block 136 for adapting the nonlinear bit-mapping coefficients $C_0 \ldots C_{n-1}$ within the digital calibration loop discussed above.

In practice, the nonlinear bit-mapping coefficients $C_0 \ldots C_{n-1}$ preferably are calibrated once upon startup (e.g., using a known signal) and then are dynamically adjusted in real time in order to account for drift in resistance values (e.g., due to thermal changes). In the preferred embodiments, such dynamic adjustments are made on the order of once per second so as to allow for a sufficient amount of time to evaluate the effect of any changes.

Although not shown in FIG. 14A, in certain embodiments input digital signal 102 also is supplied to adaptive control module 136 in order to take into account any changes in output power that result from changes in input signal 102. On the other hand, in embodiments where variations in the power of input signal 102 are expected to average out to zero over the evaluation period, and/or from one evaluation period to the next, the decisions in adaptive control module 136 can be made based solely on the average converter output power that is measured in block 133 (as shown in FIG. 14A), or based on any other measure of the strength of the signal that is output from bandpass filter 115.

For a conventional ladder-based converter, the matching accuracy of the resistors in the ladder network determines the precision of the converter. In contrast, the precision of the preferred MBO converter is a function of the converter oversampling ratio (N'·M), the order (P) of the noise-shaped response, and the stopband attenuation of the reconstruction filters. Therefore, oversampling enables high-accuracy converters to be implemented using low-accuracy resistor ladder networks. The preferred embodiments of the invention use resistor ladder networks with accuracies of just 1%, or better, to reduce the tuning range of the nonlinear bit-mapping components.

Overall Converter Considerations

Figure 14B:
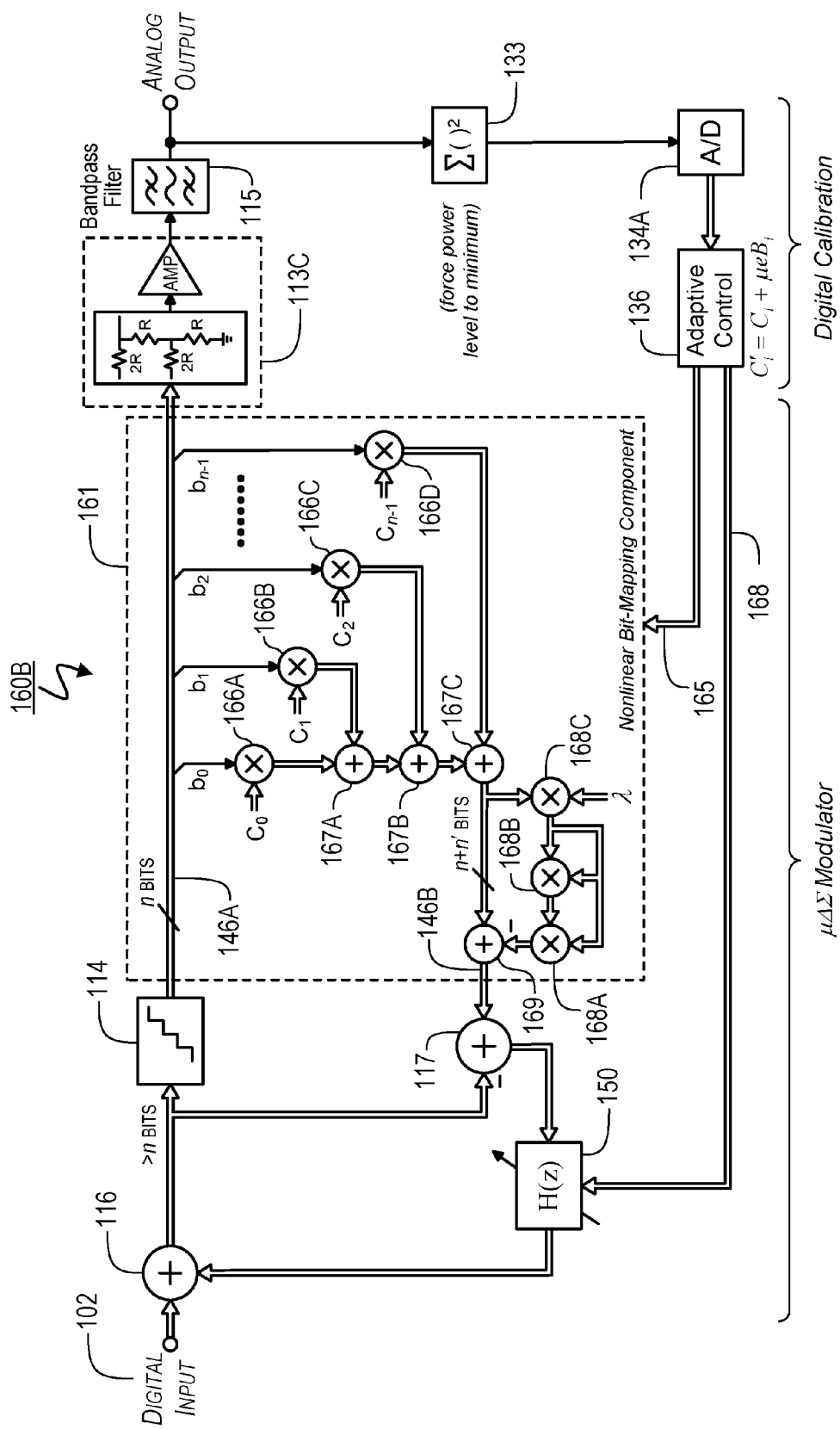
FIG. 14B is a block diagram illustrating a delta-sigma (ΔΣ) modulator that incorporates adaptive noise-shaping, in addition to adaptive nonlinear bit-mapping.

The noise-shaping/quantization operation of the MBO converter is most effective when the spectral null in the noise transfer function (NTF) is precisely aligned with the center frequency of the bandpass filter in a corresponding processing branch. When the NTF spectral null and bandpass filter center frequency are precisely aligned, the noise level, and therefore the signal-plus-noise level, at the bandpass filter output is a minimum. Because the spectral null in the NTF response is determined by parameters $\rho_i$ of feedback-loop filter 150, the configuration illustrated in FIG. 14B can be used to dynamically align the spectral null in the NTF response with the center frequency of bandpass filter 115. With respect to circuit 160B shown FIG. 14B, the algorithm implemented by processing block 136 preferably also generates control signal 168 that adjusts the parameters $\rho_i$ of feedback-loop filter 150 to produce a minimum level at the output of bandpass filter 115, based on the power (or other measure of signal strength) as detected within processing block 133. Conventional techniques, such as those based on least mean squares (LMS) principles, can be used within processing block 136 for adapting the parameters $\rho_i$ that determine the noise-shaped response.

Figure 6A:
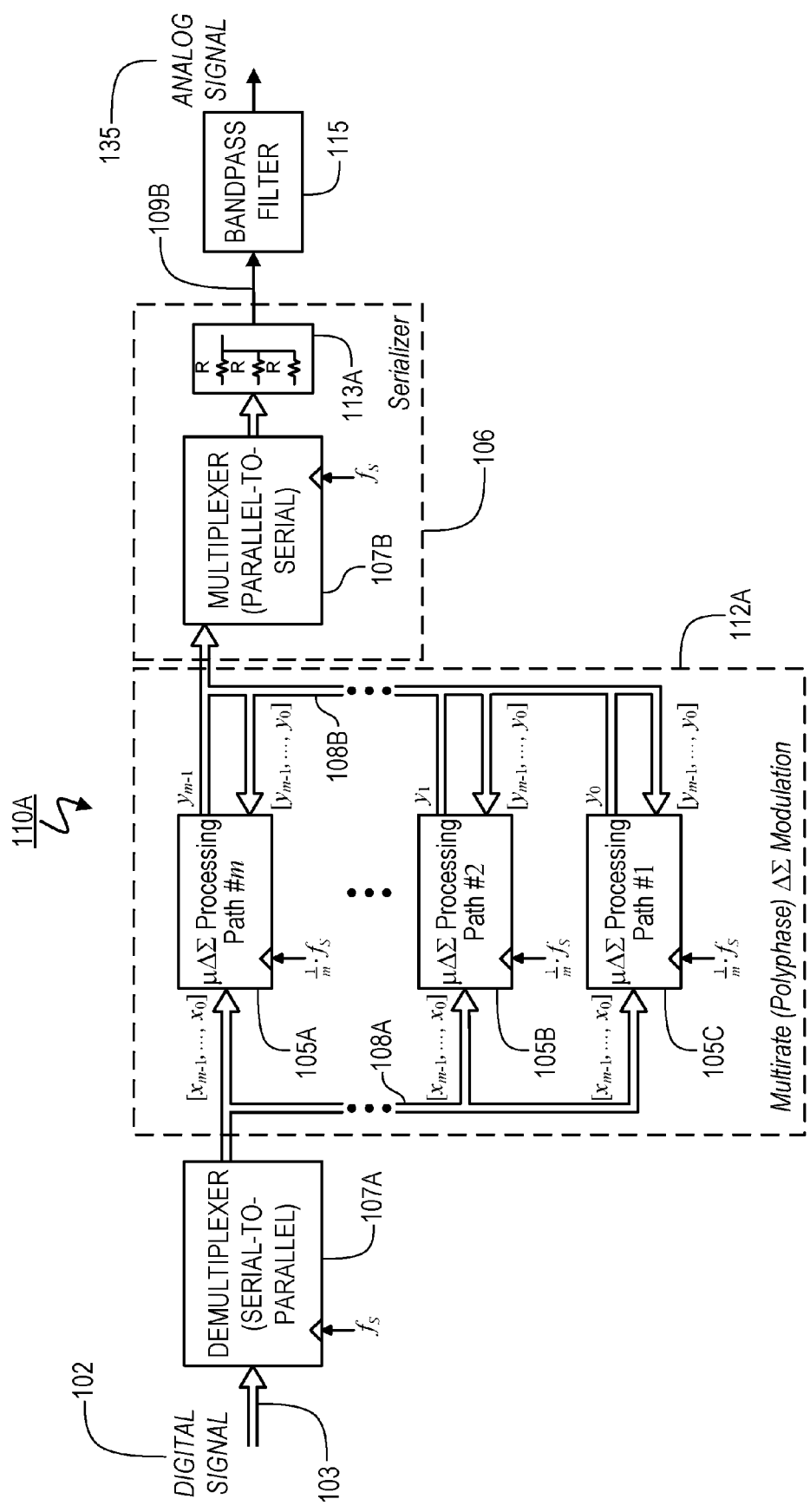
FIG. 6A is a simplified block diagram of a discrete-to-linear converter according to one representative embodiment of the present invention, that uses multiple, low-rate processing branches to perform high-rate, noise-shaped quantization of an input signal, and employs a resistor network for multi-bit-to-variable-level conversion and a bandpass filter for signal reconstruction.
Figure 6B:
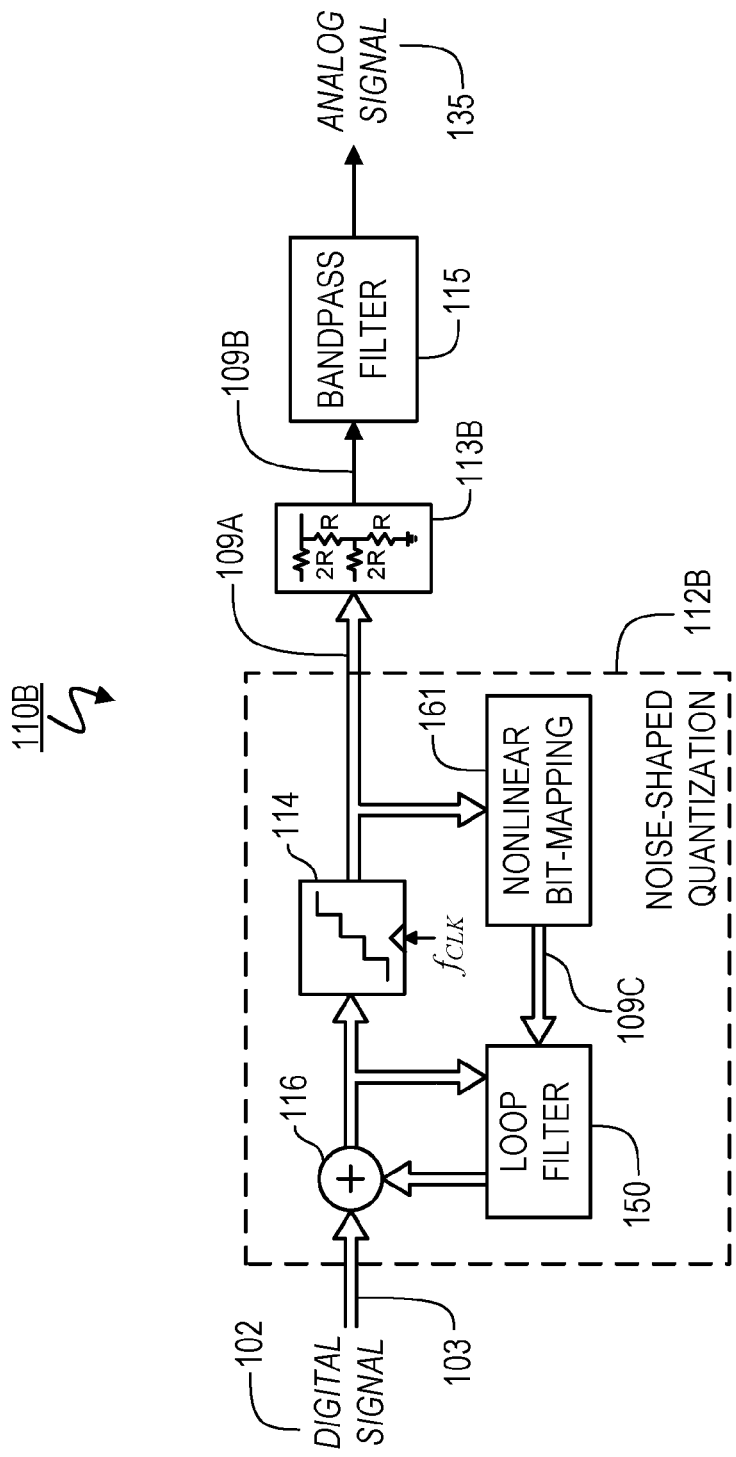
FIG. 6B is a simplified block diagram of a discrete-to-linear converter according to a second representative embodiment of the present invention, that employs noise-shaped quantization with a nonlinear bit-mapping component to compensate for rounding errors in the R-2R ladder network used for multi-bit-to-variable-level conversion.
Figure 6C:
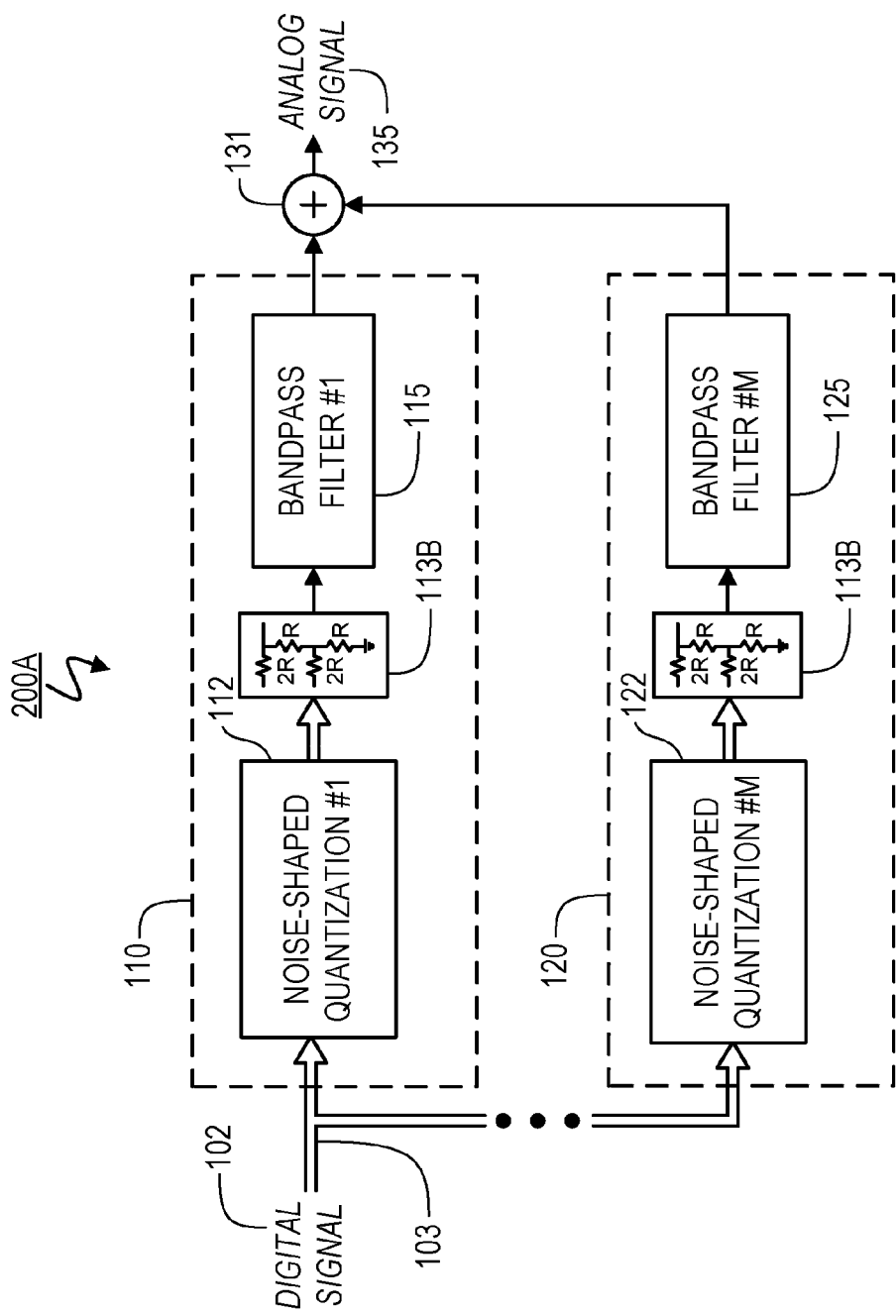
FIG. 6C is a simplified block diagram of a Multi-Channel Bandpass Oversampling (MBO) converter according to a third representative embodiment of the present invention, that incorporates multiple processing branches, each including an R-2R ladder network for multi-bit-to-variable-level conversion and an analog bandpass filter for signal reconstruction.
Figure 6D:
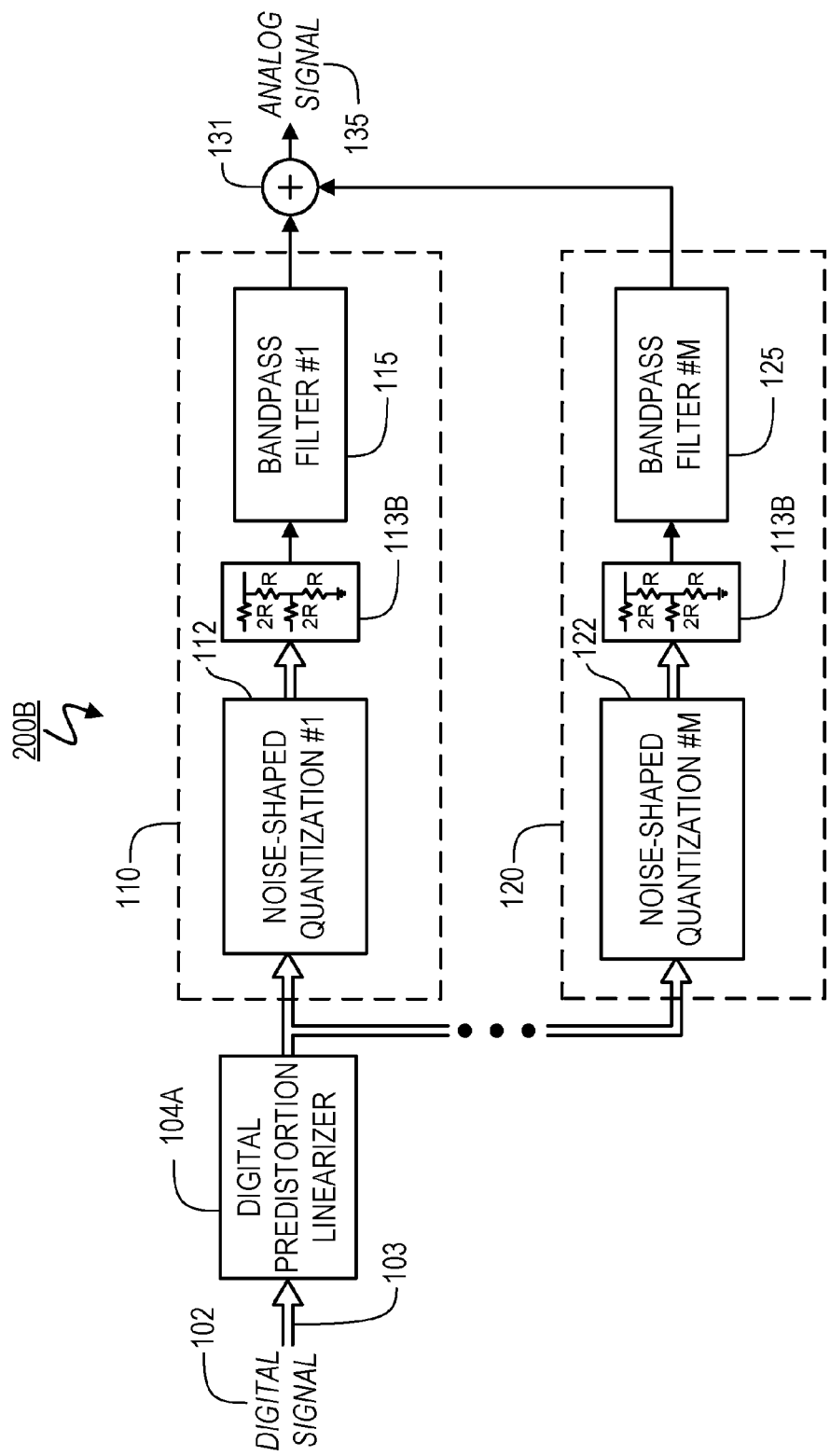
FIG. 6D is a simplified block diagram of a Multi-Channel Bandpass Oversampling (MBO) converter according to a fourth representative embodiment of the present invention, that incorporates a digital pre-distortion linearizer (DPL) and multiple processing branches, each including an R-2R ladder network for multi-bit-to-variable-level conversion and an analog bandpass filter for signal reconstruction.
Figure 6E:
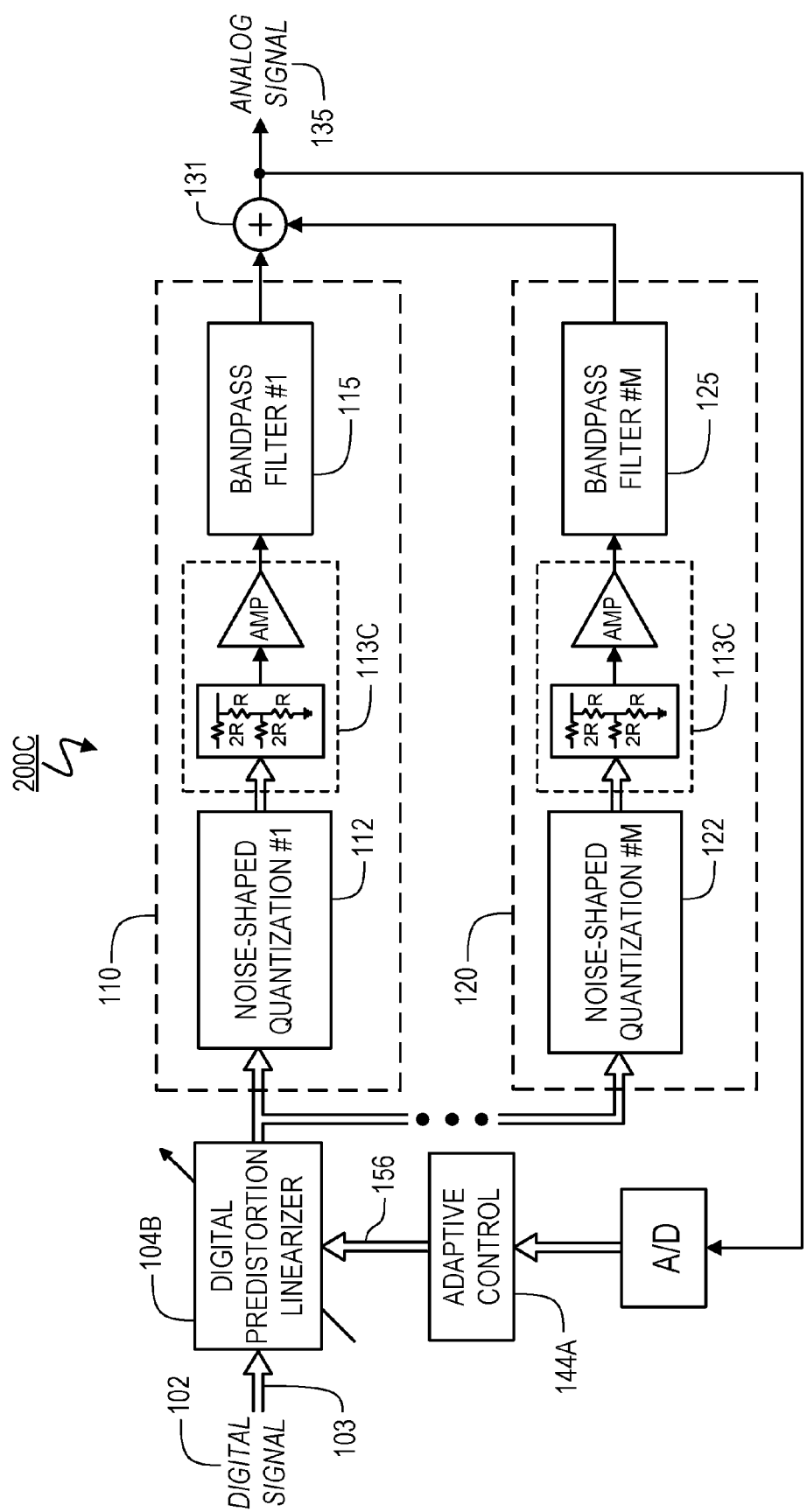
FIG. 6E is a simplified block diagram of a Multi-Channel Bandpass Oversampling (MBO) converter according to a fourth representative embodiment of the present invention, that incorporates a digital pre-distortion linearizer (DPL) and multiple processing branches, each including an R-2R ladder network and a buffer/power amplifier for multi-bit-to-variable-level conversion, and an analog bandpass filter for signal reconstruction.

Because the digital pre-distortion linearizer (e.g., DPL 104A&B) and the μΔΣ modulators within the noise-shaping/quantization circuits (e.g., circuit 112) can be implemented as multirate (polyphase) structures, the instantaneous bandwidth of the converter technology illustrated in FIG. 6A&C (with more specific and detailed embodiments that incorporate multirate DPL 104 and multirate noise-shaping/quantization circuits 112 being illustrated in FIGS. 6D&E) is limited only by the maximum switching (i.e., sampling) rate of the digital outputs that drive the multi-bit-to-variable-level converters (e.g., resistor ladder networks 113), and by the quality factor of the analog reconstruction filters (e.g., filters 115 and 125).

Although the foregoing MBO converter has up to 10 GHz of instantaneous bandwidth at effective sampling rates $f_S$ of 20 GHz (i.e., a frequency range of 0 Hz to 10 GHz in the preferred embodiments), inclusion of conventional upconversion techniques should be considered within the scope of the invention as a means of shifting the converter output to frequency bands that exceed the Nyquist limit of $$\frac{1}{2} \cdot f_S.$$

Figure 15A:
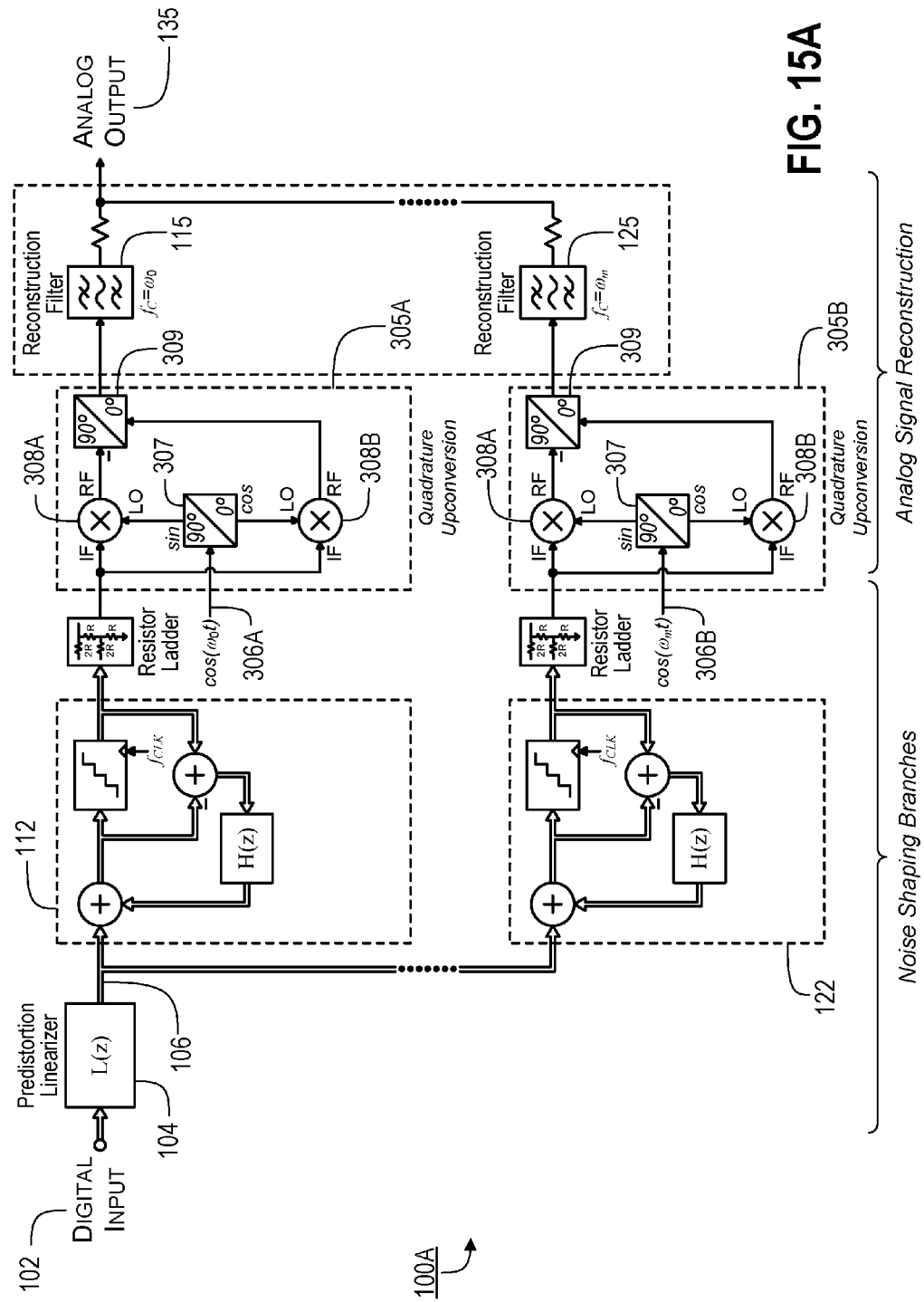
FIG. 15A is a block diagram of a complete MBO converter according to a representative embodiment of the present invention, that incorporates multiple bandpass delta-sigma modulators for noise-shaped quantization in conjunction with: 1) resistor ladder networks, 2) an analog signal reconstruction (ASR) filter bank, and 3) output quadrature upconversion.

For example, an output signal can be shifted from a band centered at 5 GHz to a band centered at 15 GHz, using a conventional upconverter with a 10 GHz local oscillator (LO), such that the resulting 15 GHz output signal can be converted with an MBO processing branch configured for 5 GHz operation (i.e., the quantization noise response is configured for a spectral null at 5 GHz). An exemplary converter 100A shown in FIG. 15A, incorporates a quadrature upconversion operation (e.g., the operation performed by each of circuits 305A&B) between the noise-shaping/quantization circuit and the bandpass reconstruction filter. More specifically, quadrature upconverter 305A shifts the quantized output of noise-shaping/quantization circuit 112 from a center frequency of $\omega$ to a center frequency of $\omega+\omega_0$, and quadrature upconverter 305B shifts the quantized output of noise-shaping/quantization circuit 122 from a center frequency of $\omega$ to a center frequency of $\omega+\omega_m$, according to the equation:

$$z = y'_{inphase} \cdot \cos(\omega_k t) 31\ y'_{quadrature} \cdot \sin(\omega_k t),$$

where $y'_{inphase}$ and $y'_{quadrature}$ are formed within quadrature combiner 309, and represent phase-shifted versions of the quantized output of the noise-shaping/quantization circuit. In addition to quadrature combiner 309, each quadrature upconverter consists of: 1) a local oscillator source with frequencies $\omega_0$ and $\omega_m$ (e.g., frequencies which generate each of signals 306A&B, respectively); 2) a quadrature hybrid (e.g., each of hybrid splitters 307) that divides the local oscillator signal into quadrature (i.e., sine) and in-phase (i.e., cosine) components; and 3) dual mixers (e.g., mixers 308A&B) that produce frequency-shifted images of the quantized output from the noise-shaping/quantization circuit. In the preferred embodiments, a quadrature upconverter (i.e., image reject mixer) is used instead of a simple upconverter (i.e., single mixer), because a simple upconverter produces unwanted lower images of the quantized signal (i.e., $\omega-\omega_0$ and $\omega-\omega_m$), in addition to the desired upper images of the quantized signal (i.e., $\omega+\omega_0$ and $\omega+\omega_m$)

Figure 15B:
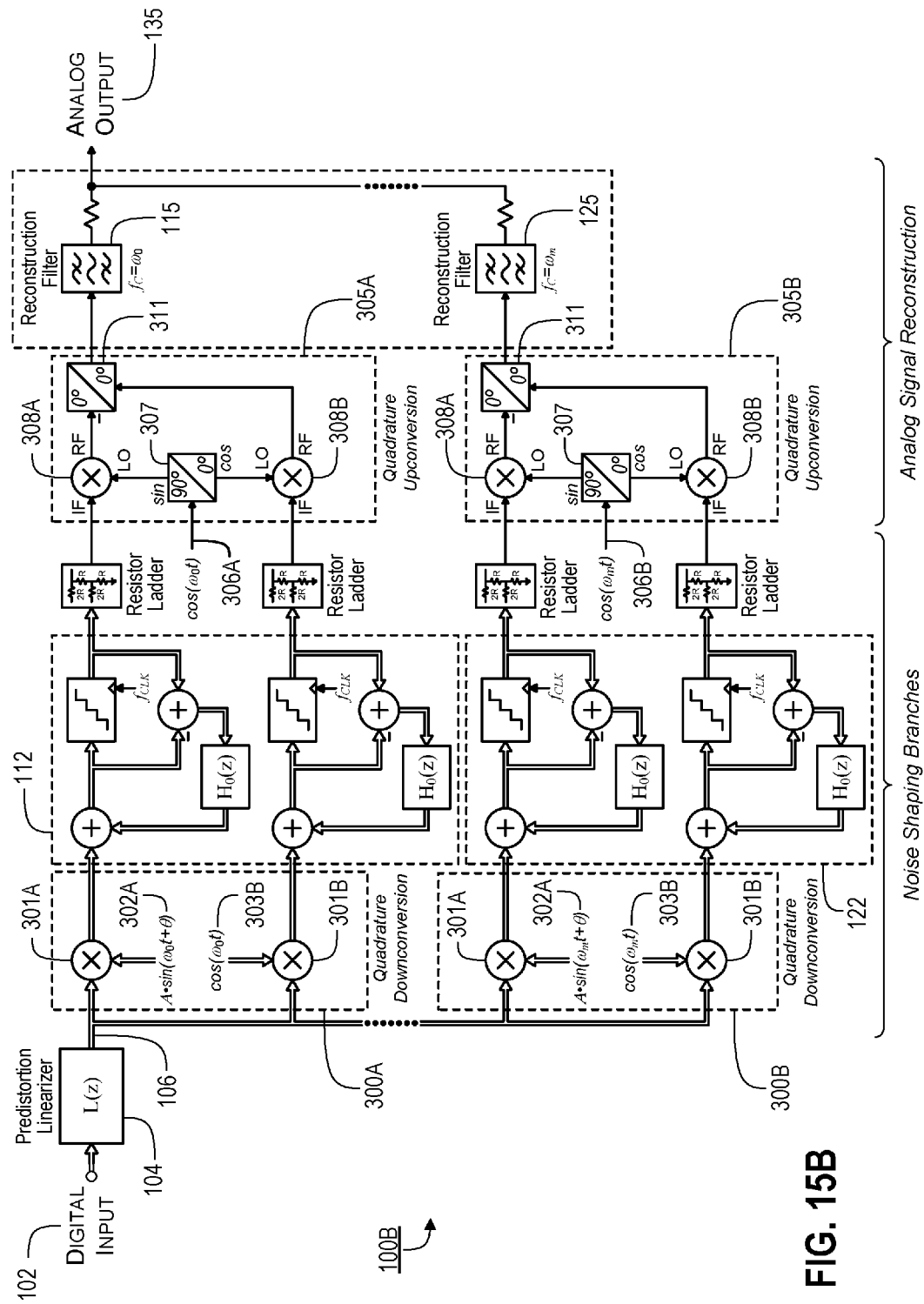
FIG. 15B is a block diagram of a complete MBO converter according to a representative embodiment of the present invention, that incorporates multiple bandpass delta-sigma modulators for noise-shaped quantization in conjunction with: 1) resistor ladder networks, 2) an analog signal reconstruction (ASR) filter bank, 3) input quadrature downconversion, and 4) output quadrature upconversion.

The present inventor has discovered that in addition to extending a usable frequency range, output quadrature upconverters can be combined with input quadrature downconverters, as illustrated in FIG. 15B, to potentially realize the more significant benefit of mitigating the degradation in MBO converter resolution caused by sampling jitter. The extent of this benefit depends on the availability of frequency (local oscillator) sources with very low phase noise (i.e., high spectral purity) for the operations of upconversion and downconversion. The output noise ($\eta_j$) that is introduced into the converter output by sampling jitter ($\sigma_j$), increases with frequency ($\omega_k$) according to $\eta_j = \omega_k \cdot \sigma_j$, where $\omega_k$ is the intended processing (center) frequency of the $k^{th}$ MBO branch. By decreasing the center frequencies ($\omega_k$) of the MBO processing branches, therefore, downconversion reduces the amount of output noise caused by sampling jitter, and thereby, improves overall converter resolution.

An exemplary MBO converter 100B, shown in FIG. 15B, combines quadrature upconversion with quadrature downconversion. Converter 100B uses one quadrature downconverter (e.g., circuits 300A&B) per MBO processing branch, to shift a portion of the input frequency band (i.e., the portion of the band processed in the respective MBO branch) from a center frequency of $\omega$ to a center frequency of zero, using multipliers 301A&B, sine sequences 302A&B, and cosine sequences 303A&B. More specifically, quadrature downconverter 300A shifts a portion of pre-distorted input signal 106 from a band centered at frequency $\omega_0$ to a band centered at zero hertz. This band shift enables noise-shaping/quantization circuit 112 to process the portion of the input signal, originally centered at a frequency of $\omega_0$, when configured to produce a quantization-noise transfer function (NTF) with a spectral minimum (i.e., $f_{notch}$) at zero hertz (i.e., baseband). Similarly, quadrature downconverter 300B shifts a portion of pre-distorted input signal 106 from a band centered at frequency $\omega_m$ to a band centered at zero hertz. As before, this band shift enables noise-shaping/ quantization circuit 122 to process the portion of the input signal, originally centered at a frequency of $\omega_m$, when configured for an $f_{notch}$ of zero hertz (i.e., baseband). After noise-shaped quantization, the input signals are restored (i.e., upconverted) to their respective center frequencies of $\omega_0$ and $\omega_m$, using quadrature upconverters 305A&B. Because the quadrature downconverter produces in-phase and quadrature components, signal combining in quadrature upconverters 305A&B uses in-phase combiners 311 (i.e., as opposed to quadrature combiners 309) to reject the lower image of the quantized output signal from the noise-shaping/quantization circuit.

The quadrature downconverter produces an in-phase output ($y_{inphase}$) and a quadrature output ($y_{quadrature}$) by processing input signal 106 (x) according to:

$$y_{inphase} = x \cdot \cos(\omega t)$$

$$y_{quadrature} = x \cdot A \cdot \sin(\omega t + \theta),$$

where parameters A and θ preferably are set (e.g., pursuant to a manufacturing trim operation), or dynamically adjusted, to compensate for amplitude and phase imbalances, respectively, in the quadrature upconverter (e.g., circuits 305A&B). Upconverter amplitude and phase imbalances produce unwanted spurious responses at the output of the reconstruction filter (e.g., each of filters 115 and 125), that get smaller when parameters A and θ are matched (i.e., equal and opposite) to the inherent imbalances of quadrature upconverter 305. Preferably, the parameter A is approximately equal, or more preferably exactly equal, to the multiplicative inverse of the amplitude imbalance of the quadrature upconverter. Similarly, the parameter θ preferably is approximately equal, or more preferably exactly equal, to the additive inverse of the phase imbalance of the quadrature upconverter. Similarly to the digital pre-distortion linearizer (DPL), the quadrature downconverter can be implemented using polyphase decomposition techniques to reduce the clocking/processing rates of digital multipliers and sine/cosine sequence generators.

Exemplary block diagrams of MBO converters according to the preferred embodiments of the invention are illustrated in FIGS. 16A-17C. Due to polyphase decomposition of the noise-shaped/quantization circuit (e.g., parallel processing using μΔΣ modulators as in converter 95A of FIG. 16A) and/or frequency decomposition (e.g., multiband operation using parallel processing branches as in converters 170A-C of FIGS. 17A-C, respectively), the instantaneous bandwidth of the preferred embodiments is limited only by the maximum sampling rate (i.e., switching rate or clocking rate) of the digital outputs. Therefore, the preferred method for combining the parallel outputs of the overall converter is the moving-average summation operation utilized by circuit 95A in FIG. 16A. Circuit 95A is an exemplary embodiment of the present invention that employs a single processing branch (i.e., operates on a single frequency band) and a parallel ΔΣ modulator (i.e., a μΔΣ modulator) with m outputs, where the m outputs of the μΔΣ modulator (e.g., ΔΣ processing paths 105A-C) operate at a sub-rate of $$\frac{1}{m} \cdot f_S,$$

and are combined into a single output with an effective sampling rate of $f_S$, using a novel moving-average summation operation (e.g., circuit element 179) which requires no upsampling (i.e., the moving-average summation process requires no upsampling from a sub-rate of $$\frac{1}{m} \cdot f_S$$

to a full-rate of $f_S$). In contrast, a conventional converter implementation, such as circuit 80C shown in FIG. 5C, combines the m outputs of the parallel modulator into a single output using a conventional multiplexing operation (e.g., multiplexer 16 of circuit 80C), where the data samples from each parallel output are first upsampled (i.e., zero-padded) from a sub-rate of $$\frac{1}{m} \cdot f_S$$

to a full-rate of $f_S$, and then concatenated to form a single digital output (i.e., an operation which can be functionally represented as upsampling, delaying, and summing). Although the conventional multiplexer has an all-pass response, upsampling requires the multiplexing circuitry to switch at the full sampling rate (i.e., instead of the modulator's subsampling rate), and consequently, limits the effective excess-rate oversampling ratio N of the overall converter. The moving-average summation (i.e., parallel-to-serial reformatting) operation of the preferred embodiments, however, combines the multiple sub-rate outputs $$\left( \text{e.g., the } m \text{ outputs at a sample rate of } \frac{1}{m} \cdot f_S \right)$$

of a parallel ΔΣ modulator (i.e., a μΔΣ modulator) into a single full-rate output (e.g., a single output at a rate of $f_S$), and, e.g., can be limited to including: 1) a plurality of delay elements coupled to the sub-rate outputs, each of which introduces a different time-offset in increments of $\Delta\Phi = 1/f_S$ (e.g., within circuit elements 178A-C), using for example, phase offset resampling at a sub-rate of $$\frac{1}{m} \cdot f_S$$

(i.e., latches or flip-flops that are registered on m different phases of the sub-rate clock) and/or conventional passive or active delay lines; and 2) a signal combiner that sums (e.g., within analog adders 177A&B) the time-offset signals which are provided by the delay elements, and which reflect sub-rate sampling of $$\frac{1}{m} \cdot f_S.$$

Therefore, the circuitry comprising the preferred combining operation switches at a subsampled rate $$\left( \text{i.e., a sub-rate of } \frac{1}{m} \cdot f_S \right),$$

and for a constant switching speed, the excess-rate oversampling ratio of the preferred converter is m times higher than that of a conventional oversampling converter.

Figure 16A:
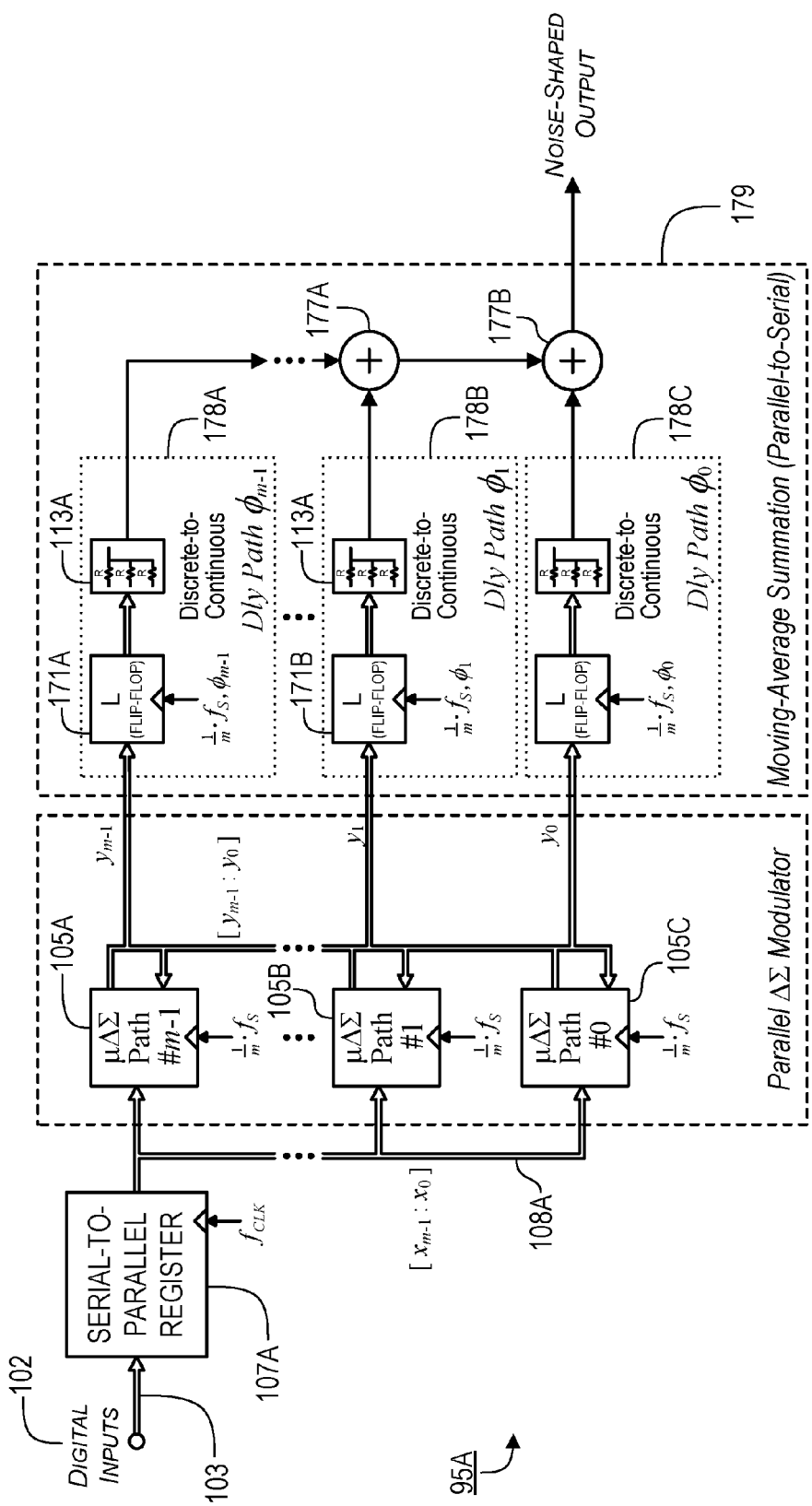
FIG. 16A is a block diagram of a complete MBO converter according to a representative embodiment of the present invention, that incorporates a single processing branch, a delta-sigma (ΔΣ) modulator in a polyphase (parallel) arrangement, and moving-average summation to combine the outputs of the ΔΣ modulator.
Figure 16B:
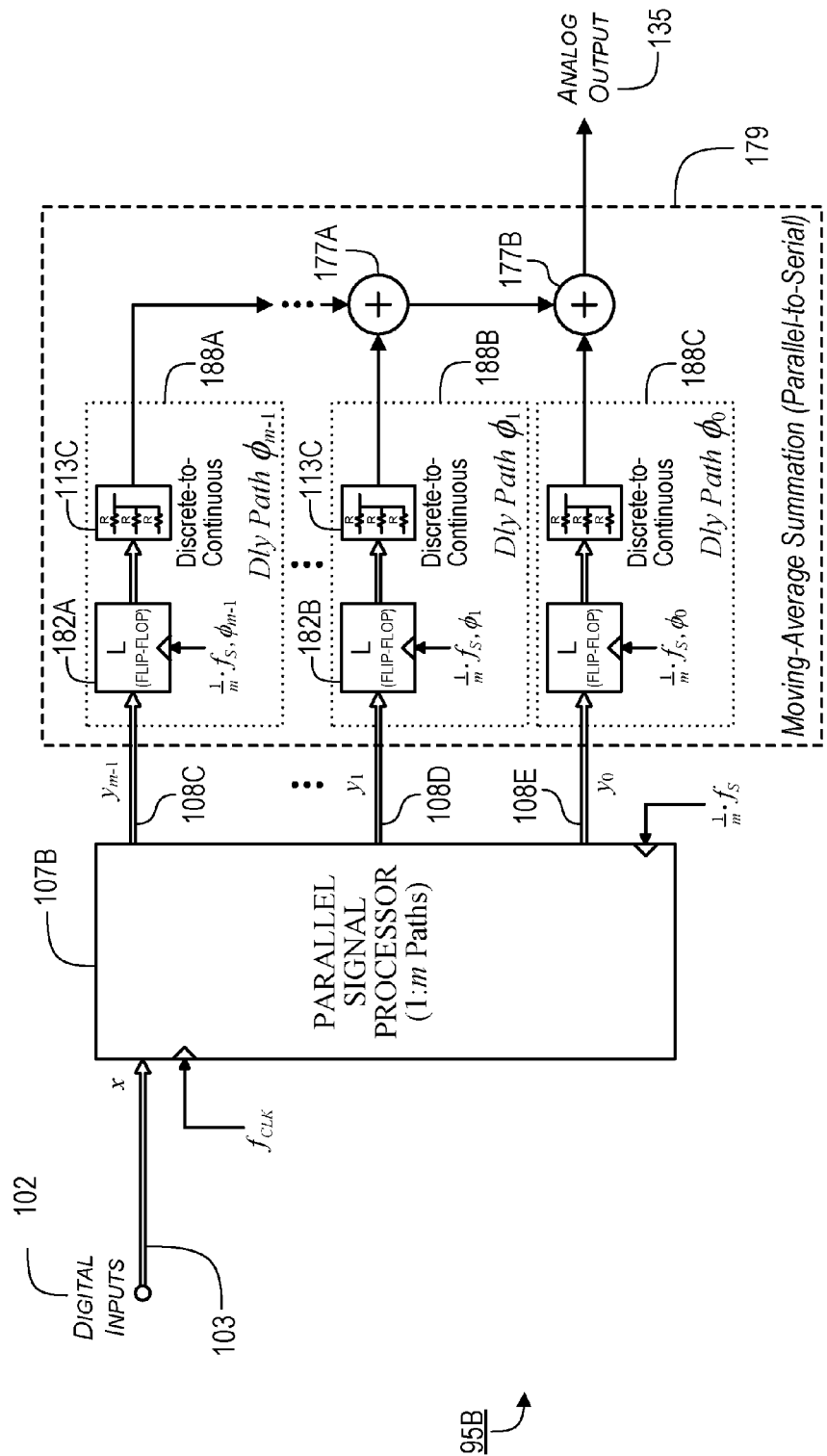
FIG. 16B is a generalized block diagram of a converter which uses moving-average summation, according to a representative embodiment of the present invention, to generate a full-rate output signal from the multiple sub-rate outputs of a parallel signal processor.

A more generalized depiction of a converter, which utilizes moving-average summation according to the preferred embodiments of the preset invention, is converter 95B illustrated in FIG. 16B. From a single serial input (e.g., input 103) which toggles (switches) at a rate of $f_{CLK}$, parallel signal processor 107B generates m parallel outputs (e.g., outputs 108C-E) which toggle (switch) at a sub-rate of $$\frac{1}{m} \cdot f_S,$$

relative to effective full-rate ($f_S$) sampling at the output of the converter (e.g., analog output 135). The sub-rate samples on each of the m parallel outputs (e.g., outputs 108C-E) preferably are a sequence of values representing different subsampling phases of the underlying (complete) input signal (e.g., input signal 103). According to different preferred embodiments of the present invention, parallel signal processor 107B performs different functions. For example, in the embodiment of converter 95A in FIG. 16A, parallel signal processor 107B performs noise-shaped quantization, in addition to serial-to-parallel demultiplexing, to transform an input sequence comprising relatively high-resolution, low-rate samples in serial format (e.g., multi-bit samples x on line 103 with a rate of $f_{CLK}$), to an output sequence comprising relatively low-resolution, high-rate samples in parallel format (e.g., each output $y_i$ on one of the lines 108C-E provides single-bit samples at a rate of $$\frac{1}{m} \cdot f_S,$$

where $$\frac{1}{m} \cdot f_S \gg \frac{1}{m} \cdot f_{CLK}$$

and $f_S$ is the effective sample rate of the overall converter). In an alternate embodiment, parallel signal processor 107B performs only serial-to-parallel demultiplexing to transform an input sequence comprising relatively high-resolution, low-rate samples in serial format (e.g., multi-bit samples x on line 103 with a rate of $f_{CLK}$), to an output sequence comprising relatively high-resolution, low-rate samples in parallel format (e.g., each output $y_i$ on one of the lines 108C-E provides multi-bit samples at a rate of $$\frac{1}{m} \cdot f_S,$$

where $$\frac{1}{m} \cdot f_S = \frac{1}{m} \cdot f_{CLK}$$

and $f_S = f_{CLK}$ is the effective sample rate of the overall apparatus). Unlike the multi-bit-to-variable-level signal converters included within converter 95A (e.g., converters 113A) which operate at a sampling rate of $$\frac{1}{m} \cdot f_S,$$

the multibit-to-variable-level signal converters of converter 95B (e.g., converters 113C) operate at a potentially lower rate of $$\frac{1}{m} \cdot f_{CLK}.$$

In still other embodiments, parallel signal processor 107B combines serial-to-parallel demultiplexing with other signal processing operations, such as: 1) pre-emphasis filtering for equalization and/or sin(x)/x or other (e.g., similar) correction; 2) signal companding for dynamic range reduction; and/or 3) estimation and mitigation of sampling clock imperfections, such as jitter and skew. For embodiments employing estimation and mitigation of sampling clock imperfections, the methods described in the '284 Application are preferred. The outputs of the parallel signal processor (e.g., output 108C-E) are combined using a moving-average summation operation comprising: 1) delay with multi-bit-to-variable-level conversion (e.g., within delay paths 188A-C); and 2) continuous-time summation (e.g., within adders 177A&B).

In embodiments where parallel signal processor 107B estimates and mitigates sampling skew (i.e., a condition where the sub-rate clocks are offset in time by increments which do not equal exact multiples of the full-rate clock period $\Delta\Phi = 1/f_S$), a circuit similar to that illustrated in FIG. 10 preferably is included in the process of sampling skew compensation. The circuit of FIG. 10 is described in more detail in the Bandpass (Signal Reconstruction) Filter Considerations section. Static imperfections in the alignment of the sub-rate clocks introduce nonlinear distortion which can be detected in the output spectrum of the converter (e.g., converter 95B of FIG. 16B and converter 140 of FIG. 10). The present inventor has discovered that for a sinusoidal input signal having frequency $f_{IN}$, the nonlinear distortion introduced by sampling skew is sinusoidal with frequency $f_m$, where $f_m$ is related to the full-rate sampling frequency $f_s$ according to the equation $$f_m = f_{IN} \pm \frac{1}{m} \cdot f_S,$$

and m is the number of parallel outputs generated by parallel signal processor 107B. Referring to FIG. 10, when the sub-rate clocks are perfectly offset in time and the frequency of cosine sequence 152A is set to $f_m$, the amplitude level of the signal forming the real part of output 149B (i.e., the output of analyzer 151B that is labelled Re{Y}) is minimized (i.e., when the time offsets are exact multiples of $\Delta\Phi = 1/f_S$ there is no spurious signal present). Similarly, when the sub-rate clocks are perfectly offset in time and the frequency of sine sequence 152B is set to $f_m$, the amplitude level of the signal forming the imaginary part of output 149B (i.e., the output of analyzer 151B that is labelled Im{Y}) also is minimized. Utilizing the sample-rate conversion (e.g., digital interpolation) methods disclosed in the '284 Application, the values of the discrete samples coupled to the outputs of parallel processor 107B, can be resampled in the digital domain (e.g., within processor 107B) to reflect sampling skew (i.e., sampling imperfection) that is approximately equal and opposite to the sampling skew introduced by imperfect delay in the analog domain. During a period when the converter input is a sinusoidal signal (e.g., during a calibration period), the amplitude of a signal on one of the outputs of analyzer 151B in FIG. 10 (e.g., the real or imaginary component of output 149B) can be measured (sensed), and conventional adaptive algorithms like differential steepest descent can be utilized, to dynamically adjust the intentional sampling skew introduced in the digital domain such that: 1) the level of the spurious signal at frequency $f_m$ is minimized; and 2) an operating condition is created which emulates a state in which the sub-rate clocks are precisely offset in time. During normal operation, additional fine adjustments can be made to the sampling skew introduced in the digital domain using a metric based on a comparison between the converter input spectrum, obtained from output 149A of analyzer 151A, and the converter output spectrum, obtained from output 149B of analyzer 151B. More specifically, fine adjustments preferably are made (e.g., using an adaptive algorithm such as differential steepest descent) until minimal differences are detected between the input spectrum and the output spectrum.

Figures 16C, 16D:
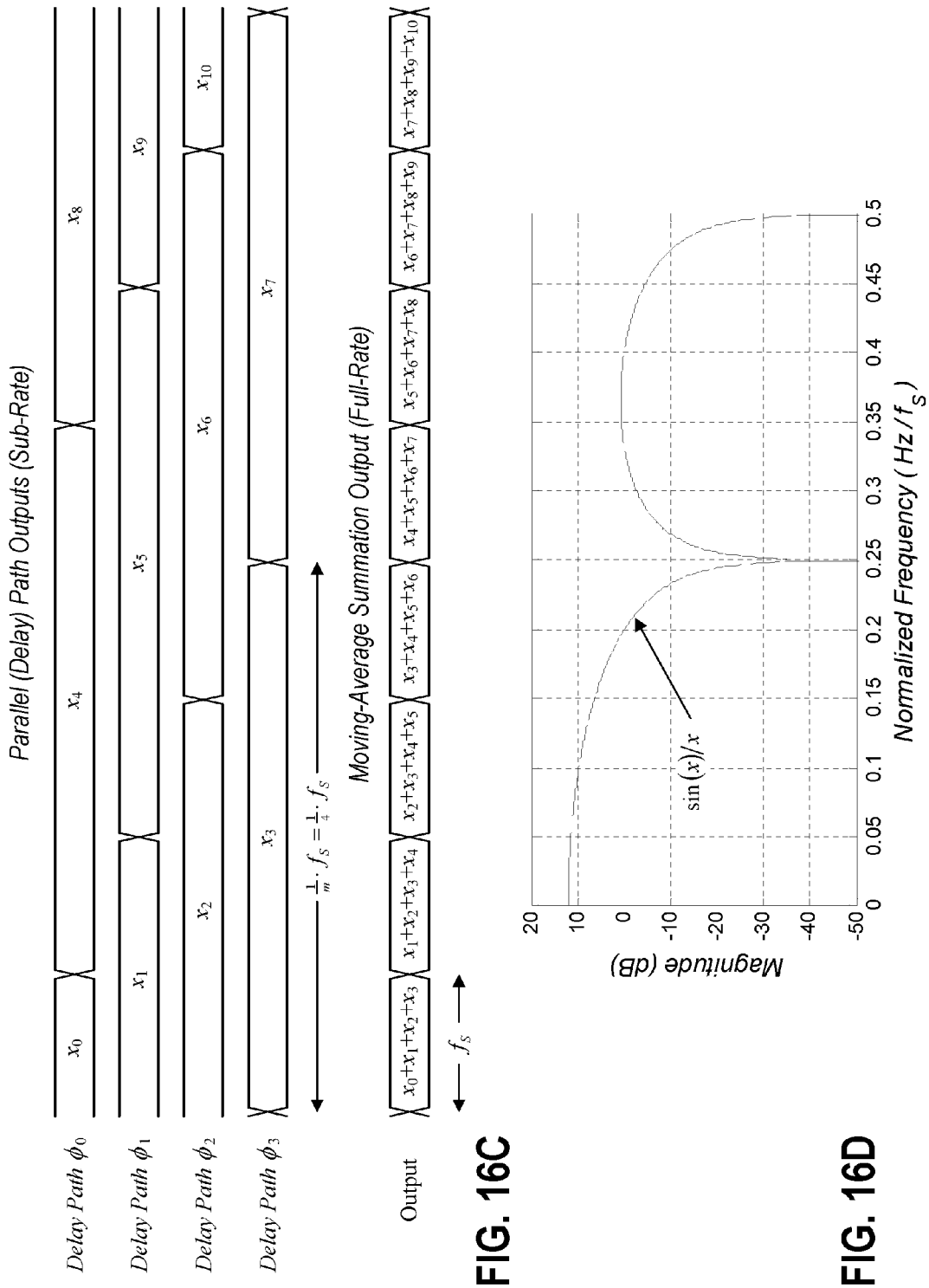
FIG. 16C is a timing diagram which illustrates the principles of moving-average summation, according to a representative embodiment of the invention.
FIG. 16D illustrates the magnitude response versus frequency for moving-average summation, according to a representative embodiment of the invention.

The process of moving-average summation is depicted in the timing diagram given in FIG. 16C, which for an exemplary polyphase decomposition factor of m=4, illustrates the manner in which sub-rate signals $$\left(\text{i.e., signals with a sampling/switching rate of } \frac{1}{m} \cdot f_S\right)$$

are combined to produce a resultant signal with transitions that reflect full-rate sampling (i.e., switching at an effective rate of $f_S$). It can be shown that phase-offset resampling and summing (i.e., moving-average summation), according to the preferred embodiments, introduces what is conventionally referred to as a moving-average filter response, which has a continuous-time transfer function given by $$TF(s) = \sum_{k=0}^{m-1} \exp(-s \cdot k \cdot \Delta\phi),$$

where: 1) m is the polyphase decomposition factor equal to the number of multirate outputs from the parallel processor (e.g., processor 107B); and 2) $\Delta\Phi=1/f_S$ is the incremental time (i.e., clock phase) offset associated with the resampling clocks. The above transfer function produces a lowpass response with a sin(x)/x or sinc(x) shape and a 3 dB cutoff frequency of approximately $1/(2 \cdot m \cdot \Delta\Phi)$, which without compensation, limits the instantaneous bandwidth of the overall converter to $f_S/(2 \cdot m)$. The magnitude versus frequency response of the moving-average summation operation is given in FIG. 16D for an exemplary polyphase decomposition factor of m=4. In applications where the maximum frequency at the input of the converter is less than $f_S/(2 \cdot m)$, the moving-average response of the preferred combiner provides a beneficial smoothing operation that attenuates shaped quantization noise. The frequency response of the preferred combiner has a sinc(x) shape because the value of each sub-rate output is subjected to what is effectively a rectangular window function, or equivalently a zero-order hold (i.e., the value of each sub-rate output remains constant for m full-rate periods). In alternate embodiments, however, conventional filters are used to subject the value of each sub-rate output to a window function which is non-rectangular, such that over a time interval of m full-rate periods, the value of each sub-rate output varies. A non-rectangular window function produced by a conventional Bessel lowpass filter or a first-order hold, for example, can be used to produce frequency responses which exhibit greater stopband attenuation (i.e., lower sidelobe energy) than that of a sinc(x) response.

Figure 17A:
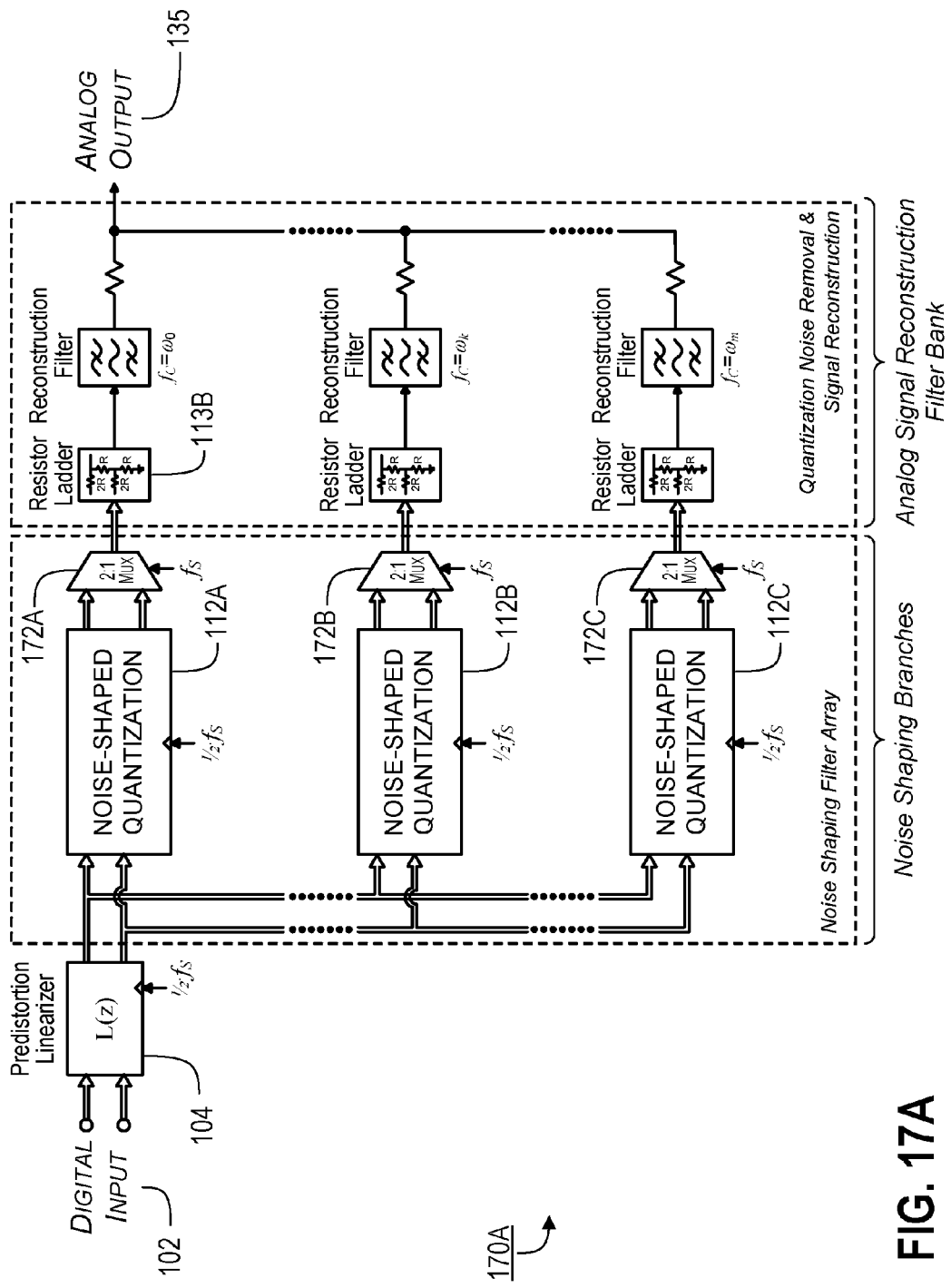
FIG. 17A is a block diagram of a complete MBO converter according to a representative embodiment of the present invention, that incorporates multiple, multirate delta-sigma (μΔΣ) modulators for noise-shaped quantization, resistor ladder networks with an analog signal reconstruction (ASR) filter bank for multi-bit-to-variable-level conversion, and output multiplexing for combining the two multirate outputs of each μΔΣ modulator.
Figure 17B:
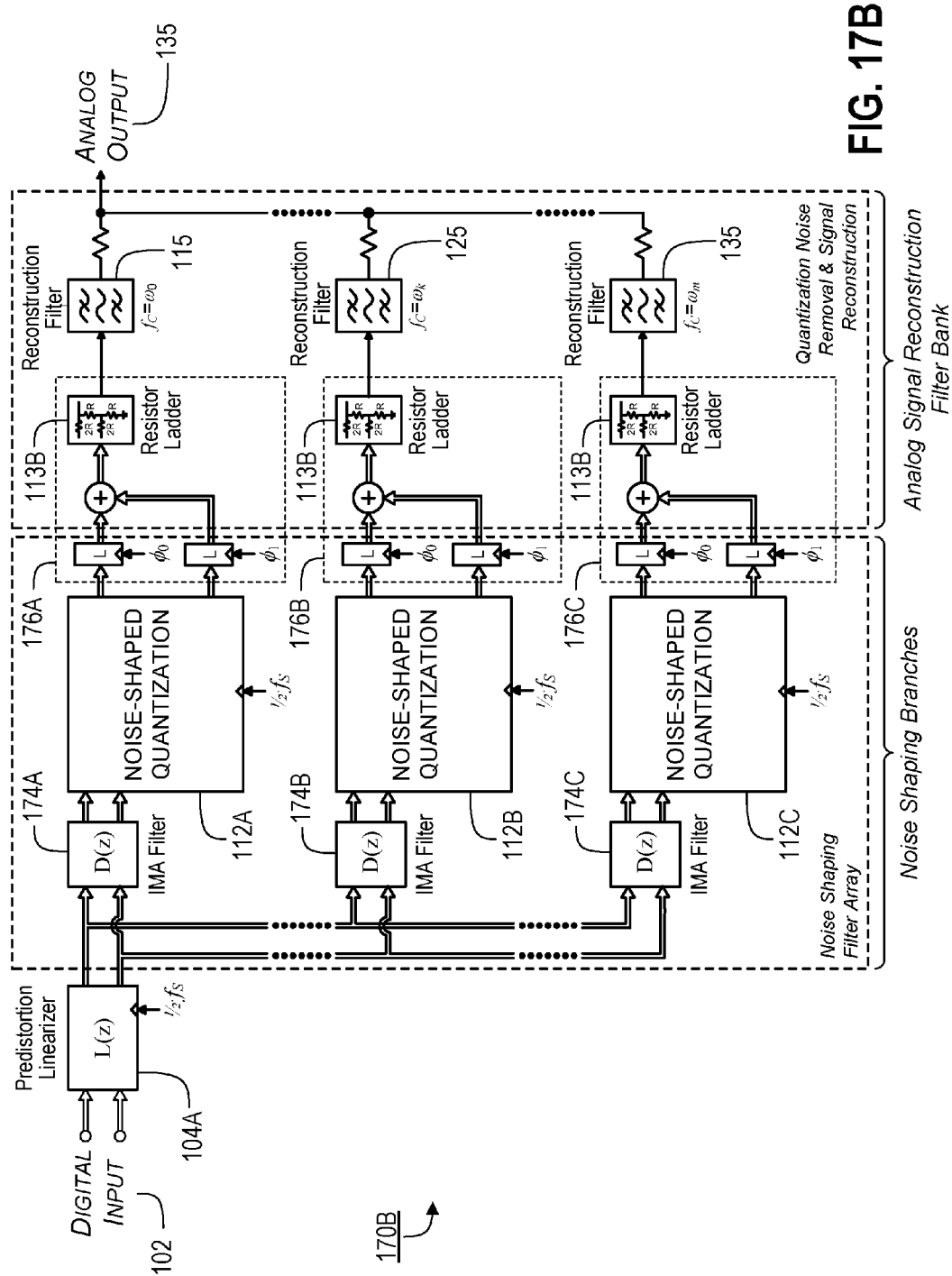
FIG. 17B is a block diagram of a complete MBO converter according to a first alternate embodiment of the present invention, that incorporates multiple, multirate delta-sigma (μΔΣ) modulators for noise-shaped quantization, resistor ladder networks with an analog signal reconstruction (ASR) filter bank for multi-bit-to-variable-level conversion, and input inverse moving-average (IMA) filtering with output summing to combine the two multirate outputs of each μΔΣ modulator.
Figure 17C:
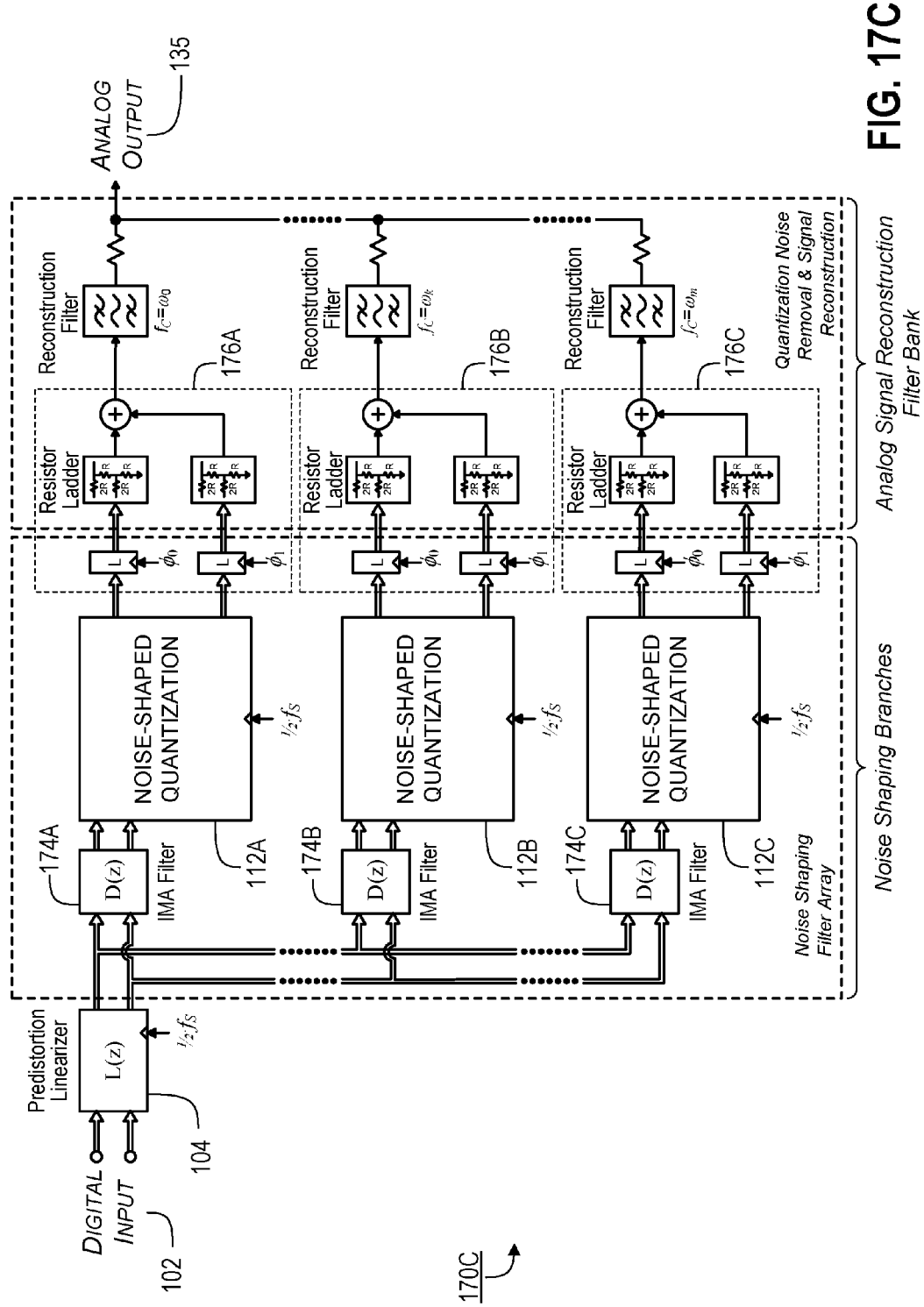
FIG. 17C is a block diagram of a complete MBO converter according to a second alternate embodiment of the present invention, that incorporates multiple, multirate delta-sigma (μΔΣ) modulators for noise-shaped quantization, resistor ladder networks with an analog signal reconstruction (ASR) filter bank for multi-bit-to-variable-level conversion, and input IMA filtering with additional resistor ladder networks to combine the two multirate outputs of each μΔΣ modulator.

In each of FIGS. 17A-C, an alternate structure is illustrated for combining the parallel outputs of each noise-shaping/quantization circuit 112A-C, with respect to an exemplary polyphase decomposition factor of m=2. Exemplary converters 170A-C, in FIGS. 17A-C respectively, employ noise-shaping/quantization circuits 112 that include a parallel arrangement of ΔΣ modulators, Also, in each of FIGS. 17A-C, an analog adder combines the outputs of the representative MBO processing branches and/or paths. Analog adders (combiners) are implemented using resistive networks in applications where broadband operation is of utmost importance. Other types of analog combiners, however, such as those based on reactive (e.g., Wilkinson, Lange, branchline, etc.) and/or active circuits, should be considered within the scope of the present invention. In FIG. 17A, each noise-shaping/quantization circuit 112A-C of converter 170A has two multirate outputs, due to its polyphase decomposition factor of m=2. In exemplary converter 170A, the two multirate outputs of each noise-shaping/quantization circuit 112A-C are combined using a corresponding multiplexer 172A-C, which selects between the multirate outputs of noise-shaping/quantization circuit 112A-C in an alternating and sequential order, thus providing a single data stream to the corresponding resistor ladder network (e.g., resistor ladder 113B). On the first full-rate sampling cycle, for example, multiplexer 172A couples the output from the first multirate path of noise-shaping/quantization circuit 112A to resistor ladder network 113B; on the second full-rate sampling cycle, multiplexer 172A couples the output from the second multirate path of noise-shaping/quantization circuit 112A to resistor ladder network 113B; on the third full-rate sampling cycle, multiplexer 172A couples the output from the first multirate path of noise-shaping/quantization circuit 112A to resistor ladder network 113B; and so on for subsequent sampling cycles. As such, the output samples from the first multirate path and the second multirate path appear, at the output of multiplexer 172A, on alternating full-rate, sampling-time intervals. In applications where the maximum frequency at the input of the converter is greater than $f_S/(2 \cdot m)$, the use of multiplexing for combining the multirate outputs of each noise-shaping/quantization circuit 112A-C is preferred because the multiplexing operation has an all-pass response.

FIG. 17B illustrates an alternative structure for combining the two multirate outputs of each noise-shaping/quantization circuit 112A-C. In exemplary converter 170B, the multirate outputs of each noise-shaping/quantization circuit 112A-C are combined using a corresponding inverse moving-average (IMA) filter (e.g., IMA filters 174A-C which couple the output of DPL 104A to the input of each noise-shaping/quantization circuit 112A-C) followed by a moving-average summation circuit (e.g., circuits 176A-C which couple the output of each noise-shaping/quantization circuit 112A-C to the input of each bandpass reconstruction filter 115, 125, . . . ). As shown, each summation circuit 176A-C includes a clocked latch for each multirate output and a continuous-time adder to combine the latched outputs. The latches in each summation circuit 176A-C are clocked in a manner that causes latched outputs to update sequentially and at regular intervals. Preferably, the outputs of each latch in the summation circuit update at a sub-rate of $$\frac{1}{m} \cdot f_S$$

and the outputs of the latches are respectively offset in by time increments of $\Delta\Phi=1/f_S$, where m is the polyphase decomposition factor of the μΔΣ modulator (i.e., m=2 for exemplary circuit 170B of FIG. 17B). For the exemplary embodiment illustrated in FIG. 17B with a polyphase decomposition factor of m=2, the outputs of the latches in each summation circuit 176A-C are updated on opposite phases of a clock with a sub-rate frequency $$\frac{1}{2} \cdot f_S.$$

Accordingly, the output of the adder in each summation circuit 176A-C represents a full-rate signal with a sampling rate of $f_S$. Therefore, to reduce the switching speed of the digital output logic, the adder preferably is implemented as an analog (i.e., continuous-time) adder, using for example, resistive or reactive combiner networks (e.g., Wye splitters, Wilkinson combiners).

A structure that is similar to that of exemplary converter 170B (i.e., shown in FIG. 17B) is exemplary converter 170C shown in FIG. 17C. Exemplary converter 170C incorporates an IMA filter (e.g., filters 174A-C) in each processing branch, but the multirate outputs of each noise-shaping/quantization circuit 112A-C, are separately converted into a single variable-level signal, using a resistor ladder network, before being combined or summed in an analog adder. The following discussion generally refers to exemplary converter 170B, shown in FIG. 17B, but the same considerations apply to exemplary converter 170C shown in FIG. 17C.

The purpose of IMA filters 174A-C is to compensate for the $\sin(x)/x$ response introduced by each moving-average summation circuit 176A-C (or the corresponding summation structure shown in FIG. 17C). Although shown as distinct elements in FIG. 17B for the purpose of illustration, the components that comprise the moving-average summation circuits (e.g., input latches, resistor ladders, or analog adders) can reflect a higher degree of integration, where for example, resistor ladder networks are integrated with analog adders. Compared to a multiplexing approach, this moving-average summation approach has the advantage that the switching/sampling rate of the digital output buffers (latches) is reduced. However, compensation (if desired) for the resultant $\sin(x)/x$ response requires an additional filter (i.e., IMA filters 174A-C with transfer function $D(z)$), and because the digital interface involves multiple clock phases (e.g., $\Phi_0$ and $\Phi_1$), clock distribution can become complicated for a large interleave factors M, and large polyphase decomposition factors m. Furthermore, as described in more detail below, finite word length effects prevent IMA filters 174A-C (i.e., with transfer function $D(z)$) from fully offsetting the $\sin(x)/x$ response of the summation circuits when: 1) the polyphase decomposition factor m is greater than 2; and 2) the maximum frequency content of digital input 102 is greater than $f_S/(2 \cdot m)$. For these reasons, the moving-average summation approach preferably is used only for applications where: 1) only two multirate outputs are combined (e.g., a polyphase decomposition factor of m=2); 2) $\sin(x)/x$ nulls in the converter output spectrum can be tolerated; and/or 3) the maximum frequency at the input of the converter is less than $f_S/(2 \cdot m)$.

As discussed above, using moving-average summation to combine the multirate outputs of noise-shaping/quantization circuits 112A-C, as illustrated in FIG. 17B&C, is equivalent to applying a lowpass filter, with a $\sin(x)/x$ response, to the output samples of the MBO converter. This lowpass (i.e., moving-average) filter has a discrete-time transfer function of the form $$TF(z) = \sum_{k=0}^{m-1} z^{-k} = \frac{1-z^{-m}}{1-z^{-1}},$$

where m is the polyphase decomposition factor, equal to the number of multirate outputs from each noise-shaping/quantization circuit 112A-C (i.e., m=2 in FIG. 17A-C). The frequency response of the moving-average filter has spectral nulls at submultiples of the effective sampling rate $f_S$ of the overall MBO converter, which depend on the polyphase decomposition factor m. In order to compensate for the moving-average response of the summation circuits (e.g., summation circuits 176A-C), each corresponding IMA filter 174A-C (shown before each noise-shaping/quantization circuit 112A-C in FIGS. 17B&C), should have an inverse moving-average (IMA) response given by the transfer function:

$$D(z) = \frac{1-z^{-1}}{1-z^{-m}}.$$

Figure 17D:
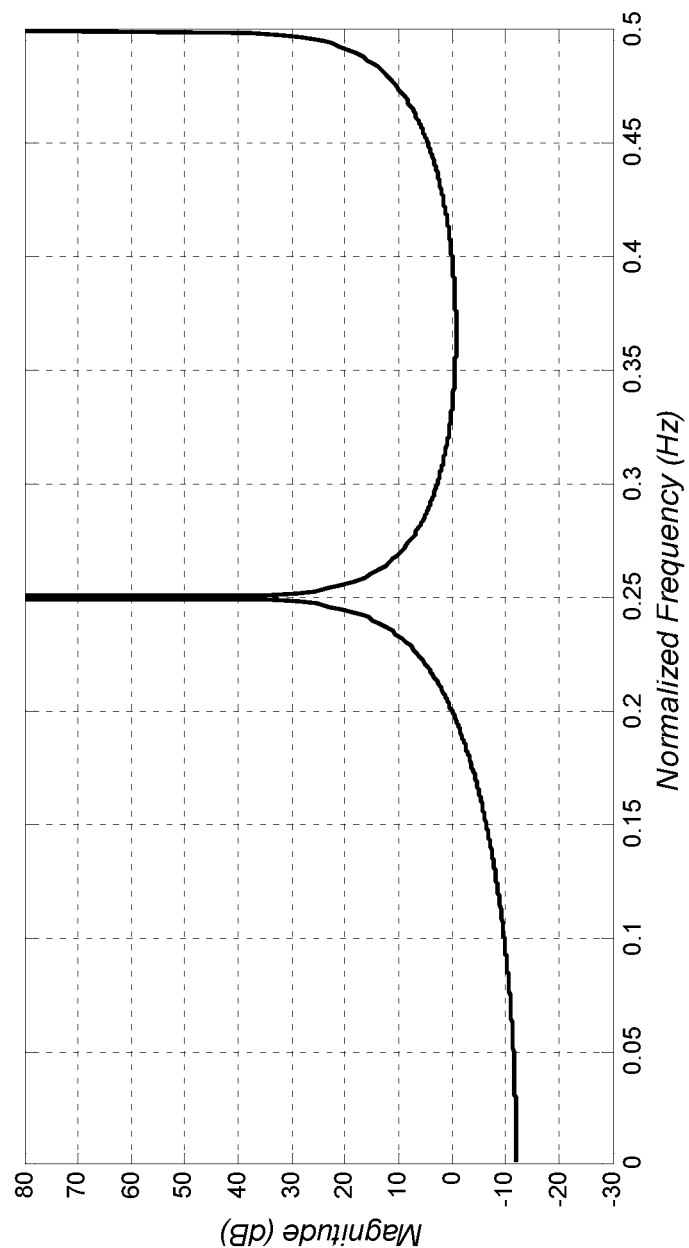
FIG. 17D illustrates an IMA filter transfer function based on a moving-average factor of four.

For a polyphase decomposition factor of m=4, an IMA filter has the frequency response illustrated in FIG. 17D, which has infinite magnitude at $$\frac{1}{4} \cdot f_S,$$

where $f_S$ is the effective sampling rate of the overall converter. As a result, an IMA filter with finite gain (i.e., finite word lengths for a digital filter), cannot perfectly compensate for the nulls produced at input frequencies near $$\frac{1}{4} \cdot f_S,$$

by the moving-average summation operation at the output of each noise-shaping/quantization circuit. In general, the moving-average response produces such spectral nulls at frequencies equal to $$\frac{1}{m} \cdot f_S.$$

This means that for a polyphase decomposition factor of m=2, the spectral null in the moving-average response occurs at the Nyquist frequency, which can be eliminated from the MBO converter output with little or no consequence in terms of overall converter bandwidth. In applications where the maximum frequency at the input of the converter exceeds $f_S/(2 \cdot m)$, therefore, combining the multirate outputs of each noise-shaping/quantization circuit 112A-C using moving-average summation, is preferable only for combining up to two multirate outputs (i.e., m=2).

Figure 18:
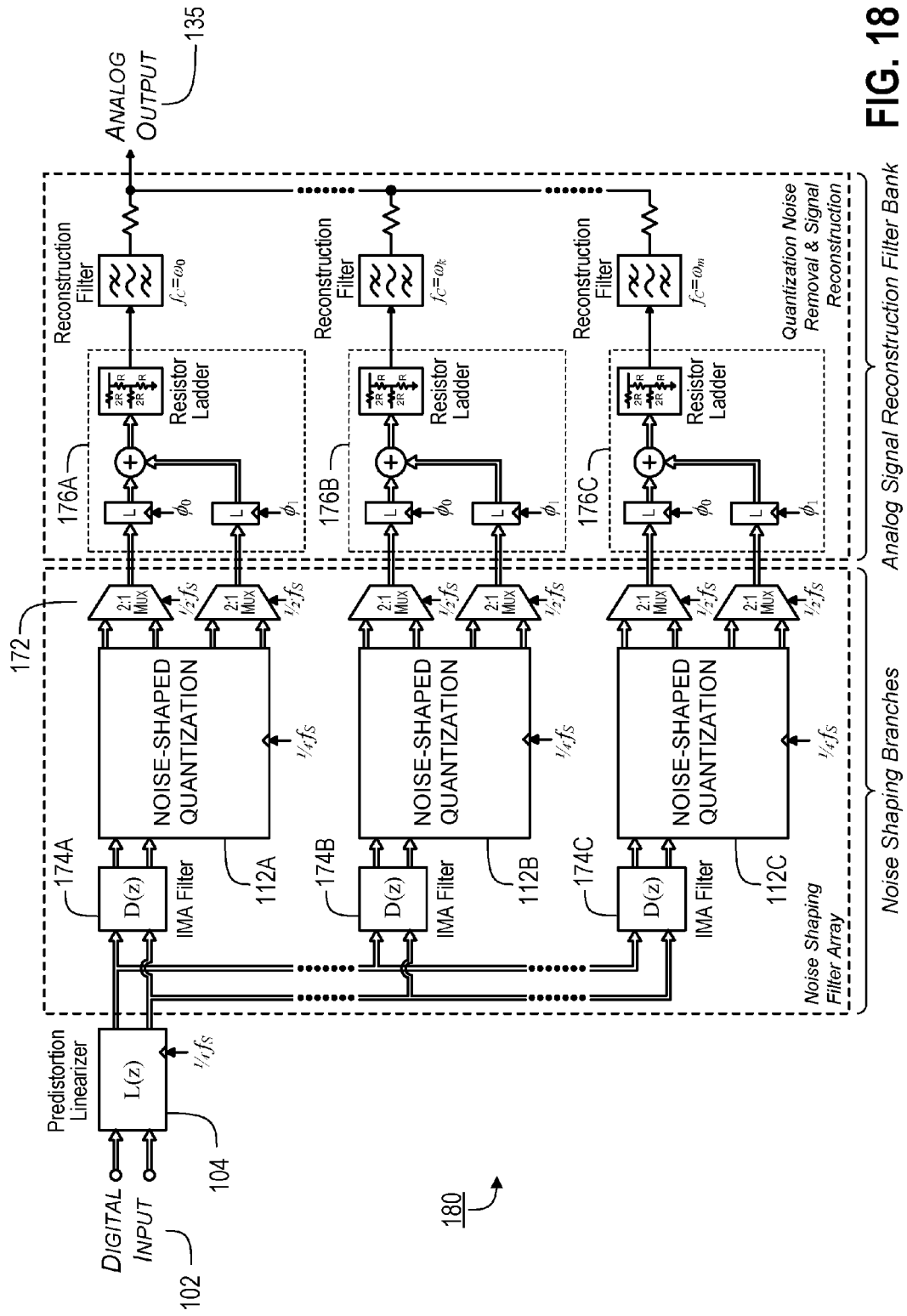
FIG. 18 is a block diagram of a complete MBO converter according to an alternate embodiment of the present invention, that incorporates multiple, multirate delta-sigma (μΔΣ) modulators for noise-shaped quantization, resistor ladder networks with an analog signal reconstruction (ASR) filter bank for multi-bit-to-variable-level conversion, and a combination of input IMA filtering, output multiplexing, and output summing to combine the four multirate outputs of each μΔΣ modulator.

As illustrated in FIG. 18, multiplexing and moving-average summation can be used together in a hybrid configuration, for combining the multirate outputs of each noise-shaping/quantization circuit 112A-C. This hybrid approach, which is utilized by exemplary converter 180, shown in FIG. 18, for a polyphase decomposition factor of m=4, uses multiplexing operation 172 to combine all but the last two multirate outputs. The last two multirate outputs are subsequently combined using an IMA filter (e.g., IMA 174A-C), in conjunction with summation circuits 176A-C (e.g., discrete analog adders in this example rather than additional resistor ladder networks). Therefore, IMA filters 174A-C and summation circuits 176A-C operate on the basis of a polyphase decomposition factor of m=2, even though the overall polyphase decomposition factor for each noise-shaping/quantization circuit 112A-C is m=4. This hybrid approach results in a times-two increase in the effective sampling rate of the MBO converter, without loss of performance due to mismatches between the response of IMA filters 174A-C and the moving-average response of summation circuits 176A-C. It should be noted that any of the methods described above for combining the multirate outputs of each noise-shaping/quantization circuit 112A-C, can be generalized to a larger number of multirate outputs (i.e., a larger polyphase decomposition factor m) by using higher-order multiplexers, or higher-order IMA filters and summation circuits.

Several of the embodiments described above incorporate both IMA filters (e.g., filters 174A-C in FIG. 18) and a digital pre-distortion linearizer (e.g., DPL 104 in FIG. 18).

However, in alternate embodiments these different filtering functions are incorporated into a single structure.

The instantaneous bandwidth of the MBO converter technology (e.g., as shown in FIG. 6C) is limited only by the switching (i.e., sampling or clocking) rate of the digital output buffers (or latches) that are coupled to the resistor ladder network, or other circuitry used to convert digital signal samples to proportional analog voltage or current levels. In current process technologies for CMOS integrated circuits, digital output buffers have been demonstrated commercially at switching speeds in excess of 10 GHz. When using the preceding hybrid approach for combining multi-rate outputs, for example, this capability translates into an overall converter sampling rate $f_S$ of up to 20 GHz, and a corresponding instantaneous bandwidth in excess of 10 GHz.

As noted previously, however, the resolution performance of MBO converters 200A-C (collectively referred to as converter 200 herein) is not limited by the effective sampling rate $f_S$, because the resolution is also a function of the interleave factor (i.e., the number of parallel processing branches M), the order P of the noise-shaped quantization, and the properties of the bandpass (reconstruction) filter. In addition, like conventional oversampling converters, the MBO converter technology can be implemented so as to be relatively insensitive to impairments such as sampling jitter and thermal noise that degrade the performance of other high-speed converter architectures. Specifically, impairments such as quantizer thermal noise can be made subject to a noise-shaped response in a similar manner to quantization noise, exhibiting a frequency response that enables significant attenuation by the analog bandpass (reconstruction) filters (e.g., filters 115 and 125).

Simulated resolution performance results for the MBO converter 200 are given in Table 1 for a noise-shaped response of $6^{th}$-order, for various interleave factors M, and for analog reconstruction filters of various order.

TABLE 1

Simulated Two-Tone Performance
Results for OBO Converter

| Interleave Factor | Analog Filter Order | SNDR (Effective Bits) |
|---|---|---|
| 9 | 5 | 64 dB (10.9 bits) |
| 6 | 5 | 60 dB (10.2 bits) |
| 3 | 5 | 46 dB (7.8 bits) |
| 6 | 7 | 68 dB (11.5 bits) |
| 3 | 7 | 49 dB (8.4 bits) |

System Environment

Generally speaking, except where clearly indicated otherwise, all of the systems, methods, functionality and techniques described herein can be practiced with the use of one or more programmable general-purpose computing devices. Such devices (e.g., including any of the electronic devices mentioned herein) typically will include, for example, at least some of the following components coupled to each other, e.g., via a common bus: (1) one or more central processing units (CPUs); (2) read-only memory (ROM); (3) random access memory (RAM); (4) other integrated or attached storage devices; (5) input/output software and circuitry for interfacing with other devices (e.g., using a hardwired connection, such as a serial port, a parallel port, a USB connection or a FireWire connection, or using a wireless protocol, such as radio-frequency identification (RFID), any other near-field communication (NFC) protocol, Bluetooth or a 802.11 protocol); (6) software and circuitry for connecting to one or more networks, e.g., using a hardwired connection such as an Ethernet card or a wireless protocol, such as code division multiple access (CDMA), global system for mobile communications (GSM), Bluetooth, a 802.11 protocol, or any other cellular-based or non-cellular-based system, which networks, in turn, in many embodiments of the invention, connect to the Internet or to any other networks; (7) a display (such as a cathode ray tube display, a liquid crystal display, an organic light-emitting display, a polymeric light-emitting display or any other thin-film display); (8) other output devices (such as one or more speakers, a headphone set, a laser or other light projector and/or a printer); (9) one or more input devices (such as a mouse, one or more physical switches or variable controls, a touchpad, tablet, touch-sensitive display or other pointing device, a keyboard, a keypad, a microphone and/or a camera or scanner); (10) a mass storage unit (such as a hard disk drive or a solid-state drive); (11) a real-time clock; (12) a removable storage read/write device (such as a flash drive, any other portable drive that utilizes semiconductor memory, a magnetic disk, a magnetic tape, an opto-magnetic disk, an optical disk, or the like); and/or (13) a modem (e.g., for sending faxes or for connecting to the Internet or to any other computer network). In operation, the process steps to implement the above methods and functionality, to the extent performed by such a general-purpose computer, typically initially are stored in mass storage (e.g., a hard disk or solid-state drive), are downloaded into RAM, and then are executed by the CPU out of RAM. However, in some cases the process steps initially are stored in RAM or ROM and/or are directly executed out of mass storage.

Suitable general-purpose programmable devices for use in implementing the present invention may be obtained from various vendors. In the various embodiments, different types of devices are used depending upon the size and complexity of the tasks. Such devices can include, e.g., mainframe computers, multiprocessor computers, one or more server boxes, workstations, personal (e.g., desktop, laptop, tablet or slate) computers and/or even smaller computers, such as personal digital assistants (PDAs), wireless telephones (e.g., smartphones) or any other programmable appliance or device, whether stand-alone, hard-wired into a network or wirelessly connected to a network.

In addition, although general-purpose programmable devices have been described above, in alternate embodiments one or more special-purpose processors or computers instead (or in addition) are used. In general, it should be noted that, except as expressly noted otherwise, any of the functionality described above can be implemented by a general-purpose processor executing software and/or firmware, by dedicated (e.g., logic-based) hardware, or any combination of these approaches, with the particular implementation being selected based on known engineering tradeoffs. More specifically, where any process and/or functionality described above is implemented in a fixed, predetermined and/or logical manner, it can be accomplished by a processor executing programming (e.g., software or firmware), an appropriate arrangement of logic components (hardware), or any combination of the two, as will be readily appreciated by those skilled in the art. In other words, it is well-understood how to convert logical and/or arithmetic operations into instructions for performing such operations within a processor and/or into logic gate configurations for performing such operations; in fact, compilers typically are available for both kinds of conversions.

It should be understood that the present invention also relates to machine-readable tangible (or non-transitory) media on which are stored software or firmware program instructions (i.e., computer-executable process instructions) for performing the methods and functionality of this invention. Such media include, by way of example, magnetic disks, magnetic tape, optically readable media such as CDs and DVDs, or semiconductor memory such as various types of memory cards, USB flash memory devices, solid-state drives, etc. In each case, the medium may take the form of a portable item such as a miniature disk drive or a small disk, diskette, cassette, cartridge, card, stick etc., or it may take the form of a relatively larger or less-mobile item such as a hard disk drive, ROM or RAM provided in a computer or other device. As used herein, unless clearly noted otherwise, references to computer-executable process steps stored on a computer-readable or machine-readable medium are intended to encompass situations in which such process steps are stored on a single medium, as well as situations in which such process steps are stored across multiple media.

The foregoing description primarily emphasizes electronic computers and devices. However, it should be understood that any other computing or other type of device instead may be used, such as a device utilizing any combination of electronic, optical, biological and chemical processing that is capable of performing basic logical and/or arithmetic operations.

In addition, where the present disclosure refers to a processor, computer, server, server device, computer-readable medium or other storage device, client device, or any other kind of apparatus or device, such references should be understood as encompassing the use of plural such processors, computers, servers, server devices, computer-readable media or other storage devices, client devices, or any other such apparatuses or devices, except to the extent clearly indicated otherwise. For instance, a server generally can (and often will) be implemented using a single device or a cluster of server devices (either local or geographically dispersed), e.g., with appropriate load balancing. Similarly, a server device and a client device often will cooperate in executing the process steps of a complete method, e.g., with each such device having its own storage device(s) storing a portion of such process steps and its own processor(s) executing those process steps.

As used herein, the term "coupled", or any other form of the word, is intended to mean either directly connected or connected through one or more other elements or processing blocks.

Additional Considerations

In the preceding discussion, the terms "operators", "operations", "functions" and similar terms can refer to method steps or hardware components, depending upon the particular implementation/embodiment.

Unless clearly indicated to the contrary, words such as "optimal", "optimize", "minimize", "best", as well as similar words and other words and suffixes denoting comparison, in the above discussion are not used in their absolute sense. Instead, such terms ordinarily are intended to be understood in light of any other potential constraints, such as user-specified constraints and objectives, as well as cost and processing constraints.

In the event of any conflict or inconsistency between the disclosure explicitly set forth herein or in the attached drawings, on the one hand, and any materials incorporated by reference herein, on the other, the present disclosure shall take precedence. In the event of any conflict or inconsistency between the disclosures of any applications or patents incorporated by reference herein, the disclosure having the most recent priority date shall take precedence.

Several different embodiments of the present invention are described above and in the documents incorporated by reference herein, with each such embodiment described as including certain features. However, it is intended that the features described in connection with the discussion of any single embodiment are not limited to that embodiment but may be included and/or arranged in various combinations in any of the other embodiments as well, as will be understood by those skilled in the art.

In the above discussion, certain methods are explained by breaking them down into steps listed in a particular order. However, it should be noted that in each such case, except to the extent clearly indicated to the contrary or mandated by practical considerations (such as where the results from one step are necessary to perform another), the indicated order is not critical but, instead, that the described steps can be reordered and/or two or more of such steps can be performed concurrently.

References herein to a "criterion", "multiple criteria", "condition", "conditions" or similar words which are intended to trigger, limit, filter or otherwise affect processing steps, other actions, the subjects of processing steps or actions, or any other activity or data, are intended to mean "one or more", irrespective of whether the singular or the plural form has been used. For instance, any criterion or condition can include any combination (e.g., Boolean combination) of actions, events and/or occurrences (i.e., a multi-part criterion or condition).

Similarly, in the discussion above, functionality sometimes is ascribed to a particular module or component. However, functionality generally may be redistributed as desired among any different modules or components, in some cases completely obviating the need for a particular component or module and/or requiring the addition of new components or modules. The precise distribution of functionality preferably is made according to known engineering tradeoffs, with reference to the specific embodiment of the invention, as will be understood by those skilled in the art.

In the discussions above, the words "include", "includes", "including", and all other forms of the word should not be understood as limiting, but rather any specific items following such words should be understood as being merely exemplary.

Thus, although the present invention has been described in detail with regard to the exemplary embodiments thereof and accompanying drawings, it should be apparent to those skilled in the art that various adaptations and modifications of the present invention may be accomplished without departing from the spirit and the scope of the invention. Accordingly, the invention is not limited to the precise embodiments shown in the drawings and described above. Rather, it is intended that all such variations not departing from the spirit of the invention are to be considered as within the scope thereof as limited solely by the claims appended hereto.

What is claimed is:

1. An apparatus for converting a discrete-time quantized signal into a continuous-time, continuously variable signal, comprising:

an input line for accepting an input signal that is discrete in time and in value;

a digital pre-distortion linearizing filter having an input coupled to the input line and an output;

a plurality of processing branches having inputs coupled to the output of the digital pre-distortion linearizing filter, and each of said processing branches including:
(a) a discrete-time noise-shaping/quantization circuit,
(b) a multi-bit-to-variable-level signal converter coupled to an output of the discrete-time noise-shaping/quantization circuit, and (c) an analog bandpass filter coupled to an output of the multi-bit-to-variable-level signal converter; and an adder coupled to an output of the analog bandpass filter in each of the processing branches, wherein each processing branch converts a portion of the input signal spectrum, wherein the discrete-time noise-shaping/quantization circuits in different ones of the plurality of processing branches have conversion-noise frequency-response minima at different frequencies, wherein a frequency response of each of the discrete-time noise-shaping/quantization circuits has minimum conversion noise in a region that corresponds to a frequency band selected by the analog bandpass filter in the same processing branch, and wherein the digital pre-distortion linearizing filter has a transfer function that compensates for at least one of a phase distortion or an amplitude distortion introduced by a filter bank formed by the analog bandpass filters.

2. An apparatus according to claim 1, wherein the discrete-time noise-shaping/quantization circuit in each of a plurality of the processing branches comprises an assembly that includes:
an input;
a second adder having a first input coupled to the input of the discrete-time noise- shaping/quantization circuit, a second input and an output;
a quantization circuit that reduces a bit-width resolution of a signal, that has an input coupled to the output of the second adder, and that has an output coupled to the output of the discrete-time noise-shaping/quantization circuit; and
a feedback-loop filter having an input coupled to the output of the quantization circuit and an output coupled to the second input of the second adder.

3. An apparatus according to claim 2, wherein the input of the quantization circuit also is coupled to the input of the feedback-loop filter so that both the input and the output of the quantization circuit are coupled to the second input of the adder through the feedback-loop filter.

4. An apparatus according to claim 2, wherein the output of the quantization circuit comprises at least 4 bits.

5. An apparatus according to claim 2, wherein for at least one of the processing branches, the discrete-time noise-shaping/quantization circuit includes a plurality of plural parallel paths and said assembly is provided in each of said plurality of plural parallel paths, with each said parallel path generating a different subsampling phase of a complete signal that is output by the discrete-time noise-shaping/quantization circuit.

6. An apparatus according to claim 2, wherein the feedback-loop filter in each of a plurality of the processing branches has a conversion noise transfer function with a plurality of zeros, and wherein none of said zeros is equal to any other of said zeros.

7. An apparatus according to claim 6, wherein each of said zeros is produced by a settable parameter of the feedback-loop filter that is represented by not more than 6 bits.

8. An apparatus according to claim 2, wherein the feedback-loop filters have identical structures across the plurality of processing branches, but have different values for at least one settable parameter.

9. An apparatus according to claim 1, wherein at least one of the processing branches includes non-linear bit mapping to compensate for imperfections in scaling parameters of the multi-bit-to-variable-level signal converter in said at least one of the processing branches.

10. An apparatus according to claim 9, wherein the non-linear bit mapping is dynamically adjusted based on an error metric that minimizes output conversion noise.

11. An apparatus according to claim 1, wherein the multi-bit-to-variable-level signal converter in each of a plurality of the processing branches comprises at least one of: a network of weighted resistors, a network of weighted voltage sources, or a network of weighted current sources.

12. An apparatus according to claim 1, further comprising at least one additional digital pre-distortion linearizing filter having an input coupled to the input line and an output coupled to the processing branches, wherein a combined transfer function of the digital pre-distortion linearizing filters compensates for a least one of a phase distortion or an amplitude distortion introduced by a filter bank formed by the analog bandpass filters in the processing branches.

13. An apparatus according to claim 1, wherein the digital pre-distortion linearizing filter is implemented as a polyphase structure and includes, for each subsampling phase, a substructure that operates at a clock rate that is a submultiple of a clock rate for the digital pre-distortion linearizing filter as a whole.

14. An apparatus according to claim 1, wherein the digital pre-distortion linearizing filter includes both feedforward and feedback components.

15. An apparatus according to claim 1, where the analog bandpass filters include at least one of a Butterworth, Bessel, and elliptic filter structure.

16. An apparatus according to claim 1, wherein the discrete-time noise-shaping/quantization circuit in at least one of the plurality of the processing branches employs a parallel noise-shaping structure to produce a noise-shaped response which has an order greater than two.

17. An apparatus according to claim 1, wherein the discrete-time noise-shaping/quantization circuit in each of a plurality of the processing branches is implemented as a polyphase structure and includes separate parallel substructures for generating different corresponding subsampling phases of a complete signal that is output by the discrete-time noise-shaping/quantization circuit as a whole.

18. An apparatus according to claim 17, wherein outputs of the substructures are combined into a single composite output using at least one multiplexer.

19. An apparatus according to claim 17, wherein outputs of the substructures are combined into a single composite output using at least one inverse moving-average filter in conjunction with at least one summing component.

20. An apparatus according to claim 17, wherein outputs of the substructures are combined into a single composite output using a combination of at least one multiplexer and at least one inverse moving-average filter in conjunction with at least one summing component.

* * * * *